US009949262B2

(12) United States Patent
Chen et al.

(10) Patent No.: US 9,949,262 B2
(45) Date of Patent: Apr. 17, 2018

(54) SYSTEMS AND METHODS FOR IMPROVED COMMUNICATION EFFICIENCY IN WIRELESS NETWORKS

(71) Applicant: QUALCOMM Incorporated, San Diego, CA (US)

(72) Inventors: Jialing Li Chen, San Diego, CA (US); Lin Yang, San Diego, CA (US); Sameer Vermani, San Diego, CA (US); Rahul Tandra, San Diego, CA (US); Bin Tian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 228 days.

(21) Appl. No.: 14/817,091

(22) Filed: Aug. 3, 2015

(65) Prior Publication Data

US 2016/0044675 A1    Feb. 11, 2016

Related U.S. Application Data

(60) Provisional application No. 62/033,350, filed on Aug. 5, 2014, provisional application No. 62/039,784, filed
(Continued)

(51) Int. Cl.
*H04W 72/04* (2009.01)
*H03M 13/11* (2006.01)
(Continued)

(52) U.S. Cl.
CPC ... *H04W 72/0453* (2013.01); *H03M 13/1102* (2013.01); *H04L 1/0057* (2013.01);
(Continued)

(58) Field of Classification Search
CPC ... H04L 27/2602; H04L 5/003; H04L 5/0007; H04L 25/03821; H04L 27/2605;
(Continued)

(56) References Cited

U.S. PATENT DOCUMENTS 8,345,534 B1   1/2013  Narasimhan et al.
8,724,720 B2 *  5/2014  Srinivasa .............. H04L 1/0016
                                                    375/260
(Continued)

OTHER PUBLICATIONS

Wang, Haiming [Presenter] "LDPC Tone Mapping for IEEE 802.11aj (45GHz)", IEEE, Jul. 2014, 30 pages.
(Continued)

*Primary Examiner* — Jung Liu
(74) *Attorney, Agent, or Firm* — Knobbe, Martens, Olson & Bear, LLP

(57) ABSTRACT

Methods and apparatuses for providing wireless messages according to various tone plans can include a system configured to generate a message according to a 2048-tone plan having 1960 data tones. The 2048-tone plan includes two identical 1024-tone plans each having 980 data tones. The system can further perform segment parsing to divide data into two data portions, each portion for transmission over one of two 80 MHz bandwidths, according to one of the two identical 1024-tone plans. The system can further perform low density parity check (LDPC) tone mapping separately on each of the two data portions. The system can further provide the message for transmission over a 160 MHz bandwidth including the two 80 MHz bandwidths.

24 Claims, 55 Drawing Sheets

Related U.S. Application Data on Aug. 20, 2014, provisional application No. 62/064,301, filed on Oct. 15, 2014.

(51) Int. Cl.
*H04L 5/00* (2006.01)
*H04L 27/26* (2006.01)
*H04L 1/00* (2006.01)

(52) U.S. Cl.
CPC .......... *H04L 1/0071* (2013.01); *H04L 5/0044* (2013.01); *H04L 5/0048* (2013.01); *H04L 27/2602* (2013.01); *H04L 5/0023* (2013.01)

(58) Field of Classification Search
CPC ..... H04L 27/2601; H04L 5/0048; H04L 5/00; H04B 17/0085; H04W 84/12; H04N 21/2404; H04N 21/2385; H04N 21/242
See application file for complete search history.

(56) References Cited

U.S. PATENT DOCUMENTS

| | | | |
|---|---|---|---|
| 2012/0087426 A1 | 4/2012 | Zhang et al. | |
| 2012/0294247 A1 | 11/2012 | Choi et al. | |
| 2012/0327868 A1 | 12/2012 | Taghavi et al. | |
| 2013/0121243 A1 | 5/2013 | Vermani et al. | |
| 2013/0177115 A1 | 7/2013 | Yang et al. | |
| 2013/0179755 A1 | 7/2013 | Yang et al. | |
| 2013/0208821 A1 | 8/2013 | Yang et al. | |
| 2013/0315323 A1 | 11/2013 | Porat | |
| 2014/0016571 A1 | 1/2014 | Yucek et al. | |
| 2015/0063255 A1 | 3/2015 | Tandra et al. | |
| 2015/0280953 A1* | 10/2015 | Porat | H04L 27/2602 370/330 |
| 2015/0288489 A1* | 10/2015 | Azizi | H04L 1/0057 370/210 |
| 2015/0326351 A1 | 11/2015 | Kim et al. | |
| 2015/0349995 A1* | 12/2015 | Zhang | H04L 5/0048 375/295 |
| 2015/0365195 A1 | 12/2015 | Yang et al. | |
| 2016/0007354 A1 | 1/2016 | Chen et al. | |
| 2016/0021667 A1 | 1/2016 | Kwon et al. | |
| 2016/0029397 A1 | 1/2016 | Chen et al. | |
| 2016/0080043 A1 | 3/2016 | Tian et al. | |
| 2016/0241369 A1 | 8/2016 | Yang et al. | |
| 2016/0353370 A1* | 12/2016 | Choi | H04L 27/2613 |

OTHER PUBLICATIONS

IEEE Standards Association: "Part 11: Wireless LAN Medium Access Control (MAC) and Physical Layer (PHY) Specifications, Amendment 4: Enhancements for Very High Throughput for Operation in Bands below 6 GHz" Dec. 11, 2013 (Dec. 11, 2013), XP002745074, pp. 1-150.

International Search Report and Written Opinion—PCT/US2015/043616—ISA/EPO—dated Oct. 7, 2015.

Zheng, J., "LDPC for 11ac", IEEE Standards, Nov. 8, 2010, pp. Slide 1-Slide 39, XP002694969, Piscataway, NJ, USA.

* cited by examiner

| FFT Size | Minimum # DC tones | Minimum # guard tones | Minimum # pilot tones | Upper bound of $N_{data}$ |
|---|---|---|---|---|
| 64 | 1 | 7 | 4 | $N_{data} <= 64-1-7-4=52$ |
| | 3 | 7 | 4 | $N_{data} <= 64-3-7-4=50$ |
| | 5 | 7 | 4 | $N_{data} <= 64-5-7-4=48$ |
| | 7 | 7 | 4 | $N_{data} <= 64-7-7-4=46$ |
| 128 | 3 | 11 | 6 | $N_{data} <= 128-3-11-6=108$ |
| | 5 | 11 | 6 | $N_{data} <= 128-5-11-6=106$ |
| | 7 | 11 | 6 | $N_{data} <= 128-7-11-6=104$ |
| 256 | 3 | 11 | 8 | $N_{data} <= 256-3-11-8=234$ |
| | 5 | 11 | 8 | $N_{data} <= 256-5-11-8=232$ |
| | 7 | 11 | 8 | $N_{data} <= 256-7-11-8=230$ |
| 512 | 3 | 11 | 12 | $N_{data} <= 512-3-11-12=486$ |
| | 5 | 11 | 12 | $N_{data} <= 512-5-11-12=484$ |
| | 7 | 11 | 12 | $N_{data} <= 512-7-11-12=482$ |
| | 11 | 11 | 12 | $N_{data} <= 512-11-11-12=478$ |
| 1024 | 3 | 11 | 12 | $N_{data} <= 1024-3-11-12=998$ |
| | 5 | 11 | 12 | $N_{data} <= 1024-5-11-12=996$ |
| | 7 | 11 | 12 | $N_{data} <= 1024-7-11-12=994$ |
| | 11 | 11 | 12 | $N_{data} <= 1024-11-11-12=990$ |

FIG. 4

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 64 | 1 | 52 | — | — | — | 62 |
| | 3 | 50 | Floor(234/4)=58 | Floor(486/8)=60 | Floor(998/16)=62 | |
| | 5 | 48 | Floor(232/4)=58 | Floor(484/8)=60 | Floor(996/16)=62 | |
| | 7 | 46 | Floor(230/4)=57 | Floor(482/8)=60 | Floor(994/16)=62 | |
| | 11 | — | — | Floor(478/8)=59 | Floor(990/16)=61 | |

FIG. 5A

| # $N_{data}$ for 64 FFT Tones | 50 | 54 | 56 | 58 | 60 | 62 |
|---|---|---|---|---|---|---|
| Gain over 48 | 4.17% | 12.5% | 16.67% | 20.83% | 25% | 29.17% |
| Gain over 52 | -3.85% | 3.85% | 7.69% | 11.54% | 15.38% | 19.23% |

FIG. 5B

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 128 | 3 | 108 | Floor(234/2)=117 | Floor(486/4)=121 | Floor(998/8)=124 | 124 |
| | 5 | 106 | Floor(232/2)=116 | Floor(484/4)=121 | Floor(996/8)=124 | |
| | 7 | 104 | Floor(230/2)=115 | Floor(482/4)=120 | Floor(994/8)=124 | |
| | 11 | — | — | Floor(478/4)=119 | Floor(990/8)=123 | |

FIG. 6A

| # $N_{data}$ for 128 FFT Tones | 110 | 112 | 114 | 116 | 118 | 120 | 122 | 124 |
|---|---|---|---|---|---|---|---|---|
| Gain over 108 | 1.85% | 3.70% | 5.56% | 7.41% | 9.26% | 11.11% | 12.96% | 14.81% |

FIG. 6B

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 192 | 3 | — | Floor(234*3/4)=175 | Floor(486*3/8)=182 | Floor(998*3/16)=187 | 187 |
| | 5 | — | Floor(232*3/4)=174 | Floor(484*3/8)=181 | Floor(996*3/16)=186 | |
| | 7 | — | Floor(230*3/4)=172 | Floor(482*3/8)=180 | Floor(994*3/16)=186 | |
| | 11 | — | — | Floor(478*3/8)=179 | Floor(990*3/16)=185 | |

FIG. 7A

| # $N_{data}$ for 192 FFT Tones | 168 | 170 | 172 | 174 | 176 | 178 |
|---|---|---|---|---|---|---|
| Gain over 187 | -10.16% | -9.09% | -8.02% | -6.95% | -5.88% | -4.81% |
| Feasible # $N_{data}$ for 192 FFT Tones | 180 | 182 | 184 | 186 | | |
| Gain over 187 | -3.74% | -2.67% | -1.60% | -0.53% | | |

FIG. 7B

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 256 | 3 | 234 | 234 | Floor(486/2)=243 | Floor(998/4)=249 | 249 |
| | 5 | 232 | 232 | Floor(484/2)=242 | Floor(996/4)=249 | |
| | 7 | 230 | 230 | Floor(482/2)=241 | Floor(994/4)=248 | |
| | 11 | — | — | Floor(478/2)=239 | Floor(990/4)=247 | |

FIG. 8A

| # $N_{data}$ for 256 FFT Tones | 236 | 238 | 240 | 242 | 244 | 246 | 248 |
|---|---|---|---|---|---|---|---|
| Gain over 234 | 0.85% | 1.71% | 2.56% | 3.42% | 4.27% | 5.13% | 5.98% |

FIG. 8B

| FFT Tones | Minimum # DC Tones | SU 20MHz | OFDMA with Different Total Bandwidth | | Unified Upper Bound |
|---|---|---|---|---|---|
| | | | 40MHz | 80MHz/160MHz | |
| 384 | 3 | — | Floor(486*3/4)=364 | Floor(998*3/8)=374 | 374 |
| | 5 | — | Floor(484*3/4)=363 | Floor(996*3/8)=373 | |
| | 7 | — | Floor(482*3/4)=361 | Floor(994*3/8)=372 | |
| | 11 | — | Floor(478*3/4)=358 | Floor(990*3/8)=371 | |

FIG. 9A

| # $N_{data}$ for 384 FFT Tones | 350 | 352 | 354 | 356 | 357 | 358 | 360 |
|---|---|---|---|---|---|---|---|
| Gain over 374 | -6.42% | -5.88% | -5.35% | -4.81% | -4.55% | -4.28% | -3.74% |
| Feasible # $N_{data}$ for 384 FFT Tones | 364 | 366 | 368 | 370 | 372 | | |
| Gain over 374 | -2.67% | -2.14% | -1.60% | -1.07% | -0.53% | | |

FIG. 9B

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 512 | 3 | 486 | — | 486 | Floor(998/2)=499 | 499 |
| | 5 | 484 | — | 484 | Floor(996/2)=498 | |
| | 7 | 482 | — | 482 | Floor(994/2)=497 | |
| | 11 | 478 | — | 478 | Floor(990/2)=495 | |

FIG. 10A

| # $N_{data}$ for 512 FFT Tones | 470 | 472 | 474 | 476 | 478 | 480 | 484 | 486 |
|---|---|---|---|---|---|---|---|---|
| Gain over 468 | 0.43% | 0.85% | 1.28% | 1.71% | 2.14% | 2.56% | 3.42% | 3.85% |
| Feasible # $N_{data}$ for 512 FFT Tones | 488 | 490 | 492 | 496 | 498 | | | |
| Gain over 468 | 4.27% | 4.70% | 5.13% | 5.98% | 6.41% | | | |

FIG. 10B

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 768 | 3 | — | — | — | Floor(998*3/4)=748 | 748 |
| | 5 | — | — | — | Floor(996*3/4)=747 | |
| | 7 | — | — | — | Floor(994*3/4)=745 | |
| | 11 | — | — | — | Floor(990*3/4)=742 | |

FIG. 11A

| # $N_{data}$ for 768 FFT Tones | 732 | 738 | 740 | 744 |
|---|---|---|---|---|
| Gain over 748 | -2.14% | -1.34% | -1.07% | -0.53% |

FIG. 11B

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 1024 | 3 | 998 | — | — | 998 | 998 |
| | 5 | 996 | — | — | 996 | |
| | 7 | 994 | — | — | 994 | |
| | 11 | 990 | — | — | 990 | |

FIG. 12A

| # $N_{data}$ for 1024FFT | 948 | 960 | 972 | 980 | 984 | 990 | 996 |
|---|---|---|---|---|---|---|---|
| Gain over 936 | 1.28% | 2.56% | 4.06% | 4.70% | 5.13% | 5.77% | 6.41% |

FIG. 12B

| FFT Tones | Minimum # DC Tones | SU | OFDMA with Different Total Bandwidth | | | | Unified Upper Bound |
|---|---|---|---|---|---|---|---|
| | | | 20MHz | 40MHz | 80MHz | 160MHz | |
| 1280 | 3 | — | — | — | — | Floor(998*5/4)=1247 | 1247 |
| | 5 | — | — | — | — | Floor(996*5/4)=1245 | |
| | 7 | — | — | — | — | Floor(994*5/4)=1242 | |
| | 11 | — | — | — | — | Floor(990*5/4)=1237 | |

FIG. 13A

| # $N_{data}$ for 1280 FFT Tones | 1200 | 1206 | 1212 | 1218 | 1224 | 1230 | 1232 | 1236 | 1242 |
|---|---|---|---|---|---|---|---|---|---|
| Gain over 1247 | -3.77% | -3.29% | -2.81% | -2.33% | -1.84% | -1.36% | -1.20% | -0.88% | -0.40% |

FIG. 13B

| FFT Tones | Minimum # DC Tones | SU | OFDMA with Different Total Bandwidth | | | | Unified Upper Bound |
|---|---|---|---|---|---|---|---|
| | | | 20MHz | 40MHz | 80MHz | 160MHz | |
| 1536 | 3 | — | — | — | — | Floor(998*3/2)=1497 | 1497 |
| | 5 | — | — | — | — | Floor(996*3/2)=1494 | |
| | 7 | — | — | — | — | Floor(994*3/2)=1491 | |
| | 11 | — | — | — | — | Floor(990*3/2)=1485 | |

FIG. 14A

| # $N_{data}$ for 1536 FFT Tones | 1420 | 1422 | 1424 | 1426 | 1428 | 1430 | 1432 | 1434 | 1436 |
|---|---|---|---|---|---|---|---|---|---|
| Gain over 1497 | -5.14% | -5.01% | -4.88% | -4.74% | -4.61% | -4.48% | -4.34% | -4.21% | -4.07% |
| # $N_{data}$ for 1536 FFT Tones | 1438 | 1440 | 1452 | 1464 | 1470 | 1485 | 1488 | 1491 | |
| Gain over 1497 | -3.94% | -3.81% | -3.01% | -2.20% | -1.80% | -0.80% | -0.60% | -0.40% | |

FIG. 14B

| FFT Tones | Minimum # DC Tones | SU | OFDMA with Different Total Bandwidth | | | | Unified Upper Bound |
|---|---|---|---|---|---|---|---|
| | | | 20MHz | 40MHz | 80MHz | 160MHz | |
| 1792 | 3 | — | — | — | — | Floor(998*7/4)=1746 | 1746 |
| | 5 | — | — | — | — | Floor(996*7/4)=1743 | |
| | 7 | — | — | — | — | Floor(994*7/4)=1739 | |
| | 11 | — | — | — | — | Floor(990*7/4)=1732 | |

FIG. 15A

| # $N_{data}$ for 1792 FFT Tones | 1660 | 1664 | 1668 | 1672 | 1680 | 1688 | 1692 | 1696 | 1700 |
|---|---|---|---|---|---|---|---|---|---|
| Gain over 1/46 | -4.93% | -4.70% | -4.47% | -4.24% | -3.78% | -3.32% | -3.09% | -2.86% | -2.63% |
| # $N_{data}$ for 1792 FFT Tones | 1704 | 1708 | 1710 | 1712 | 1716 | 1720 | 1728 | 1740 | 1745 |
| Gain over 1746 | -2.41% | -2.18% | -2.06% | -1.95% | -1.72% | -1.49% | -1.03% | -0.34% | -0.06% |

FIG. 15B

| $N_{data}$ | $N_{COL}$ Candidates | $N_{ROW}$ $N_{data}/N_{COL}$ | $N_{ROT}$ Candidates ($N_{SS}<=4$) | $N_{ROT}$ Candidates ($N_{SS}>4$) | Stream Permutation ($N_{SS}<=4$) | Stream Permutation ($N_{SS}>4$) |
|---|---|---|---|---|---|---|
| 50 | 2,5,10,25 | | 1, 2, 3, 4, 5, 6, 7, 8, 9, 10, 11, 12, 13, 14, 15, 16, 17, 18, 19, 20, 21, 22, 23, 24, 25, 26 | 1, 2, 3, 4, 5, 6, 7, 8, 9, 10, 11, 12, 13, 14, 15, 16, 17, 18 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 54 | 2,3,6,9,18,27 | | | | | |
| 56 | 2,4,7,8,14,28 | | | | | |
| 58 | 2,29 | | | | | |
| 60 | 2,3,4,5,6,10,12, 15,20,30 | | | | | |
| 62 | 2,31 | | | | | |

FIG. 18

| $N_{data}$ | $N_{COL}$ Candidates | $N_{ROW}$ $N_{data}/N_{COL}$ | $N_{ROT}$ Candidates ($N_{ss}$<=4) | $N_{ROT}$ Candidates ($N_{ss}$>4) | Stream Permutation ($N_{ss}$<=4) | Stream Permutation ($N_{ss}$>4) |
|---|---|---|---|---|---|---|
| 110 | 2,5,10,11,22,55 | | 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42 | 1, 2, 3, 4, 5, 6, 7, 8, 9, 10, 11, 12, 13, 14, 15, 16, 17, 18, 19, 20, 21, 22, 23, 24, 25, 26 | Bit reversal [0 2 1 3] | Choice 1: Bit reversal [0 4 2 6 1 5 3 7]  Choice 2: Permutation chosen to maximize average subcarrier distance of adjacent streams, e.g., [0 5 2 7 3 6 1 4] |
| 112 | 2,4,7,8,14,16,28,56 | | | | | |
| 114 | 2,3,6,19,38,57 | | | | | |
| 116 | 2,4,29,58 | | | | | |
| 118 | 2,59 | | | | | |
| 120 | 2,3,4,5,6,8,10,12,15,20,24,30,40,60 | | | | | |
| 122 | 2,61 | | | | | |
| 124 | 2,4,31,62 | | | | | |

FIG. 19

| $N_{data}$ | $N_{COL}$ Candidates | $N_{ROW}$ $N_{data}/N_{COL}$ | $N_{ROT}$ Candidates ($N_{ss}$<=4) | $N_{ROT}$ Candidates ($N_{ss}$>4) | Stream Permutation ($N_{ss}$<=4) | Stream Permutation ($N_{ss}$>4) |
|---|---|---|---|---|---|---|
| 168 | 2,3,4,6,7,8,12,14, 21,24,28,42,56, 84 | | 32, 33, 34, 35, 36, 37, 38, 39, 40, 41, 42, 43, 44, 45, 46, 47, 48, 49, 50, 51, 52, 53, 54, 55, 56, 57 | 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 170 | 2,5,10,17,34,85 | | | | | |
| 172 | 2,4,43,86 | | | | | |
| 174 | 2,3,6,29,58,87 | | | | | |
| 176 | 2,4,8,11,16,22,44, 88 | | | | | |
| 178 | 2,89 | | | | | |
| 180 | 2,3,4,5,6,9,10,12, 15,18,20,30,36, 45,60,90 | | | | | |
| 182 | 2,7,13,14,26,91 | | | | | |
| 184 | 2,4,8,23,46,92 | | | | | |
| 186 | 2,3,6,31,62,93 | | | | | |

FIG. 20

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 236 | 2,4,59,118 | | 49, 50, 51, 52, 53, 54, 55, 56, 57, 58, 59, 60, 61, 62, 63, 64, 65, 66, 67, 68, 69, 70, 71, 72, 73 | 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 238 | 2,7,14,17,34,119 | | | | | |
| 240 | 2,3,4,5,6,8,10,12 ,15,16,20,24,30, 40,48,60,80,120 | | | | | |
| 242 | 2,11,22,121 | | | | | |
| 244 | 2,4,61,122 | | | | | |
| 246 | 2,3,6,41,82,123 | | | | | |
| 248 | 2,4,8,31,62,124 | | | | | |

FIG. 21

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 350 | 2,5,7,10,14,25,35,50, 70,175 | | 77, 78, 79, 80, 81, 82, 83, 84, 85, 86, 87, 88, 89, 90, 91, 92, 93, 94, 95, 96, 97, 98, 99, 100, 101, 102, 103, 104, 105 | 33, 34, 35, 36, 37, 38, 39, 40, 41, 42, 43, 44, 45, 46, 47, 48, 49, 50, 51, 52, 53, 54, 55, 56, 57, 58 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 352 | 2,4,8,11,16,22,32,44, 88,176 | | | | | |
| 354 | 2,3,6,59,118,177 | | | | | |
| 356 | 2,4,89,178 | | | | | |
| 357 | 3,7,17,21,51,119 | | | | | |
| 358 | 2,179 | | | | | |
| 360 | 2,3,4,5,6,8,9,10,12,15 ,18,20,24,30,36,40,45 ,60,72,90,120,180 | | | | | |
| 364 | 2,4,7,13,14,26,28,52, 91,182 | | | | | |
| 366 | 2,3,6,61,122,183 | | | | | |
| 368 | 2,4,8,16,23,46,92,184 | | | | | |
| 370 | 2,5,10,37,74,185 | | | | | |
| 372 | 2,3,4,6,12,31,62,93,124 ,186 | | | | | |

FIG. 22

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 470 | 2,5,10,47,94,235 | | 107, 108, 109, 110, 111, 112, 113, 114, 115, 116, 117, 118, 119, 120, 121, 122, 123, 124, 125, 126, 127, 128, 129, 130, 131, 132, 133, 134, 135, 136 | 48, 49, 50, 51, 52, 53, 54, 55, 56, 57, 58, 59, 60, 61, 62, 63, 64, 65, 66, 67, 68, 69, 70, 71, 72, 73 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 472 | 2,4,8,59,118,236 | | | | | |
| 474 | 2,3,6,79,158,237 | | | | | |
| 476 | 2,4,7,14,17,28,34,68,119, 238 | | | | | |
| 478 | 2,239 | | | | | |
| 480 | 2,3,4,5,6,8,10,12,15,16,20 ,24,30,32,40,48,60,80,96, 120,160,240 | | | | | |
| 484 | 2,4,11,22,44,121,242 | | | | | |
| 486 | 2,3,6,9,18,27,54,81,162, 243 | | | | | |
| 488 | 2,4,8,61,122,244 | | | | | |
| 490 | 2,5,7,10,14,35,49,70,98, 245 | | | | | |
| 492 | 2,3,4,6,12,41,82,123,164, 246 | | | | | |
| 496 | 2,4,8,16,31,62,124,248 | | | | | |
| 498 | 2,3,6,83,166,249 | | | | | |

FIG. 23

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 732 | 2,3,4,6,12,61,122, 183,244,366 | | 173, 174, 175, 176, 177, 178, 179, 180, 181, 182, 183, 184, 185, 186, 187, 188, 189, 190, 191, 192, 193, 194, 195, 196, 197, 198, 199 | 81, 82, 83, 84, 85, 86, 87, 88, 89, 90, 91, 92, 93, 94, 95, 96, 97, 98, 99, 100, 101, 102, 103, 104, 105 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 738 | 2,3,6,9,18,41,82, 123,246,369 | | | | | |
| 740 | 2,4,5,10,20,37,74, 148,185,370 | | | | | |
| 744 | 2,3,4,6,8,12,24,31 ,62,93,124,186,248 ,372 | | | | | |

FIG. 24

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 948 | 2,3,4,6,12,79,158,237,316,474 | | 227, 228, 229, 230 | 108, 109, 110, 111 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 960 | 2,3,4,5,6,8,10,12,15,16,20,24,30,32,40,48,60,64,80,96,120,160,192,240,320,480 | | 231, 232, 233, 234, 235, 236, 237, 238 | 112, 113, 114, 115, 116, 117, 118, 119 | | |
| 972 | 2,3,4,6,9,12,18,27,36,54,81,108,162,243,324,486 | | 239, 240, 241, 242, 243, 244 | 120, 121, 122, 123, 124, 125 | | |
| 980 | 2,4,5,7,10,14,20,28,35,49,70,98,140,196,245,490 | | 245, 246, 247, 248 | 126, 127, 128, 129 | | |
| 984 | 2,3,4,6,8,12,24,41,82,123,164,246,328,492 | | 249, 250 | 130, 131 | | |
| 990 | 2,3,5,6,9,10,11,15,18,22,30,33,45,55,66,90,99,110,165,198,330,495 | | 251, 252, 253, 254, 255, 256 | 132, 133, 134, 135 | | |
| 996 | 2,3,4,6,12,83,166,249,332,498 | | 257, 258, 259 | | | |

FIG. 25A

| $N_{data}$ | $N_{COL}$ Candidates | $N_{ROW}$ | $N_{ROT}$ Candidates ($N_{ss}$<=4) | $N_{ROT}$ Candidates ($N_{ss}$>4) | Stream Permutation ($N_{ss}$<=4) | Stream Permutation ($N_{ss}$>4) |
|---|---|---|---|---|---|---|
| 936 | 2,3,4,6,8,9,12,13, 18,24,26,36,39, 52,72,78,104, 117,156,234,312, 468 | $N_{data}$ /$N_{COL}$ | 224, 225, 226, 227, 228, 229, 230, 231, 232, 233, 234, 235, 236, 237, 238, 239, 240, 241, 242, 243, 244 | 107, 108, 109, 110, 111, 112, 113, 114, 115, 116, 117, 118, 119, 120, 121, 122, 123, 124, 125, 126, 127 | Bit reversal [0 2 1 3] | Choice 1: Bit reversal [0 4 2 6 1 5 3 7]<br>Choice 2: Permutation chosen to maximize average subcarrier distance of adjacent streams, e.g., [0 5 2 7 3 6 1 4] |

FIG. 25B

| $N_{data}$ | $N_{COL}$ Candidates | $N_{ROW}$ | $N_{ROT}$ Candidates ($N_{ss}$<=4) | $N_{ROT}$ Candidates ($N_{ss}$>4) | Stream Permutation ($N_{ss}$<=4) | Stream Permutation ($N_{ss}$>4) |
|---|---|---|---|---|---|---|
| 1200 | 2,3,4,5,6,8,10,12,15,16,20, 24,25,30,40,48,50,60,75, 80,100,120,150,200,240, 300,400,600 | $N_{data}/N_{COL}$ | 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321 | 140, 141, 142, 143, 144, 145, 146, 147, 148, 149, 150, 151, 152, 153, 154, 155, 156, 157, 158, 159, 160, 161, 162, 163, 164, 165, 166 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 1206 | 2,3,6,9,18,67,134,201,402 ,603 | | | | | |
| 1212 | 2,3,4,6,12,101,202,303, 404,606 | | | | | |
| 1218 | 2,3,6,7,14,21,29,42,58,87, 174,203,406,609 | | | | | |
| 1224 | 2,3,4,6,8,9,12,17,18,24,34, 36,51,68,72,102,136, 153,204,306,408,612 | | | | | |
| 1230 | 2,3,5,6,10,15,30,41,82, 123,205,246,410,615 | | | | | |
| 1232 | 2,4,7,8,11,14,16,22,28,44, 56,77,88,112,154,176, 308,616 | | | | | |
| 1236 | 2,3,4,6,12,103,206,309, 412,618 | | | | | |
| 1242 | 2,3,6,9,18,23,27,46,54, 69,138,207,414,621 | | | | | |

FIG. 26

| $N_{data}$ | $N_{COL}$ Candidates | $N_{ROW}$ | $N_{ROT}$ Candidates ($N_{SS}$<=4) | $N_{ROT}$ Candidates ($N_{SS}$>4) | Stream Permutation ($N_{ss}$<=4) | Stream Permutation ($N_{ss}$>4) |
|---|---|---|---|---|---|---|
| | | $N_{data}/N_{COL}$ | | | | |
| 1420 | 2,4,5,10,20,71,142,284,355,710 | | 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383 | 167, 168, 169, 170, 171, 172, 173, 174, 175, 176, 177, 178, 179, 180, 181, 182, 183, 184, 185, 186, 187 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 1422 | 2,3,6,9,18,79,158,237,474,711 | | | | | |
| 1424 | 2,4,8,16,89,178,356,712 | | | | | |
| 1426 | 2,23,31,46,62,713 | | | | | |
| 1428 | 2,3,4,6,7,12,14,17,21,28,34,42,51,68,84,102,119,204,238,357,476,714 | | | | | |
| 1430 | 2,5,10,11,13,22,26,55,65,110,130,143,286,715 | | | | | |
| 1432 | 2,4,8,179,358,716 | | | | | |
| 1434 | 2,3,6,239,478,717 | | | | | |
| 1436 | 2,4,359,718 | | | | | |
| 1438 | 2,719 | | | | | |
| 1440 | 2,3,4,5,6,8,9,10,12,15,16,18,20,24,30,32,36,40,45,48,60,72,80,90,96,120,144,160,180,240,288,360,480,720 | | | | | |
| 1452 | 2,3,4,6,11,12,22,33,44,66,121,132,242,363,484,726 | | | | | |
| 1464 | 2,3,4,6,8,12,24,61,122,183,244,366,488,732 | | | | | |
| 1470 | 2,3,5,6,7,10,14,15,21,30,35,42,49,70,98,105,147,210,245,294,490,735 | | | | | |
| 1485 | 3,5,9,11,15,27,33,45,55,99,135,165,297,495 | | | | | |
| 1488 | 2,3,4,6,8,12,16,24,31,48,62,93,124,186,248,372,496,744 | | | | | |
| 1491 | 3,7,21,71,213,497 | | | | | |

FIG. 27

| $N_{data}$ | $N_{COL}$ Candidates | $N_{ROW}$ $N_{data}/N_{COL}$ | $N_{ROT}$ Candidates ($N_{ss}$<=4) | $N_{ROT}$ Candidates ($N_{ss}$>4) | Stream Permutation ($N_{ss}$<=4) | Stream Permutation ($N_{ss}$>4) |
|---|---|---|---|---|---|---|
| 1660 | 2,4,5,10,20,83,166,332,415,830 | | 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447 | 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 1664 | 2,4,8,13,16,26,32,52,64,104,128,208,416,832 | | | | | |
| 1668 | 2,3,4,6,12,139,278,417,556,834 | | | | | |
| 1672 | 2,4,8,11,19,22,38,44,76,88,152,209,418,836 | | | | | |
| 1680 | 2,3,4,5,6,7,8,10,12,14,15,16,20,21,24,28,30,35,40,42,48,56,60,70,80,84,105,112,120,140,168,210,240,280,336,420,560,840 | | | | | |
| 1688 | 2,4,8,211,422,844 | | | | | |
| 1692 | 2,3,4,6,9,12,18,36,47,94,141,188,282,423,564,846 | | | | | |
| 1696 | 2,4,8,16,32,53,106,212,424,848 | | | | | |
| 1700 | 2,4,5,10,17,20,25,34,50,68,85,100,170,340,425,850 | | | | | |
| 1704 | 2,3,4,6,8,12,24,71,142,213,284,426,568,852 | | | | | |
| 1708 | 2,4,7,14,28,61,122,244,427,854 | | | | | |
| 1710 | 2,3,5,6,9,10,15,18,19,30,38,45,57,90,95,114,171,190,285,342,570,855 | | | | | |
| 1712 | 2,4,8,16,107,214,428,856 | | | | | |
| 1716 | 2,3,4,6,11,12,13,22,26,33,39,44,52,66,78,132,143,156,286,429,572,858 | | | | | |
| 1720 | 2,4,5,8,10,20,40,43,86,172,215,344,430,860 | | | | | |
| 1728 | 2,3,4,6,8,9,12,16,18,24,27,32,36,48,54,64,72,96,108,144,192,216,288,432,576,864 | | | | | |
| 1740 | 2,3,4,5,6,10,12,15,20,29,30,58,60,87,116,145,174,290,348,435,580,870 | | | | | |
| 1745 | 5,349 | | | | | |

FIG. 28

| FFT Size | Minimum # DC tones | Minimum # guard tones | Minimum # pilot tones | Upper bound of $N_{data}$ |
|---|---|---|---|---|
| 64 | 1 | 7 | 4 | $N_{data} <= 64-1-7-4=52$ |
|  | 3 | 7 | 4 | $N_{data} <= 64-3-7-4=50$ |
|  | 5 | 7 | 4 | $N_{data} <= 64-5-7-4=48$ |
|  | 7 | 7 | 4 | $N_{data} <= 64-7-7-4=46$ |
| 128 | 3 | 11 | 6 | $N_{data} <= 128-3-11-6=108$ |
|  | 5 | 11 | 6 | $N_{data} <= 128-5-11-6=106$ |
|  | 7 | 11 | 6 | $N_{data} <= 128-7-11-6=104$ |
| 256 | 3 | 11 | 8 | $N_{data} <= 256-3-11-8=234$ |
|  | 5 | 11 | 8 | $N_{data} <= 256-5-11-8=232$ |
|  | 7 | 11 | 8 | $N_{data} <= 256-7-11-8=230$ |
| 512 | 3 | 11 | 10 | $N_{data} <= 512-3-11-10=488$ |
|  | 5 | 11 | 10 | $N_{data} <= 512-5-11-10=486$ |
|  | 7 | 11 | 10 | $N_{data} <= 512-7-11-10=484$ |
|  | 11 | 11 | 10 | $N_{data} <= 512-11-11-10=480$ |
| 1024 | 3 | 11 | 12 | $N_{data} <= 1024-3-11-12=998$ |
|  | 5 | 11 | 12 | $N_{data} <= 1024-5-11-12=996$ |
|  | 7 | 11 | 12 | $N_{data} <= 1024-7-11-12=994$ |
|  | 11 | 11 | 12 | $N_{data} <= 1024-11-11-12=990$ |

FIG. 34

| FFT Tones | Minimum # DC Tones | SU | OFDMA with Different Total Bandwidth ||| Unified Upper Bound |
|---|---|---|---|---|---|---|
| | | | 20MHz | 40MHz | 80MHz/160MHz | |
| 32 | 1 | — | — | — | — | 31 |
| | 3 | — | Floor(234/8)=29 | Floor(488/16)=30 | Floor(998/32)=31 | |
| | 5 | — | Floor(232/8)=29 | Floor(486/16)=30 | Floor(996/32)=31 | |
| | 7 | — | Floor(230/8)=28 | Floor(484/16)=30 | Floor(994/32)=31 | |
| | 11 | — | — | Floor(480/16)=30 | Floor(990/32)=30 | |

FIG. 35

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 64 | 1 | 52 | — | — | — | 62 |
| | 3 | 50 | Floor(234/4)=58 | Floor(488/8)=61 | Floor(998/16)=62 | |
| | 5 | 48 | Floor(232/4)=58 | Floor(486/8)=60 | Floor(996/16)=62 | |
| | 7 | 46 | Floor(230/4)=57 | Floor(484/8)=60 | Floor(994/16)=62 | |
| | 11 | — | — | Floor(480/8)=60 | Floor(990/16)=61 | |

FIG. 36

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 128 | 3 | 108 | Floor(234/2)=117 | Floor(488/4)=122 | Floor(998/8)=124 | 124 |
| | 5 | 106 | Floor(232/2)=116 | Floor(486/4)=121 | Floor(996/8)=124 | |
| | 7 | 104 | Floor(230/2)=115 | Floor(484/4)=121 | Floor(994/8)=124 | |
| | 11 | — | — | Floor(480/4)=120 | Floor(990/8)=123 | |

FIG. 37

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 192 | 3 | — | Floor(234*3/4)=175 | Floor(488*3/8)=183 | Floor(998*3/16)=187 | 187 |
| | 5 | — | Floor(232*3/4)=174 | Floor(486*3/8)=182 | Floor(996*3/16)=186 | |
| | 7 | — | Floor(230*3/4)=172 | Floor(484*3/8)=181 | Floor(994*3/16)=186 | |
| | 11 | — | — | Floor(480*3/8)=180 | Floor(990*3/16)=185 | |

FIG. 38

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 256 | 3 | 234 | 234 | Floor(488/2)=244 | Floor(998/4)=249 | 249 |
| | 5 | 232 | 232 | Floor(486/2)=243 | Floor(996/4)=249 | |
| | 7 | 230 | 230 | Floor(484/2)=242 | Floor(994/4)=248 | |
| | 11 | — | — | Floor(480/2)=240 | Floor(990/4)=247 | |

FIG. 39

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 384 | 3 | — | — | Floor(488*3/4)=366 | Floor(998*3/8)=374 | 374 |
| | 5 | — | — | Floor(486*3/4)=364 | Floor(996*3/8)=373 | |
| | 7 | — | — | Floor(484*3/4)=363 | Floor(994*3/8)=372 | |
| | 11 | — | — | Floor(480*3/4)=360 | Floor(990*3/8)=371 | |

FIG. 40

| FFT Tones | Minimum # DC Tones | SU | OFDMA with Different Total Bandwidth | | | Unified Upper Bound |
|---|---|---|---|---|---|---|
| | | | 20MHz | 40MHz | 80MHz/160MHz | |
| 512 | 3 | 488 | — | 488 | Floor(998/2)=499 | 499 |
| | 5 | 486 | — | 486 | Floor(996/2)=498 | |
| | 7 | 484 | — | 484 | Floor(994/2)=497 | |
| | 11 | 480 | — | 480 | Floor(990/2)=495 | |

FIG. 41A

| # N$_{data}$ for 512 FFT Tones | 470 | 472 | 474 | 476 | 478 | 480 | 482 | 484 |
|---|---|---|---|---|---|---|---|---|
| Gain over 468 | 0.43% | 0.85% | 1.28% | 1.71% | 2.14% | 2.56% | 2.99% | 3.42% |
| # N$_{data}$ for 512 FFT Tones | 486 | 488 | 490 | 492 | 494 | 496 | 498 | |
| Gain over 468 | 3.85% | 4.27% | 4.70% | 5.13% | 5.56% | 5.98% | 6.41% | |

FIG. 41B

| # $N_{data}$ for 768 FFT Tones | 732 | 738 | 740 | 744 | 748 |
|---|---|---|---|---|---|
| Gain over 748 | -2.14% | -1.34% | -1.07% | -0.53% | 0 |

FIG. 42

| # $N_{data}$ for 1024FFT | 936 | 938 | 940 | 942 | 944 | 946 | 948 | 950 |
|---|---|---|---|---|---|---|---|---|
| Gain over 936 | 0 | 0.21% | 0.43% | 0.64% | 0.85% | 1.07% | 1.28% | 1.50% |
| # $N_{data}$ for 1024FFT | 952 | 954 | 956 | 958 | 960 | 962 | 964 | 966 |
| Gain over 936 | 1.71% | 1.92% | 2.14% | 2.35% | 2.56% | 2.78% | 2.99% | 3.21% |
| # $N_{data}$ for 1024FFT | 968 | 970 | 972 | 974 | 976 | 978 | 980 | 982 |
| Gain over 936 | 3.42% | 3.63% | 3.84% | 4.06% | 4.27% | 4.49% | 4.70% | 4.91% |
| # $N_{data}$ for 1024FFT | 984 | 986 | 988 | 990 | 992 | 994 | 996 | 998 |
| Gain over 936 | 5.13% | 5.34% | 5.56% | 5.77% | 5.98% | 6.20% | 6.41% | 6.62% |

FIG. 43

| # $N_{data}$ for 1280 FFT Tones | 1200 | 1203 | 1204 | 1206 | 1208 | 1209 | 1210 | 1212 |
|---|---|---|---|---|---|---|---|---|
| Gain over 1247 | -3.77% | -3.53% | -3.45% | -3.29% | -3.13% | -3.05% | -2.97% | -2.81% |
| # $N_{data}$ for 1280 FFT Tones | 1215 | 1216 | 1218 | 1220 | 1221 | 1224 | 1227 | 1228 |
| Gain over 1247 | -2.57% | -2.49% | -2.33% | -2.17% | -2.09% | -1.84% | -1.60% | -1.52% |
| # $N_{data}$ for 1280 FFT Tones | 1230 | 1232 | 1233 | 1236 | 1240 | 1242 | 1244 | |
| Gain over 1247 | -1.36% | -1.20% | -1.12% | -0.88% | -0.56% | -0.40% | -0.24% | |

FIG. 44

| # N_data for 1536 FFT Tones | 1438 | 1440 | 1446 | 1452 | 1456 | 1458 | 1460 | 1464 | 1470 |
|---|---|---|---|---|---|---|---|---|---|
| Gain over 1497 | -3.94% | -3.81% | -3.41% | -3.01% | -2.74% | -2.61% | -2.47% | -2.20% | -1.80% |
| # N_data for 1536 FFT Tones | 1420 | 1422 | 1424 | 1426 | 1428 | 1430 | 1432 | 1434 | 1436 |
| Gain over 1497 | -5.14% | -5.01% | -4.88% | -4.74% | -4.61% | -4.48% | -4.34% | -4.21% | -4.07% |
| # N_data for 1536 FFT Tones | 1476 | 1480 | 1482 | 1484 | 1488 | 1496 | | | |
| Gain over 1497 | -1.40% | -1.14% | -1.00% | -0.87% | -0.60% | -0.07% | | | |

FIG. 45

| # $N_{data}$ for 1792 FFT Tones | 1660 | 1662 | 1664 | 1666 | 1668 | 1670 | 1672 | 1674 | 1676 | |
|---|---|---|---|---|---|---|---|---|---|---|
| Gain over 1746 | -4.93% | -4.81% | -4.70% | -4.58% | -4.47% | -4.35% | -4.24% | -4.12% | -4.01% | |
| # $N_{data}$ for 1792 FFT Tones | 1678 | 1680 | 1682 | 1684 | 1686 | 1688 | 1690 | 1692 | 1694 | 1696 |
| Gain over 1746 | -3.89% | -3.78% | -3.67% | -3.55% | -3.43% | -3.32% | -3.21% | -3.09% | -2.98% | -2.86% |
| # $N_{data}$ for 1792 FFT Tones | 1698 | 1700 | 1702 | 1704 | 1706 | 1708 | 1710 | 1712 | 1714 | 1716 |
| Gain over 1746 | -2.75% | -2.63% | -2.52% | -2.41% | -2.29% | -2.18% | -2.06% | -1.95% | -1.83% | -1.72% |
| # $N_{data}$ for 1792 FFT Tones | 1718 | 1720 | 1722 | 1724 | 1726 | 1728 | 1734 | 1736 | 1740 | 1746 |
| Gain over 1746 | -1.60% | -1.49% | -1.37% | -1.26% | -1.15% | -1.03% | -0.69% | -0.57% | -0.34% | 0 |

FIG. 46

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 20 | 2,4,5,10 | | 1, 2, 3, 4, 5, 6, 7, 8, 9, 10, 11, 12, 13, 14, 15, 16, 17 | 1, 2, 3, 4, 5, 6, 7, 8, 9, 10, 11, 12, 13, 14 | Bit reversal [0 2 1 3] | Choice 1: Bit reversal [0 4 2 6 1 5 3 7]<br><br>Choice 2: Permutation chosen to maximize average subcarrier distance of adjacent streams, e.g., [0 5 2 7 3 6 1 4] |
| 22 | 2,11 | | | | | |
| 26 | 2,13 | | | | | |
| 28 | 2,4,7,14 | | | | | |

FIG. 47

| $N_{data}$ | $N_{COL}$ Candidates | $N_{ROW}$ | $N_{ROT}$ Candidates ($N_{ss}\leq 4$) | $N_{ROT}$ Candidates ($N_{ss}>4$) | Stream Permutation ($N_{ss}\leq 4$) | Stream Permutation ($N_{ss}>4$) |
|---|---|---|---|---|---|---|
| 362 | 2, 181 | $N_{data}/N_{COL}$ | 77, 78, 79, 80, 81, 82, 83, 84, 85, 86, 87, 88, 89, 90, 91, 92, 93, 94, 95, 96, 97, 98, 99, 100, 101, 102, 103, 104, 105 | 33, 34, 35, 36, 37, 38, 39, 40, 41, 42, 43, 44, 45, 46, 47, 48, 49, 50, 51, 52, 53, 54, 55, 56, 57, 58 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 374 | 2,11,17,22,34,187 | | | | | |

FIG. 48

| $N_{data}$ | $N_{COL}$ Candidates | $N_{ROW}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 482 | 2,241 | $N_{data}/N_{COL}$ | 107, 108, 109, 110, 111, 112, 113, 114, 115, 116, 117, 118, 119, 120, 121, 122, 123, 124, 125, 126, 127, 128, 129, 130, 131, 132, 133, 134, 135, 136 | 48, 49, 50, 51, 52, 53, 54, 55, 56, 57, 58, 59, 60, 61, 62, 63, 64, 65, 66, 67, 68, 69, 70, 71, 72, 73 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 494 | 2,13,19,26,38,247 | | | | | |

FIG. 49

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 938 | 2,7,14,67,134,469 | | 224, 225, 226, 227, 228, 229, 230, 231, 232, 233, 234, 235, 236, 237, 238, 239, 240, 241, 242, 243, 244, 245, 246, 247, 248, 249, 250, 251, 252 | 107, 108, 109, 110, 111, 112, 113, 114, 115, 116, 117, 118, 119, 120, 121, 122, 123, 124, 125, 126, 127, 128, 129, 130, 131 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 940 | 2,4,5,10,20,47,94,188,235,470 | | | | | |
| 942 | 2,3,6,157,314,471 | | | | | |
| 944 | 2,4,8,16,59,118,236,472 | | | | | |
| 946 | 2,11,22,43,86,473 | | | | | |
| 950 | 2,5,10,19,25,38,50,95,190,475 | | | | | |
| 952 | 2,4,7,8,14,17,28,34,56,68,119, 136,238,476 | | | | | |
| 954 | 2,3,6,9,18,53,106,159,318,477 | | | | | |
| 956 | 2,4,239,478 | | | | | |
| 962 | 2,13,26,37,74,481 | | | | | |
| 964 | 2,4,241,482 | | | | | |
| 966 | 2,3,6,7,14,21,23,42,46,69,138, 161,322,483 | | | | | |
| 968 | 2,4,8,11,22,44,88,121,242,484 | | | | | |

FIG. 50

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 970 | 2,5,10,97,194,485 | | 232, 233, 234, 235, 236, 237, 238, 239, 240, 241, 242, 243, 244, 245, 246, 247, 248, 249, 250, 251, 252, 253, 254, 255, 256, 257, 258, 259, 260 | 111, 112, 113, 114, 115, 116, 117, 118, 119, 120, 121, 122, 123, 124, 125, 126, 127, 128, 129, 130, 131, 132, 133, 134, 135 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 974 | 2,487 | | | | | |
| 976 | 2,4,8,16,61,122,244,488 | | | | | |
| 978 | 2,3,6,163,326,489 | | | | | |
| 982 | 2,491 | | | | | |
| 986 | 2,17,29,34,58,493 | | | | | |
| 988 | 2,4,13,19,26,38,52,76,247,494 | | | | | |
| 992 | 2,4,8,16,31,32,62,124,248,496 | | | | | |
| 994 | 2,7,14,71,142,497 | | | | | |
| 998 | 2,499 | | | | | |

FIG. 51

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 1203 | 3,401 | | 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321 | 140, 141, 142, 143, 144, 145, 146, 147, 148, 149, 150, 151, 152, 153, 154, 155, 156, 157, 158, 159, 160, 161, 162, 163, 164, 165, 166 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 1204 | 2,4,7,14,28,43,86,172, 301,602 | | | | | |
| 1208 | 2,4,8,151,302,604 | | | | | |
| 1209 | 3,13,31,39,93,403 | | | | | |
| 1210 | 2,5,10,11,22,55,110,121, 242,605 | | | | | |
| 1215 | 3,5,9,15,27,45,81,135, 243,405 | | | | | |
| 1216 | 2,4,8,16,19,32,38,64,76, 152,304,608 | | | | | |
| 1220 | 2,4,5,10,20,61,122,244 ,305,610 | | | | | |
| 1221 | 3,11,33,37,111,407 | | | | | |
| 1227 | 3,409 | | | | | |
| 1228 | 2,4,307,614 | | | | | |
| 1233 | 3,9,137,411 | | | | | |
| 1240 | 2,4,5,8,10,20,31,40,62, 124,155,248,310,620 | | | | | |
| 1244 | 2,4,311,622 | | | | | |

FIG. 52

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 1446 | 2,3,6,241,482,723 | | 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384 | 170, 171, 172, 173, 174, 175, 176, 177, 178, 179, 180, 181, 182, 183, 184, 185, 186, 187, 188, 189, 190, 191, 192, 193, 194, 195, 196, 197 | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 1456 | 2,4,7,8,13,14,16,26,28,52,56,91,104,112,182,208,364,728 | | | | | |
| 1458 | 2,3,6,9,18,27,54,81,162,243,486,729 | | | | | |
| 1460 | 2,4,5,10,20,73,146,292,365,730 | | | | | |
| 1476 | 2,3,4,6,9,12,18,36,41,82,123,164,246,364,492,738 | | | | | |
| 1480 | 2,4,5,8,10,20,37,40,74,148,185,296,370,740 | | | | | |
| 1482 | 2,3,6,13,19,26,38,39,57,78,114,247,494,741 | | | | | |
| 1484 | 2,4,7,14,28,53,106,212,371,742 | | | | | |
| 1496 | 2,4,8,11,17,22,34,44,68,88,136,187,374,748 | | | | | |

FIG. 53

| $N_{data}$ | $N_{COL}$ Candidates | $N_{ROW}$ $N_{data}/N_{COL}$ | $N_{ROT}$ Candidates ($N_{ss}<=4$) | $N_{ROT}$ Candidates ($N_{ss}>4$) | Stream Permutation ($N_{ss}<=4$) | Stream Permutation ($N_{ss}>4$) |
|---|---|---|---|---|---|---|
| 1662 | 2,3,6,277,554,831 | | 405, 406, | 197, 198, | Bit reversal [0 2 1 3] | Choice 1: Bit reversal [0 4 2 6 1 5 3 7] Choice 2: Permutation chosen to maximize average subcarrier distance of adjacent streams, e.g., [0 5 2 7 3 6 1 4] |
| 1666 | 2,7,14,17,34,49,98,119,238,833 | | 407, 408, | 199, 200, | | |
| 1670 | 2,5,10,167,334,835 | | 409, 410, | 201, 202, | | |
| 1674 | 2,3,6,9,18,27,31,54,62,93,186,279,558,837 | | 411, 412, | 203, 204, | | |
| 1676 | 2,4,419,838 | | 413, 414, | 205, 206, | | |
| 1678 | 2,839 | | 415, 416, | 207, 208, | | |
| 1682 | 2,29,58,841 | | 417, 418, | 209, 210, | | |
| 1684 | 2,4,421,842 | | 419, 420, | 211, 212, | | |
| 1686 | 2,3,6,281,562,843 | | 421, 422, | 213, 214, | | |
| 1690 | 2,5,10,13,26,65,130,169,338,845 | | 423, 424, | 215, 216, | | |
| 1694 | 2,7,11,14,22,77,121,154,242,847 | | 425, 426, | 217, 218, | | |
| 1698 | 2,3,6,283,566,849 | | 427, 428, | 219, 220, | | |
| 1702 | 2,23,37,46,74,851 | | 429, 430, | 221, 222, | | |
| 1706 | 2,853 | | 431, 432, | 223, 224, | | |
| 1714 | 2,857 | | 433, 434, | 225, 226, | | |
| 1718 | 2,859 | | 435, 436, | 227, 228, | | |
| 1722 | 2,3,6,7,14,21,41,42,82,123,246,287,574,861 | | 437, 438, | 229 | | |
| 1724 | 2,4,431,862 | | 439, 440, | | | |
| 1726 | 2,863 | | 441, 442, | | | |
| 1734 | 2,3,6,17,34,51,102,289,578,867 | | 443, 444, | | | |
| 1736 | 2,4,7,8,14,28,31,56,62,124,217,248,434,868 | | 445, 446, | | | |
| 1746 | 2,3,6,9,18,97,194,291,582,873 | | 447 | | | |

FIG. 54

SYSTEMS AND METHODS FOR IMPROVED COMMUNICATION EFFICIENCY IN WIRELESS NETWORKS

This application claims priority under 35 U.S.C. § 119(e) to U.S. Provisional App. No. 62/033,350, filed Aug. 5, 2014; U.S. Provisional App. No. 62/039,784, filed Aug. 20, 2014; and U.S. Provisional App. No. 62/064,301, filed Oct. 15, 2014; which is incorporated by reference herein in its entirety.

FIELD

Certain aspects of the present disclosure generally relate to wireless communications, and more particularly, to methods and apparatuses for providing messages according to various tone plans.

BACKGROUND

In many telecommunication systems, communications networks are used to exchange messages among several interacting spatially-separated devices. Networks can be classified according to geographic scope, which could be, for example, a metropolitan area, a local area, or a personal area. Such networks can be designated respectively as a wide area network (WAN), metropolitan area network (MAN), local area network (LAN), or personal area network (PAN). Networks also differ according to the switching/routing technique used to interconnect the various network nodes and devices (e.g., circuit switching vs. packet switching), the type of physical media employed for transmission (e.g., wired vs. wireless), and the set of communication protocols used (e.g., Internet protocol suite, SONET (Synchronous Optical Networking), Ethernet, etc.).

Wireless networks are often preferred when the network elements are mobile and thus have dynamic connectivity needs, or if the network architecture is formed in an ad hoc, rather than fixed, topology. Wireless networks employ intangible physical media in an unguided propagation mode using electromagnetic waves in the radio, microwave, infrared, optical, etc. frequency bands. Wireless networks advantageously facilitate user mobility and rapid field deployment when compared to fixed wired networks.

The devices in a wireless network can transmit/receive information between each other. Device transmissions can interfere with each other, and certain transmissions can selectively block other transmissions. Where many devices share a communication network, congestion and inefficient link usage can result. As such, systems, methods, and non-transitory computer-readable media are needed for improving communication efficiency in wireless networks.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the present disclosure provides an apparatus configured to perform wireless communication. The apparatus includes a memory that stores instructions. The apparatus further includes a processor or processing system coupled with the memory and configured to execute the instructions to generate a message according to a 2048-tone plan having 1960 data tones. The 2048-tone plan includes two identical 1024-tone plans each having 980 data tones. The processor is further configured to perform segment parsing to divide data into two data portions, each portion for transmission over one of two 80 MHz bandwidths, according to one of the two identical 1024-tone plans. The processor is further configured to perform low density parity check (LDPC) tone mapping separately on each of the two data portions. The processor is further configured to provide the message for transmission over a 160 MHz bandwidth including the two 80 MHz bandwidths. Another aspect provides a method of wireless communication. The method includes generating a message according to a 2048-tone plan having 1960 data tones. The 2048-tone plan includes two identical 1024-tone plans each having 980 data tones. The method further includes performing segment parsing to divide data into two data portions, each portion for transmission over one of two 80 MHz bandwidths, according to one of the two identical 1024-tone plans. The method further includes performing low density parity check (LDPC) tone mapping separately on each of the two data portions. The method further includes providing the message for transmission over a 160 MHz bandwidth including the two 80 MHz bandwidths. Another aspect provides an apparatus for wireless communication. The apparatus includes means for generating a message according to a 2048-tone plan having 1960 data tones. The 2048-tone plan includes two identical 1024-tone plans each having 980 data tones. The apparatus further includes means for performing segment parsing to divide data into two data portions, each portion for transmission over one of two 80 MHz bandwidths, according to one of the two identical 1024-tone plans. The apparatus further includes means for performing low density parity check (LDPC) tone mapping separately on each of the two data portions. The apparatus further includes means for providing the message for transmission over a 160 MHz bandwidth including the two 80 MHz bandwidths. Another aspect provides a non-transitory computer-readable medium. The medium includes code that, when executed, causes an apparatus to generate a message according to a 2048-tone plan having 1960 data tones. The 2048-tone plan includes two identical 1024-tone plans each having 980 data tones. The medium further includes code that, when executed, causes the apparatus to perform segment parsing to divide data into two data portions, each portion for transmission over one of two 80 MHz bandwidths, according to one of the two identical 1024-tone plans. The medium further includes code that, when executed, causes the apparatus to perform low density parity check (LDPC) tone mapping separately on each of the two data portions. The medium further includes code that, when executed, causes the apparatus to provide the message for transmission over a 160 MHz bandwidth including the two 80 MHz bandwidths.

BRIEF DESCRIPTION OF THE DRAWINGS

FIG. 4 shows upper bounds for 64-, 128-, 256-, 512-, and 1024-tone plans according to various embodiments when there is a single user.

FIG. 5A shows upper bounds for 64-tone, 5 MHz tone plans according to various embodiments.

FIG. 5B shows gain from any of the feasible 5 MHz tone plans over other possible tone plans, including some existing tone plans.

FIG. 6A shows upper bounds for 128-tone, 10 MHz tone plans according to various embodiments.

FIG. 6B shows gain from any of the feasible 10 MHz tone plans over other possible tone plans, including some existing tone plans.

FIG. 7A shows upper bounds for 192-tone, 15 MHz tone plans according to various embodiments.

FIG. 7B shows gain from any of the feasible 15 MHz tone plans over other possible tone plans, including some existing tone plans.

FIG. 8A shows upper bounds for 256-tone, 20 MHz tone plans according to various embodiments.

FIG. 8B shows gain from any of the feasible 20 MHz tone plans over other possible tone plans, including some existing tone plans.

FIG. 9A shows upper bounds for 384-tone, 30 MHz tone plans according to various embodiments.

FIG. 9B shows gain from any of the feasible 30 MHz tone plans over other possible tone plans, including some existing tone plans.

FIG. 10A shows upper bounds for 512-tone, 40 MHz tone plans according to various embodiments.

FIG. 10B shows gain from any of the feasible 40 MHz tone plans over other possible tone plans, including some existing tone plans.

FIG. 11A shows upper bounds for 768-tone, 60 MHz tone plans according to various embodiments.

FIG. 11B shows gain from any of the feasible 60 MHz tone plans over other possible tone plans, including some existing tone plans.

FIG. 12A shows upper bounds for 1024-tone, 80 MHz tone plans according to various embodiments.

FIG. 12B shows gain from any of the feasible 80 MHz tone plans over other possible tone plans, including some existing tone plans.

FIG. 13A shows upper bounds for 1280-tone, 100 MHz tone plans according to various embodiments.

FIG. 13B shows gain from any of the feasible 100 MHz tone plans over other possible tone plans, including some existing tone plans.

FIG. 14A shows upper bounds for 1536-tone, 120 MHz tone plans according to various embodiments.

FIG. 14B shows gain from any of the feasible 120 MHz tone plans over other possible tone plans, including some existing tone plans.

FIG. 15A shows upper bounds for 1792-tone, 140 MHz tone plans according to various embodiments.

FIG. 15B shows gain from any of the feasible 140 MHz tone plans over other possible tone plans, including some existing tone plans.

FIG. 18 is a chart illustrating candidate interleaver parameters for different numbers of data tones, according to a 64-tone plan embodiment.

FIG. 19 is a chart illustrating candidate interleaver parameters for different numbers of data tones, according to a 128-tone plan embodiment.

FIG. 20 is a chart illustrating candidate interleaver parameters for different numbers of data tones, according to a 192-tone plan embodiment.

FIG. 21 is a chart illustrating candidate interleaver parameters for different numbers of data tones, according to a 256-tone plan embodiment.

FIG. 22 is a chart illustrating candidate interleaver parameters for different numbers of data tones, according to a 384-tone plan embodiment.

FIG. 23 is a chart illustrating candidate interleaver parameters for different numbers of data tones, according to a 512-tone plan embodiment.

FIG. 24 is a chart illustrating candidate interleaver parameters for different numbers of data tones, according to a 768-tone plan embodiment.

FIG. 25A is a chart illustrating candidate interleaver parameters for different numbers of data tones, according to a 1024-tone plan embodiment.

FIG. 25B is a chart illustrating another candidate interleaver parameter for different numbers of data tones, according to a 1024-tone plan embodiment.

FIG. 26 is a chart illustrating candidate interleaver parameters for different numbers of data tones, according to a 1280-tone plan embodiment.

FIG. 27 is a chart illustrating candidate interleaver parameters for different numbers of data tones, according to a 1536-tone plan embodiment.

FIG. 28 is a chart illustrating candidate interleaver parameters for different numbers of data tones, according to a 1792-tone plan embodiment.

FIG. 34 is an illustration of the upper bounds for the number of data tones in a number of different transmissions.

FIG. 35 shows upper bounds for 32-tone, 2.5 MHz tone plans according to various embodiments.

FIG. 36 shows upper bounds for 64-tone, 5 MHz tone plans according to various embodiments.

FIG. 37 shows upper bounds for 128-tone, 10 MHz tone plans according to various embodiments.

FIG. 38 shows upper bounds for 192-tone, 15 MHz tone plans according to various embodiments.

FIG. 39 shows upper bounds for 256-tone, 20 MHz tone plans according to various embodiments.

FIG. 40 shows upper bounds for 384-tone, 30 MHz tone plans according to various embodiments.

FIG. 41A shows upper bounds for 512-tone, 40 MHz tone plans according to various embodiments.

FIG. 41B shows gain from any of the feasible 40 MHz tone plans over other possible tone plans, including some existing tone plans.

FIG. 42 shows gain from any of the feasible 60 MHz tone plans over other possible tone plans, including some existing tone plans.

FIG. 43 shows gain from any of the feasible 80 MHz tone plans over other possible tone plans, including some existing tone plans.

FIG. 44 shows gain from any of the feasible 100 MHz tone plans over other possible tone plans, including some existing tone plans.

FIG. 45 shows gain from any of the feasible 120 MHz tone plans over other possible tone plans, including some existing tone plans.

FIG. 46 shows gain from any of the feasible 140 MHz tone plans over other possible tone plans, including some existing tone plans.

FIG. 47 is a chart illustrating candidate interleaver parameters for different numbers of data tones, according to a 32-tone plan embodiment.

FIG. 48 is a chart illustrating certain candidate interleaver parameters for different numbers of data tones, according to a 384-tone plan embodiment.

FIG. 49 is a chart illustrating certain candidate interleaver parameters for different numbers of data tones, according to a 512-tone plan embodiment.

FIG. 50 is a chart illustrating certain candidate interleaver parameters for different numbers of data tones, according to a 1024-tone plan embodiment.

FIG. 51 is an additional chart illustrating additional candidate interleaver parameters for different numbers of data tones, according to a 1024-tone plan embodiment.

FIG. 52 is a chart illustrating candidate interleaver parameters for different numbers of data tones, according to a 1280-tone plan embodiment.

FIG. 53 is a chart illustrating candidate interleaver parameters for different numbers of data tones, according to a 1536-tone plan embodiment.

FIG. 54 is a chart illustrating candidate interleaver parameters for different numbers of data tones, according to a 1792-tone plan embodiment.

DETAILED DESCRIPTION

Figure 1:
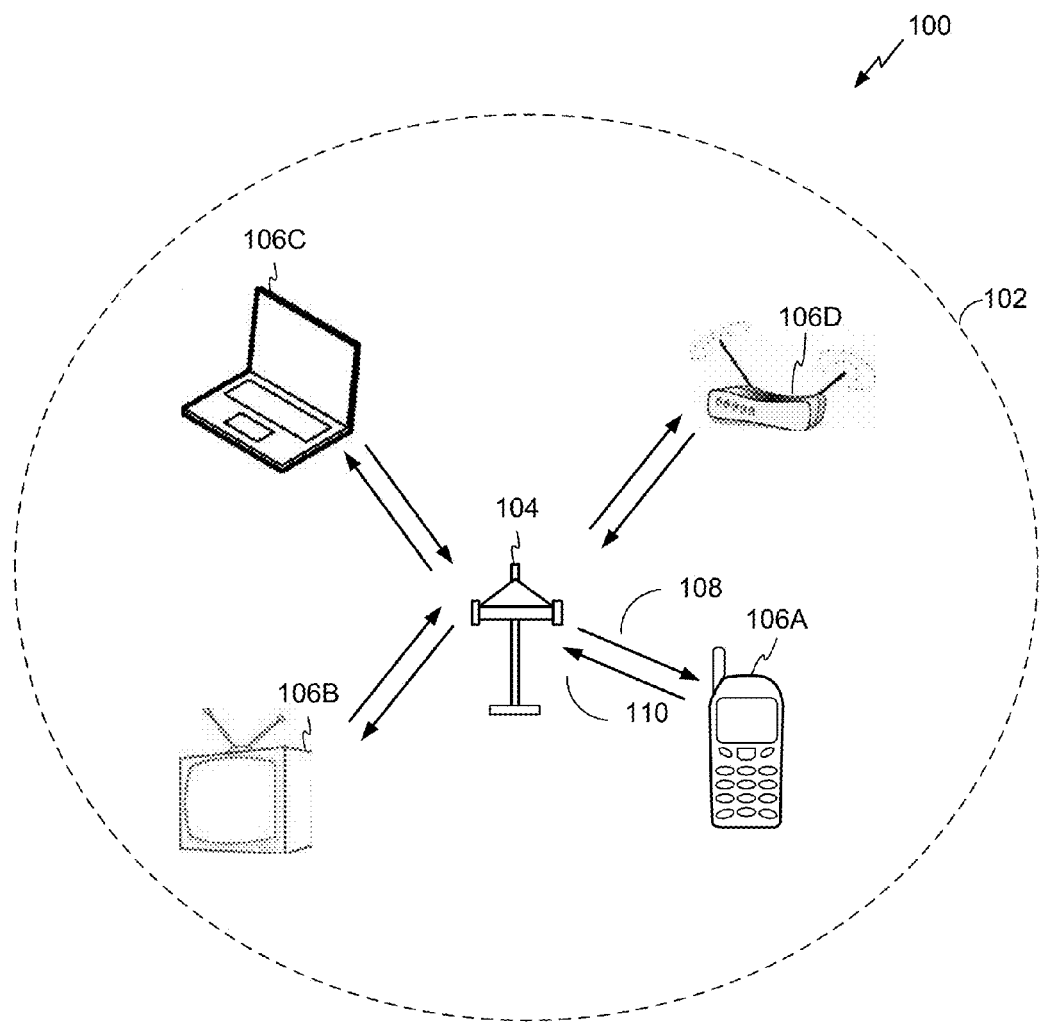
FIG. 1 illustrates an example of a wireless communication system in which aspects of the present disclosure can be employed.

Various aspects of the novel systems, apparatuses, and methods are described more fully hereinafter with reference to the accompanying drawings. The teachings disclosure can, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect of the invention. For example, an apparatus can be implemented or a method can be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein can be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Implementing Devices

Wireless network technologies can include various types of wireless local area networks (WLANs). A WLAN can be used to interconnect nearby devices together, employing widely used networking protocols. The various aspects described herein can apply to any communication standard, such as Wi-Fi or, more generally, any member of the IEEE 802.11 family of wireless protocols.

In some aspects, wireless signals can be transmitted according to a high-efficiency 802.11 protocol using orthogonal frequency-division multiplexing (OFDM), direct sequence spread spectrum (DSSS) communications, a combination of OFDM and DSSS communications, or other schemes.

In some implementations, a WLAN includes various devices which are the components that access the wireless network. For example, there can be two types of devices: access points ("APs") and clients (also referred to as stations, or "STAs"). In general, an AP serves as a hub or base station for the WLAN and an STA serves as a user of the WLAN. For example, a STA can be a laptop computer, a personal digital assistant (PDA), a mobile phone, etc. In an example, an STA connects to an AP via a Wi-Fi (e.g., IEEE 802.11 protocol such as 802.11ax) compliant wireless link to obtain general connectivity to the Internet or to other wide area networks. In some implementations an STA can also be used as an AP.

The techniques described herein can be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system can utilize sufficiently different directions to concurrently transmit data belonging to multiple user terminals. A TDMA system can allow multiple user terminals to share the same frequency channel by dividing the transmission signal into different time slots, each time slot being assigned to different user terminal. A TDMA system can implement GSM or some other standards known in the art. An OFDMA system utilizes orthogonal frequency division multiplexing (OFDM), which is a modulation technique that partitions the overall system bandwidth into multiple orthogonal sub-carriers. These sub-carriers can also be called tones, bins, etc. With OFDM, each sub-carrier can be independently modulated with data. An OFDM system can implement IEEE 802.11 or some other standards known in the art. An SC-FDMA system can utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA. A SC-FDMA system can implement 3GPP-LTE (3rd Generation Partnership Project Long Term Evolution) or other standards.

The teachings herein can be incorporated into (e.g., implemented within or performed by) a variety of wired or wireless apparatuses (e.g., nodes). In some aspects, a wireless node implemented in accordance with the teachings herein can comprise an access point or an access terminal.

An access point ("AP") can comprise, be implemented as, or known as a NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

A station ("STA") can also comprise, be implemented as, or known as a user terminal, an access terminal ("AT"), a subscriber station, a subscriber unit, a mobile station, a remote station, a remote terminal, a user agent, a user device, user equipment, or some other terminology. In some implementations an access terminal can comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein can be incorporated into a phone (e.g., a cellular phone or smart phone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

FIG. 1 illustrates an example of a wireless communication system 100 in which aspects of the present disclosure can be employed. The wireless communication system 100 can operate pursuant to a wireless standard, for example the 802.11ax standard. The wireless communication system 100 can include an AP 104, which communicates with STAs 106A-106D.

A variety of processes and methods can be used for transmissions in the wireless communication system 100 between the AP 104 and the STAs 106A-106D. For example, signals can be transmitted and received between the AP 104 and the STAs 106A-106D in accordance with OFDM/OFDMA techniques. If this is the case, the wireless communication system 100 can be referred to as an OFDM/OFDMA system. Alternatively, signals can be transmitted and received between the AP 104 and the STAs 106A-106D in accordance with CDMA techniques. If this is the case, the wireless communication system 100 can be referred to as a CDMA system.

A communication link that facilitates transmission from the AP 104 to one or more of the STAs 106 can be referred to as a downlink (DL) 108, and a communication link that facilitates transmission from one or more of the STAs 106A-106D to the AP 104 can be referred to as an uplink (UL) 110. Alternatively, a downlink 108 can be referred to as a forward link or a forward channel, and an uplink 110 can be referred to as a reverse link or a reverse channel.

The AP 104 can provide wireless communication coverage in a basic service area (BSA) 102. The AP 104 along with the STAs 106A-106D associated with the AP 104 and that use the AP 104 for communication can be referred to as a basic service set (BSS). It should be noted that the wireless communication system 100 may not have a central AP 104, but rather can function as a peer-to-peer network between the STAs 106A-106D. Accordingly, the functions of the AP 104 described herein can alternatively be performed by one or more of the STAs 106A-106D.

Figure 2:
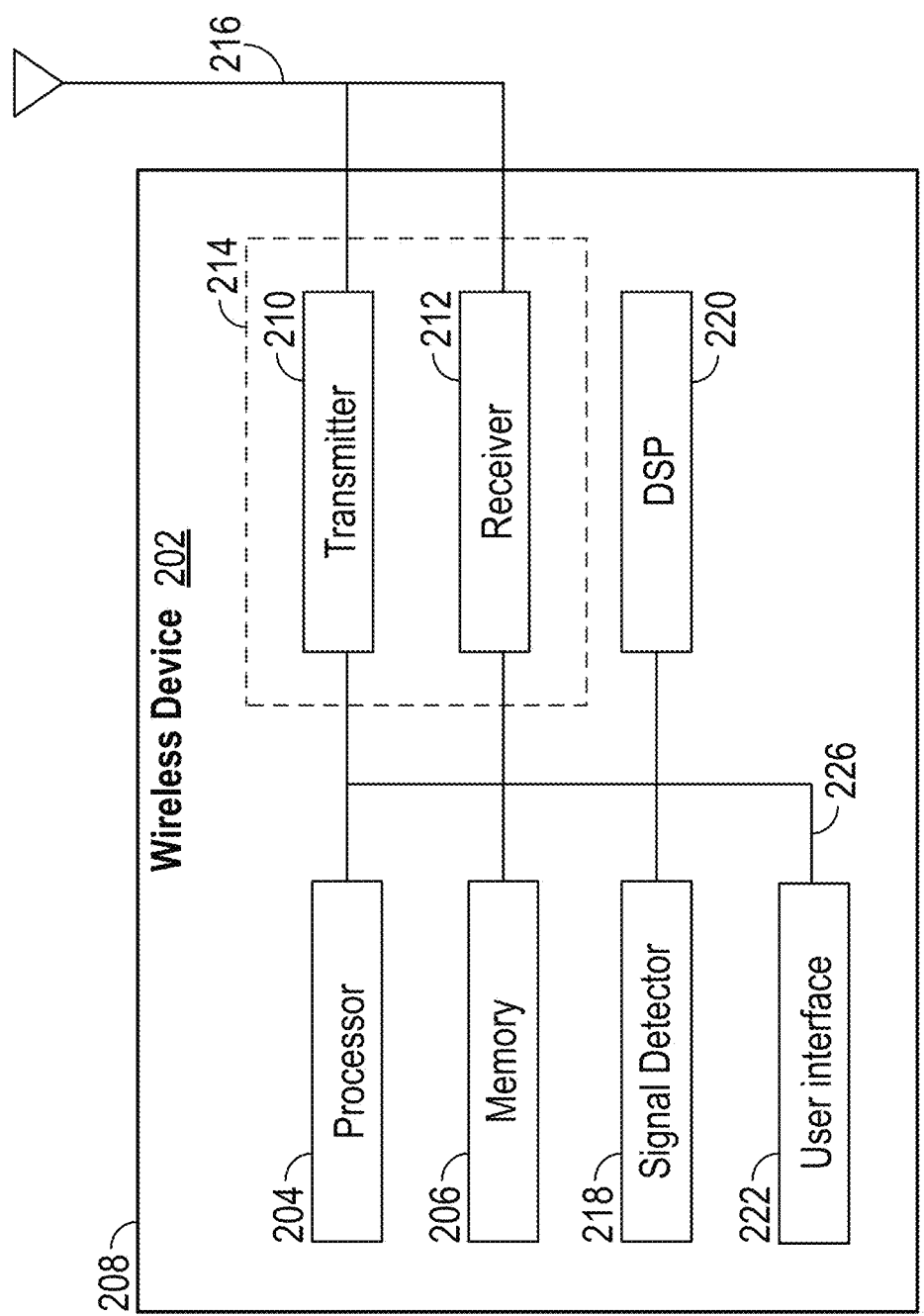
FIG. 2 illustrates various components that can be utilized in a wireless device that can be employed within the wireless communication system of FIG. 1.

FIG. 2 illustrates various components that can be utilized in a wireless device 202 that can be employed within the wireless communication system 100. The wireless device 202 is an example of a device that can be configured to implement the various methods described herein. For example, the wireless device 202 can comprise the AP 104 or one of the STAs 106A-106D.

The wireless device 202 can include a processor 204 which controls operation of the wireless device 202. The processor 204 can also be referred to as a central processing unit (CPU). Memory 206, which can include both read-only memory (ROM) and random access memory (RAM), provides instructions and data to the processor 204. A portion of the memory 206 can also include non-volatile random access memory (NVRAM). The processor 204 typically performs logical and arithmetic operations based on program instructions stored within the memory 206. The instructions in the memory 206 can be executable to implement the methods described herein.

The processor 204 can comprise or be a component of a processing system implemented with one or more processors. The one or more processors can be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system can also include machine-readable media for storing software. Software shall be construed broadly to mean any type of instructions, whether referred to as software, firmware, middleware, microcode, hardware description language, or otherwise. Instructions can include code (e.g., in source code format, binary code format, executable code format, or any other suitable format of code). The instructions, when executed by the one or more processors, cause the processing system to perform the various functions described herein.

The wireless device 202 can also include a housing 208 that can include a transmitter 210 and a receiver 212 to allow transmission and reception of data between the wireless device 202 and a remote location. The transmitter 210 and receiver 212 can be combined into a transceiver 214. An antenna 216 can be attached to the housing 208 and electrically coupled to the transceiver 214. The wireless device 202 can also include (not shown) multiple transmitters, multiple receivers, multiple transceivers, and/or multiple antennas, which can be utilized during MIMO communications, for example.

The wireless device 202 can also include a signal detector 218 that can be used in an effort to detect and quantify the level of signals received by the transceiver 214. The signal detector 218 can detect such signals as total energy, energy per subcarrier per symbol, power spectral density and other signals. The wireless device 202 can also include a digital signal processor (DSP) 220 for use in processing signals. The DSP 220 can be configured to generate a data unit for transmission. In some aspects, the data unit can comprise a physical layer data unit (PPDU). In some aspects, the PPDU is referred to as a packet.

The wireless device 202 can further comprise a user interface 222 in some aspects. The user interface 222 can comprise a keypad, a microphone, a speaker, and/or a display. The user interface 222 can include any element or component that conveys information to a user of the wireless device 202 and/or receives input from the user.

The various components of the wireless device 202 can be coupled together by a bus system 226. The bus system 226 can include a data bus, for example, as well as a power bus, a control signal bus, and a status signal bus in addition to the data bus. Those of skill in the art will appreciate the components of the wireless device 202 can be coupled together or accept or provide inputs to each other using some other mechanism.

Although a number of separate components are illustrated in FIG. 2, those of skill in the art will recognize that one or more of the components can be combined or commonly implemented. For example, the processor 204 can be used to implement not only the functionality described above with respect to the processor 204, but also to implement the functionality described above with respect to the signal detector 218 and/or the DSP 220. Further, each of the components illustrated in FIG. 2 can be implemented using a plurality of separate elements.

As discussed above, the wireless device 202 can comprise an AP 104 or an STA 106, and can be used to transmit and/or receive communications. The communications exchanged between devices in a wireless network can include data units which can comprise packets or frames. In some aspects, the data units can include data frames, control frames, and/or management frames. Data frames can be used for transmitting data from an AP and/or a STA to other APs and/or STAs. Control frames can be used together with data frames for performing various operations and for reliably delivering data (e.g., acknowledging receipt of data, polling of APs, area-clearing operations, channel acquisition, carrier-sensing maintenance functions, etc.). Management frames can be used for various supervisory functions (e.g., for joining and departing from wireless networks, etc.).

Certain aspects of the present disclosure support allowing APs 104 to allocate STAs 106A-106D transmissions in optimized ways to improve efficiency. Both high efficiency wireless (HEW) stations, stations utilizing an 802.11 high efficiency protocol (such as 802.11ax), and stations using older or legacy 802.11 protocols (such as 802.11b), can compete or coordinate with each other in accessing a wireless medium. In some embodiments, the high-efficiency 802.11 protocol described herein can allow for HEW and legacy stations to interoperate according to various OFDMA tone plans (which can also be referred to as tone maps). In some embodiments, HEW stations can access the wireless medium in a more efficient manner, such as by using multiple access techniques in OFDMA. Accordingly, in the case of apartment buildings or densely-populated public spaces, APs and/or STAs that use the high-efficiency 802.11 protocol can experience reduced latency and increased network throughput even as the number of active wireless devices increases, thereby improving user experience.

In some embodiments, APs 104 can transmit on a wireless medium according to various DL tone plans for HEW STAs. For example, with respect to FIG. 1, the STAs 106A-106D can be HEW STAs. In some embodiments, the HEW STAs can communicate using a symbol duration four times that of a legacy STA. Accordingly, each symbol which is transmitted may be four times as long in duration. When using a longer symbol duration, each of the individual tones may only require one-quarter as much bandwidth to be transmitted. For example, in various embodiments, a 1× symbol duration can be 4 ms and a 4× symbol duration can be 16 ms. The AP 104 can transmit messages to the HEW STAs 106A-106D according to one or more tone plans, based on a communication bandwidth. In some aspects, the AP 104 may be configured to transmit to multiple HEW STAs simultaneously, using OFDMA.

Efficient Tone Plan Design

Figure 3:
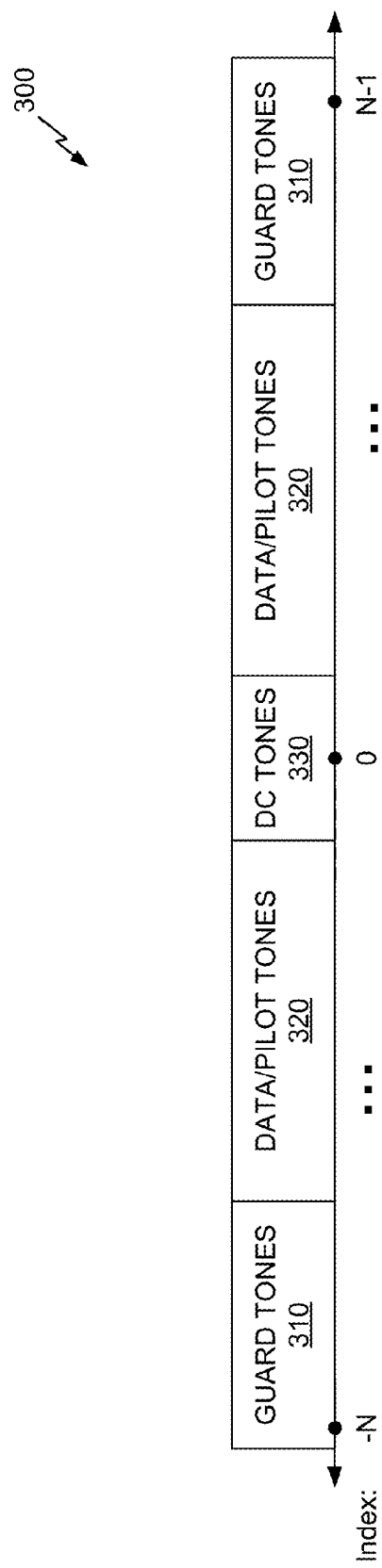
FIG. 3 shows an exemplary 2N-tone plan, according to one embodiment.

FIG. 3 shows an exemplary 2N-tone plan 300, according to one embodiment. In an embodiment, the tone plan 300 corresponds to OFDM tones, in the frequency domain, generated using a 2N-point FFT. The tone plan 300 includes 2N OFDM tones indexed N to N−1. The tone plan 300 includes two sets of guard tones 310, two sets of data/pilot tones 320, and a set of direct current (DC) tones 330. In various embodiments, the guard tones 310 and DC tones 330 can be null. In various embodiments, the tone plan 300 includes another suitable number of pilot tones and/or includes pilot tones at other suitable tone locations.

Although a 2N-tone plan 300 is shown in FIG. 3, similar tone plans can be used for any value of N (such as 32-, 48-, 64-, 96-, 128-, 192-, 256-, 320-, 384-, 448-, 512-, 768-, 1024, 1280-, 1536-, 1792-, and 2048-tone plans, among others). In various embodiments, each tone plan can correspond to a communication bandwidth such as, for example, 5 MHz, 10 MHz, 20 MHz, 40 MHz, 80 MHz, and 160 MHz.

In some aspects, OFDMA tone plans may be provided for transmission which use 4× symbol duration, as compared to various IEEE 802.11 protocols. For example, 4× symbol duration may use a number of symbols which are each 16 ms in duration. In some aspects, OFDMA tone plans may use a minimum OFDMA allocation of 12 data tones. For example, each device which is transmitting an UL OFDMA transmission or receiving a DL OFDMA transmission may be allotted at least 12 data tones. Accordingly, both UL and DL OFDMA allocation sizes may be 12 tones as well as existing sizes (23, 53, 108, and 234 tones) as described in the IEEE 802.11ah standard. Further, the number of OFDMA allocations may be capped, such as at 8 or 16 allocations per transmission. Each user may receive or transmit on a maximum of two of these allocations. This cap may limit signaling overhead. Further, designing a more flexible OFDMA with sizes equivalent to multiples of 12 tones (e.g., 12, 36, or 72 data tones per sub-band) may be considered.

In some aspects, OFDMA sub-bands may come in a number of different sizes. For example, an OFDMA sub-band may have a bandwidth of 5, 10, 15, 20, 30, 40, 60, 80, 100, 120, or 140 MHz. Each of these different sub-bands may have a different tone plan. Tone plans may also be designed with a number of other considerations. For example, a 2048-tone plan for 160 MHz may be constructed using two duplicated 1024-tone plans, which each use 80 MHz of bandwidth.

In some aspects, it may be desirable to specify tone plans which are suitable based on a certain level of error in transmitting. For example, certain implementations of WiFi may use a transmit center frequency error of +/−20 parts per million (ppm), or 40 ppm total (adding together the tolerable range). In a 5 MHz transmission with 4× symbol duration from a single user, this 40 ppm error requirement may necessitate the use of 7 DC tones. If multiple devices transmit simultaneously, the requirement may be up to 80 ppm, as the errors of each device may be additive with each other. Accordingly, in an 80 ppm (+/−40 ppm) scenario, 11 DC tones may be needed. If frequency pre-correction and/or finer ppm requirements are used, such as 10 ppm, 3 or 5 DC tones may be used for 4× symbol duration transmissions. Thus, the number of DC tones which are used may be based, at least in part, on the level of carrier frequency offset which is allowed in transmission.

In some aspects, packing efficiencies may be different in different cases for OFDMA transmissions. For example, an OFMDA allocation bandwidth (in number of FFT tones) may vary based on different total bandwidths (in FFT size). For example, a 5 MHz portion of bandwidth may be able to carry a different number of data tones if that 5 MHz portion is being transmitted by a single user, or if it is being transmitted in a part of an OFDMA transmission with different total bandwidths.

A number of pilot or guard tones may also vary depending on the type of transmission. For example, a DL transmission may use common pilot tones if transmission beamforming is not used, as each device receiving the DL transmission may use the same pilot tones from the transmitting device. However, an UL transmission which is being transmitted by a number of devices may need dedicated pilot tones for each transmitting device. Further, UL transmissions may prefer having a number of guard tones between different OFDMA users, as the transmissions from different devices may not be completely orthogonal to each other. In a DL transmission, this may not be a problem, and these additional guard tones may not be needed. Further, a DL transmission may follow a wideband mask, while an UL transmission should obey a sub-band mask for each STA. Accordingly, the number of guard tones needed may vary between UL and DL transmissions.

Further, in order to be useful, tone plans may also need to satisfy certain BCC (binary convolutional code) interleaving, LDPC (low-density parity check) tone mapping distance designs as well as be valid for a number of different possible modulation and coding schemes (MCS). Generally, in choosing a tone plan, it may be beneficial to first obtain the upper bound of the number of data tones (Ndata) with the minimum number of DC, guard, and pilot tones for each of the desired bandwidths. Next, it may be beneficial to obtain the upper bound of the number of data tones, Ndata, for each sub-band bandwidth when is it an OFDMA allocation, or when it is the entire bandwidth for a single user (SU).

Next, it may be useful to determine the feasible number of data tones (Ndata) subject to the upper bounds and to certain other criteria. First, the divisors of Ndata may be used for BCC interleaving depth $N_{COL}$. Next, divisors of Ndata may also be used as LDPC tone mapping distance $D_{TM}$ that are in between the ones for existing tone plans. Finally, it may be beneficial is the number of excluded combinations of MCS and number of data streams is kept relatively small. Generally, if there are left-over tones after this tone mapping, they may be used as extra DC, guard, or pilot tones. For example, leftover tones may be used as DC tones to satisfy carrier frequency offset (CFO) requirements, extra guard tones to meet DL/UL spectral mask requirements and to minimize interference between different STAs in an UL transmission, and leftover tones may be used as additional pilot tones to ensure enough pilot tones are provided for each OFDMA user. Because of these various uses of leftover tones, it may be desirable to have a number of leftover tones. Generally, each of the proposed tone plans herein may be used for either UL or DL OFDMA transmissions, subject to their number of pilot tones requirements.

FIG. 4 shows upper bounds for 64-, 128-, 256-, 512-, and 1024-tone plans according to various embodiments when there is a single user. In particular, FIG. 4 shows upper bounds to the number of data tones (Ndata) for 64-, 128-, 256-, 512-, and 1024-tone plans in embodiments having 1, 3, 5, 7, or 11 DC tones, according to the bandwidth used. These upper bounds also use the minimum number of guard tones and pilot tones possible. For example, if the FFT size is 64, and there is one DC tone, 7 guard tones, and 4 pilot tones, this leaves 52 other tones which may be used as data tones.

FIG. 5A shows upper bounds for 64-tone, 5 MHz tone plans according to various embodiments. For example, with a single user, if 1 DC tones is used, there may be 52 data tones. If 3 DC tones are used, there may be 50 data tones for a single user. If 5 DC tones are used, there may be 48 data tones for a single user. If 7 DC tones are used, there may be 46 data tones for a single user. In an OFDMA transmission with a different total bandwidth, the number of data tones which may use may be different. In a 20 MHz OFDMA transmission, the number of data tones in a 5 MHz portion when there are 3 DC tones may be Floor(234/4)=58. In this calculation, 234 is the upper bound of Ndata in a 20 MHz transmission with 3 DC tones, as shown in FIG. 4. Accordingly, each of the four 5 MHz portions of the 20 MHz transmission may have up to one-quarter, rounded down, data tones. In a 20 MHz OFDMA transmission, the number of data tones in a 5 MHz portion when there are 5 DC tones may be Floor(232/4)=58. In a 20 MHz OFDMA transmission, the number of data tones in a 5 MHz portion when there are 7 DC tones may be Floor(230/4)=57.

In a 40 MHz OFDMA transmission, the number of data tones in a 5 MHz portion when there are 3 DC tones may be Floor(486/8)=60. In a 40 MHz OFDMA transmission, the number of data tones in a 5 MHz portion when there are 5 DC tones may be Floor(484/8)=60. In a 40 MHz OFDMA transmission, the number of data tones in a 5 MHz portion when there are 7 DC tones may be Floor(482/8)=60. In a 40 MHz OFDMA transmission, the number of data tones in a 5 MHz portion when there are 11 DC tones may be Floor (478/8)=59.

In a 80 or 160 MHz OFDMA transmission, the number of data tones in a 5 MHz portion when there are 3 DC tones may be Floor(998/16)=62. In a 80 or 160 MHz OFDMA transmission, the number of data tones in a 5 MHz portion when there are 5 DC tones may be Floor(996/16)=62. In a 80 or 160 MHz OFDMA transmission, the number of data tones in a 5 MHz portion when there are 7 DC tones may be Floor(994/16)=62. In a 80 or 160 MHz OFDMA transmission, the number of data tones in a 5 MHz portion when there are 11 DC tones may be Floor(990/16)=61. Accordingly, the unified upper bound for a 64-tone transmission may be 62 data tones. This is the highest number of data tones possible, in any of the listed configurations.

FIG. 5B shows gain from any of the feasible 5 MHz tone plans over other possible tone plans, including some existing tone plans. For example, using 50 data tones may represent a 4.17% gain over 48 data tones, but a 3.85% loss over 52 data tones. Using 54 data tones may represent a 12.5% gain over 48 data tones and a 3.85% gain over 52 data tones. Using 56 data tones may represent a 16.67% gain over 48 data tones and a 7.69% gain over 52 data tones. Using 58 data tones may represent a 20.83% gain over 48 data tones and a 11.54% gain over 52 data tones. Using 60 data tones may represent a 25% gain over 48 data tones and a 15.38% gain over 52 data tones. Using 62 data tones may represent a 29.17% gain over 48 data tones and a 19.23% gain over 52 data tones.

FIG. 6A shows upper bounds for 128-tone, 10 MHz tone plans according to various embodiments. For example, with a single user, if 3 DC tones are used, there may be 108 data tones. If 5 DC tones are used, there may be 106 data tones for a single user. If 7 DC tones are used, there may be 104 data tones for a single user. In an OFDMA transmission with a different total bandwidth, the number of data tones which may use may be different. In a 20 MHz OFDMA transmission, the number of data tones in a 10 MHz portion when there are 3 DC tones may be Floor(234/2)=117. In a 20 MHz OFDMA transmission, the number of data tones in a 10 MHz portion when there are 5 DC tones may be Floor(232/2)=116. In a 20 MHz OFDMA transmission, the number of data tones in a 10 MHz portion when there are 7 DC tones may be Floor(230/2)=115.

In a 40 MHz OFDMA transmission, the number of data tones in a 10 MHz portion when there are 3 DC tones may be Floor(486/4)=121. In a 40 MHz OFDMA transmission, the number of data tones in a 10 MHz portion when there are 5 DC tones may be Floor(484/4)=121. In a 40 MHz OFDMA transmission, the number of data tones in a 10 MHz portion when there are 7 DC tones may be Floor(482/4)=120. In a 40 MHz OFDMA transmission, the number of data tones in a 10 MHz portion when there are 11 DC tones may be Floor(478/4)=119.

In a 80 or 160 MHz OFDMA transmission, the number of data tones in a 10 MHz portion when there are 3 DC tones may be Floor(998/8)=124. In a 80 or 160 MHz OFDMA transmission, the number of data tones in a 10 MHz portion when there are 5 DC tones may be Floor(996/8)=124. In a 80 or 160 MHz OFDMA transmission, the number of data tones in a 10 MHz portion when there are 7 DC tones may be Floor(994/8)=124. In a 80 or 160 MHz OFDMA transmission, the number of data tones in a 10 MHz portion when there are 11 DC tones may be Floor(990/8)=123. Accordingly, the unified upper bound for a 128-tone transmission may be 124 data tones. This is the highest number of data tones possible, in any of the listed configurations.

FIG. 6B shows gain from any of the feasible 10 MHz tone plans over other possible tone plans, including some existing tone plans. For example, using 110 data tones may represent a 1.85% gain over 108 data tones. Using 112 data tones may represent a 3.70% gain over 108 data tones. Using 114 data tones may represent a 5.56% gain over 108 data tones. Using 116 data tones may represent a 7.41% gain over 108 data tones. Using 118 data tones may represent a 9.26% gain over 108 data tones. Using 120 data tones may represent a 11.11% gain over 108 data tones. Using 122 data tones may represent a 12.96% gain over 108 data tones. Using 124 data tones may represent a 14.81% gain over 108 data tones.

FIG. 7A shows upper bounds for 192-tone, 15 MHz tone plans according to various embodiments. Generally, 15 MHz may not be used by a single user. In an OFDMA transmission with a different total bandwidth, the number of data tones which may use may be different. In a 20 MHz OFDMA transmission, the number of data tones in a 15 MHz portion when there are 3 DC tones may be Floor(234*3/4)=175. In a 20 MHz OFDMA transmission, the number of data tones in a 15 MHz portion when there are 5 DC tones may be Floor(232*3/4)=174. In a 20 MHz OFDMA transmission, the number of data tones in a 15 MHz portion when there are 7 DC tones may be Floor(230*3/4)=172.

In a 40 MHz OFDMA transmission, the number of data tones in a 15 MHz portion when there are 3 DC tones may be Floor(486*3/8)=182. In a 40 MHz OFDMA transmission, the number of data tones in a 15 MHz portion when there are 5 DC tones may be Floor(484*3/8)=181. In a 40 MHz OFDMA transmission, the number of data tones in a 15 MHz portion when there are 7 DC tones may be Floor(482*3/8)=180. In a 40 MHz OFDMA transmission, the number of data tones in a 15 MHz portion when there are 11 DC tones may be Floor(478*3/8)=179.

In a 80 or 160 MHz OFDMA transmission, the number of data tones in a 15 MHz portion when there are 3 DC tones may be Floor(998*3/16)=187. In a 80 or 160 MHz OFDMA transmission, the number of data tones in a 15 MHz portion when there are 5 DC tones may be Floor(996*3/16)=186. In a 80 or 160 MHz OFDMA transmission, the number of data tones in a 15 MHz portion when there are 7 DC tones may be Floor(994*3/16)=186. In a 80 or 160 MHz OFDMA transmission, the number of data tones in a 15 MHz portion when there are 11 DC tones may be Floor(990*3/16)=185. Accordingly, the unified upper bound for a 192-tone transmission may be 187 data tones. This is the highest number of data tones possible, in any of the listed configurations.

FIG. 7B shows gain from any of the feasible 15 MHz tone plans over other possible tone plans, including some existing tone plans. For example, using 168 data tones may represent a 10.16% loss compared to 187 data tones. Using 170 data tones may represent a 9.09% loss compared to 187 data tones. Using 172 data tones may represent a 8.02% loss compared to 187 data tones. Using 174 data tones may represent a 6.95% loss compared to 187 data tones. Using 176 data tones may represent a 5.88% loss compared to 187 data tones. Using 178 data tones may represent a 4.81% loss compared to 187 data tones. Using 180 data tones may represent a 3.74% loss compared to 187 data tones. Using 182 data tones may represent a 2.67% loss compared to 187 data tones. Using 184 data tones may represent a 1.60% loss compared to 187 data tones. Using 186 data tones may represent a 0.53% loss compared to 187 data tones.

FIG. 8A shows upper bounds for 256-tone, 20 MHz tone plans according to various embodiments. For example, with a single user, if 3 DC tones are used, there may be 234 data tones. If 5 DC tones are used, there may be 232 data tones for a single user. If 7 DC tones are used, there may be 230 data tones for a single user. In an OFDMA transmission with a different total bandwidth, the number of data tones which may use may be different. In a 20 MHz OFDMA transmission, the number of data tones in a 20 MHz portion (that is, the entire transmission) when there are 3 DC tones may be 234. In a 20 MHz OFDMA transmission, the number of data tones in a 20 MHz portion when there are 5 DC tones may be 232. In a 20 MHz OFDMA transmission, the number of data tones in a 20 MHz portion when there are 7 DC tones may be 230.

In a 40 MHz OFDMA transmission, the number of data tones in a 20 MHz portion when there are 3 DC tones may be Floor(486/2)=243. In a 40 MHz OFDMA transmission, the number of data tones in a 20 MHz portion when there are 5 DC tones may be Floor(484/2)=242. In a 40 MHz OFDMA transmission, the number of data tones in a 20 MHz portion when there are 7 DC tones may be Floor(482/2)=241. In a 40 MHz OFDMA transmission, the number of data tones in a 20 MHz portion when there are 11 DC tones may be Floor(478/2)=239.

In a 80 or 160 MHz OFDMA transmission, the number of data tones in a 20 MHz portion when there are 3 DC tones may be Floor(998/4)=249. In a 80 or 160 MHz OFDMA transmission, the number of data tones in a 20 MHz portion when there are 5 DC tones may be Floor(996/4)=249. In a 80 or 160 MHz OFDMA transmission, the number of data tones in a 20 MHz portion when there are 7 DC tones may be Floor(994/4)=248. In a 80 or 160 MHz OFDMA transmission, the number of data tones in a 20 MHz portion when there are 11 DC tones may be Floor(990/4)=247. Accordingly, the unified upper bound for a 256-tone transmission may be 249 data tones. This is the highest number of data tones possible, in any of the listed configurations.

FIG. 8B shows gain from any of the feasible 20 MHz tone plans over other possible tone plans, including some existing tone plans. For example, using 236 data tones may represent a 0.85% gain over 234 data tones. Using 238 data tones may represent a 1.71% gain over 234 data tones. Using 240 data tones may represent a 2.56% gain over 234 data tones. Using 242 data tones may represent a 3.42% gain over 234 data tones. Using 244 data tones may represent a 4.27% gain over 234 data tones. Using 246 data tones may represent a 5.13% gain over 234 data tones. Using 248 data tones may represent a 5.98% gain over 234 data tones.

FIG. 9A shows upper bounds for 384-tone, 30 MHz tone plans according to various embodiments. In a 40 MHz OFDMA transmission, the number of data tones in a 30 MHz portion when there are 3 DC tones may be Floor(486*3/4)=364. In a 40 MHz OFDMA transmission, the number of data tones in a 30 MHz portion when there are 5 DC tones may be Floor(484*3/4)=363. In a 40 MHz OFDMA transmission, the number of data tones in a 30 MHz portion when there are 7 DC tones may be Floor(482*3/4)=361. In a 40 MHz OFDMA transmission, the number of data tones in a 30 MHz portion when there are 11 DC tones may be Floor(478*3/4)=358.

In a 80 or 160 MHz OFDMA transmission, the number of data tones in a 30 MHz portion when there are 3 DC tones may be Floor(998*3/8)=374. In a 80 or 160 MHz OFDMA transmission, the number of data tones in a 30 MHz portion when there are 5 DC tones may be Floor(996*3/8)=373. In a 80 or 160 MHz OFDMA transmission, the number of data tones in a 30 MHz portion when there are 7 DC tones may be Floor(994*3/8)=372. In a 80 or 160 MHz OFDMA transmission, the number of data tones in a 30 MHz portion when there are 11 DC tones may be Floor(990*3/8)=371. Accordingly, the unified upper bound for a 384-tone transmission may be 374 data tones. This is the highest number of data tones possible, in any of the listed configurations.

FIG. 9B shows gain from any of the feasible 30 MHz tone plans over other possible tone plans, including some existing tone plans. For example, using 350 data tones may represent a 6.42% loss compared to using 374 data tones. Using 352 data tones may represent a 5.88% loss compared to using 374 data tones. Using 354 data tones may represent a 5.35% loss compared to using 374 data tones. Using 356 data tones may represent a 4.81% loss compared to using 374 data tones. Using 357 data tones may represent a 4.55% loss compared to using 374 data tones. Using 358 data tones may represent a 4.28% loss compared to using 374 data tones. Using 360 data tones may represent a 3.74% loss compared to using 374 data tones. Using 364 data tones may represent a 2.67% loss compared to using 374 data tones. Using 366 data tones may represent a 2.14% loss compared to using 374 data tones. Using 368 data tones may represent a 1.60% loss compared to using 374 data tones. Using 370 data tones may represent a 1.07% loss compared to using 374 data tones. Using 372 data tones may represent a 0.53% loss compared to using 374 data tones.

FIG. 10A shows upper bounds for 512-tone, 40 MHz tone plans according to various embodiments. For example, with a single user, if 3 DC tones is used, there may be 486 data tones. If 5 DC tones are used, there may be 484 data tones for a single user. If 7 DC tones are used, there may be 482 data tones for a single user. If 11 DC tones are used, there may be 478 data tones for a single user. Similarly, in an OFDMA transmission with 40 MHz total bandwidth, the same number of data tones may be used.

In a 80 or 160 MHz OFDMA transmission, the number of data tones in a 40 MHz portion when there are 3 DC tones may be Floor(998/2)=499. In a 80 or 160 MHz OFDMA transmission, the number of data tones in a 40 MHz portion when there are 5 DC tones may be Floor(996/2)=498. In a 80 or 160 MHz OFDMA transmission, the number of data tones in a 40 MHz portion when there are 7 DC tones may be Floor(994/2)=497. In a 80 or 160 MHz OFDMA transmission, the number of data tones in a 40 MHz portion when there are 11 DC tones may be Floor(990/2)=495. Accordingly, the unified upper bound for a 512-tone transmission may be 499 data tones. This is the highest number of data tones possible, in any of the listed configurations.

FIG. 10B shows gain from any of the feasible 40 MHz tone plans over other possible tone plans, including some existing tone plans. For example, using 470 data tones may represent a 0.43% gain over 468 data tones. Using 472 data tones may represent a 0.85% gain over 468 data tones. Using 474 data tones may represent a 1.28% gain over 468 data tones. Using 476 data tones may represent a 1.71% gain over 468 data tones. Using 478 data tones may represent a 2.14% gain over 468 data tones. Using 480 data tones may represent a 2.56% gain over 468 data tones. Using 484 data tones may represent a 3.42% gain over 468 data tones. Using 486 data tones may represent a 3.85% gain over 468 data tones. Using 488 data tones may represent a 4.27% gain over 468 data tones. Using 490 data tones may represent a 4.70% gain over 468 data tones. Using 492 data tones may represent a 5.13% gain over 468 data tones. Using 496 data tones may represent a 5.98% gain over 468 data tones. Using 498 data tones may represent a 6.41% gain over 468 data tones.

FIG. 11A shows upper bounds for 768-tone, 60 MHz tone plans according to various embodiments. In a 80 or 160 MHz OFDMA transmission, the number of data tones in a 60 MHz portion when there are 3 DC tones may be Floor(998*3/4)=748. In a 80 or 160 MHz OFDMA transmission, the number of data tones in a 60 MHz portion when there are 5 DC tones may be Floor(996*3/4)=747. In a 80 or 160 MHz OFDMA transmission, the number of data tones in a 60 MHz portion when there are 7 DC tones may be Floor(994*3/4)=745. In a 80 or 160 MHz OFDMA transmission, the number of data tones in a 60 MHz portion when there are 11 DC tones may be Floor(990*3/4)=742. Accordingly, the unified upper bound for a 768-tone transmission may be 748 data tones. This is the highest number of data tones possible, in any of the listed configurations.

FIG. 11B shows gain from any of the feasible 60 MHz tone plans over other possible tone plans, including some existing tone plans. For example, using 732 data tones may represent a 2.14% loss compared to using 478 data tones. Using 738 data tones may represent a 1.34% loss compared to using 478 data tones. Using 740 data tones may represent a 1.07% loss compared to using 478 data tones. Using 744 data tones may represent a 0.53% loss compared to using 478 data tones.

FIG. 12A shows upper bounds for 1024-tone, 80 MHz tone plans according to various embodiments. For example, with a single user, if 3 DC tones are used, there may be 998 data tones. If 5 DC tones are used, there may be 996 data tones for a single user. If 7 DC tones are used, there may be 994 data tones for a single user. If 11 DC tones are used, there may be 990 data tones for a single user. Similarly, in an 80 or 160 MHz OFDMA transmission, the same upper bounds may apply. Accordingly, the unified upper bound for a 1024-tone transmission may be 998 data tones. This is the highest number of data tones possible, in any of the listed configurations.

FIG. 12B shows gain from any of the feasible 80 MHz tone plans over other possible tone plans, including some existing tone plans. For example, using 948 data tones may represent a 1.28% gain over 936 data tones. Using 960 data tones may represent a 2.56% gain over 936 data tones. Using 972 data tones may represent a 4.06% gain over 936 data tones. Using 980 data tones may represent a 4.70% gain over 936 data tones. Using 984 data tones may represent a 5.13% gain over 936 data tones. Using 990 data tones may represent a 5.77% gain over 936 data tones. Using 996 data tones may represent a 6.41% gain over 936 data tones.

FIG. 13A shows upper bounds for 1280-tone, 100 MHz tone plans according to various embodiments. In a 160 MHz OFDMA transmission, the number of data tones in a 100 MHz portion when there are 3 DC tones may be Floor (998*5/4)=1247. In a 160 MHz OFDMA transmission, the number of data tones in a 100 MHz portion when there are 5 DC tones may be Floor(996*5/4)=1245. In a 160 MHz OFDMA transmission, the number of data tones in a 100 MHz portion when there are 7 DC tones may be Floor (994*5/4)=1242. In a 160 MHz OFDMA transmission, the number of data tones in a 100 MHz portion when there are 11 DC tones may be Floor(990*5/4)=1237. Accordingly, the unified upper bound for a 1280-tone transmission may be 1247 data tones. This is the highest number of data tones possible, in any of the listed configurations.

FIG. 13B shows gain from any of the feasible 100 MHz tone plans over other possible tone plans, including some existing tone plans. For example, using 1200 data tones may represent a 3.77% loss compared to using 1247 data tones. Using 1206 data tones may represent a 3.29% loss compared to using 1247 data tones.

FIG. 14A shows upper bounds for 1536-tone, 120 MHz tone plans according to various embodiments. In a 160 MHz OFDMA transmission, the number of data tones in a 120 MHz portion when there are 3 DC tones may be Floor (998*3/2)=1497. In a 160 MHz OFDMA transmission, the number of data tones in a 120 MHz portion when there are 5 DC tones may be Floor(996*3/2)=1494. In a 160 MHz OFDMA transmission, the number of data tones in a 120 MHz portion when there are 7 DC tones may be Floor (994*3/2)=1491. In a 160 MHz OFDMA transmission, the number of data tones in a 120 MHz portion when there are 11 DC tones may be Floor(990*3/2)=1485. Accordingly, the unified upper bound for a 1536-tone transmission may be 1497 data tones. This is the highest number of data tones possible, in any of the listed configurations.

FIG. 14B shows gain from any of the feasible 120 MHz tone plans over other possible tone plans, including some existing tone plans. For example, using 1420 data tones may represent a 5.14% loss compared to using 1497 data tones. Using 1422 data tones may represent a 5.01% loss compared to using 1497 data tones. Using 1424 data tones may represent a 4.88% loss compared to using 1497 data tones. Using 1426 data tones may represent a 4.74% loss compared to using 1497 data tones. Using 1428 data tones may represent a 4.61% loss compared to using 1497 data tones. Using 1430 data tones may represent a 4.48% loss compared to using 1497 data tones. Using 1432 data tones may represent a 4.34% loss compared to using 1497 data tones. Using 1434 data tones may represent a 4.21% loss compared to using 1497 data tones. Using 1436 data tones may represent a 4.07% loss compared to using 1497 data tones. Using 1438 data tones may represent a 3.94% loss compared to using 1497 data tones. Using 1440 data tones may represent a 3.81% loss compared to using 1497 data tones. Using 1452 data tones may represent a 3.01% loss compared to using 1497 data tones. Using 1464 data tones may represent a 2.20% loss compared to using 1497 data tones. Using 1470 data tones may represent a 1.80% loss compared to using 1497 data tones. Using 1485 data tones may represent a 0.80% loss compared to using 1497 data tones. Using 1488 data tones may represent a 0.60% loss compared to using 1497 data tones. Using 1491 data tones may represent a 0.40% loss compared to using 1497 data tones.

FIG. 15A shows upper bounds for 1792-tone, 140 MHz tone plans according to various embodiments. In a 160 MHz OFDMA transmission, the number of data tones in a 140 MHz portion when there are 3 DC tones may be Floor (998*7/4)=1746. In a 160 MHz OFDMA transmission, the number of data tones in a 140 MHz portion when there are 5 DC tones may be Floor(996*7/4)=1743. In a 160 MHz OFDMA transmission, the number of data tones in a 140 MHz portion when there are 7 DC tones may be Floor (994*7/4)=1739. In a 160 MHz OFDMA transmission, the number of data tones in a 140 MHz portion when there are 11 DC tones may be Floor(990*7/4)=1732. Accordingly, the unified upper bound for a 1792-tone transmission may be 1746 data tones. This is the highest number of data tones possible, in any of the listed configurations.

FIG. 15B shows gain from any of the feasible 140 MHz tone plans over other possible tone plans, including some existing tone plans. For example, using 1660 data tones may represent a 4.93% loss compared to using 1746 data tones. Using 1664 data tones may represent a 4.70% loss compared to using 1746 data tones. Using 1668 data tones may represent a 4.47% loss compared to using 1746 data tones. Using 1672 data tones may represent a 4.24% loss compared to using 1746 data tones. Using 1680 data tones may represent a 3.78% loss compared to using 1746 data tones. Using 1688 data tones may represent a 3.32% loss compared to using 1746 data tones. Using 1692 data tones may represent a 3.09% loss compared to using 1746 data tones. Using 1696 data tones may represent a 2.86% loss compared to using 1746 data tones. Using 1700 data tones may represent a 2.63% loss compared to using 1746 data tones. Using 1704 data tones may represent a 2.41% loss compared to using 1746 data tones. Using 1708 data tones may represent a 2.18% loss compared to using 1746 data tones. Using 1710 data tones may represent a 2.06% loss compared to using 1746 data tones. Using 1712 data tones may represent a 1.95% loss compared to using 1746 data tones. Using 1716 data tones may represent a 1.72% loss compared to using 1746 data tones. Using 1720 data tones may represent a 1.49% loss compared to using 1746 data tones. Using 1728 data tones may represent a 1.03% loss compared to using 1746 data tones. Using 1740 data tones may represent a 0.34% loss compared to using 1746 data tones. Using 1745 data tones may represent a 0.06% loss compared to using 1746 data tones.

Figure 16:
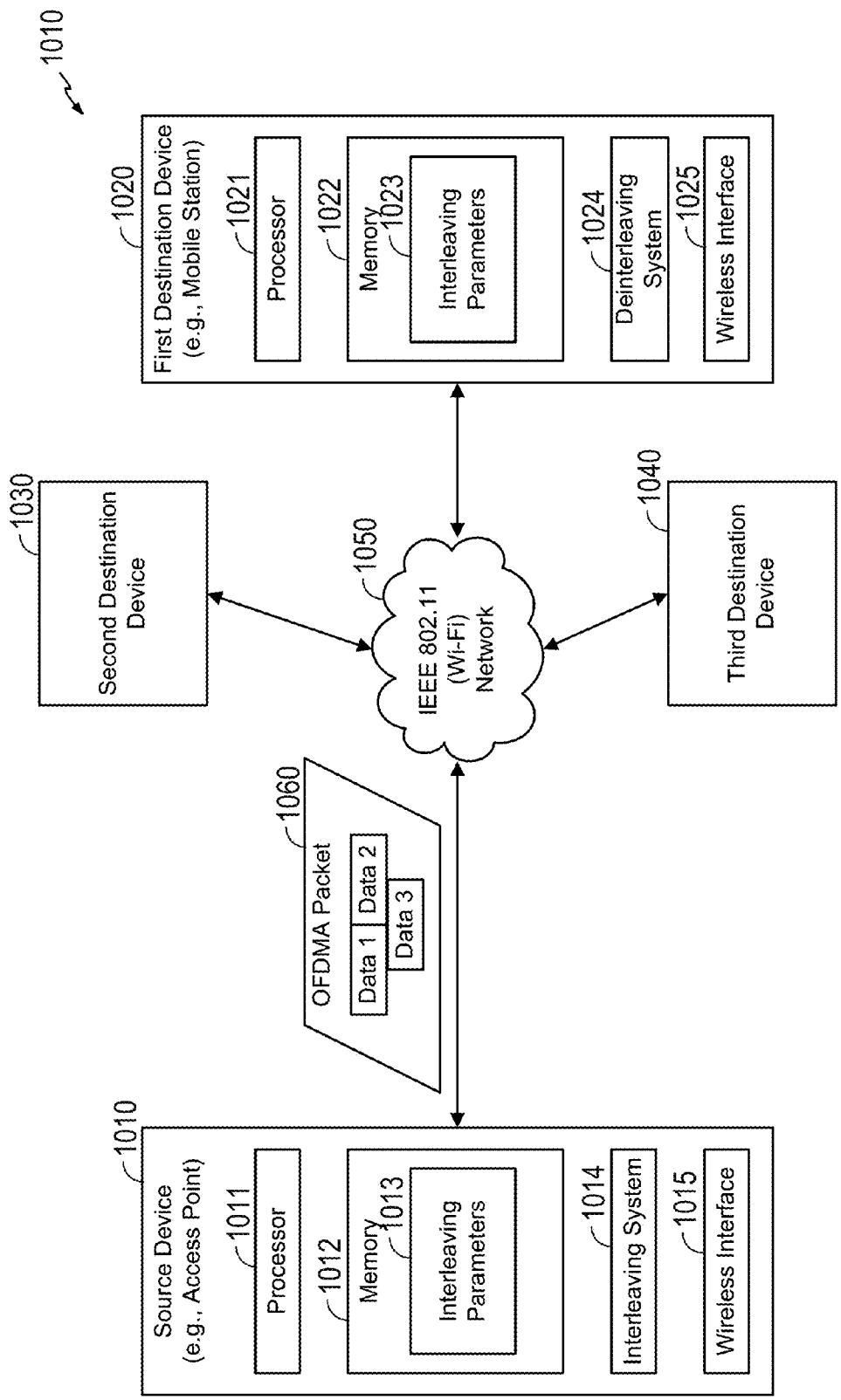
FIG. 16 shows a system that is operable to generate interleaving parameters for orthogonal frequency-division multiple access (OFDMA) tone plans, according to an embodiment.

FIG. 16 shows a system 1000 that is operable to generate interleaving parameters for orthogonal frequency-division multiple access (OFDMA) tone plans, according to an embodiment. The system 1000 includes a first device (e.g., a source device) 1010 configured to wirelessly communicate with a plurality of other devices (e.g., destination devices) 1020, 1030, and 1040 via a wireless network 1050. In alternate embodiments, a different number of source devices destination devices can be present in the system 1000. In various embodiments, the source device 1010 can include the AP 104 (FIG. 1) and the other devices 1020, 1030, and 1040 can include STAs 106A-106D (FIG. 1). The system 1000 can include the system 100 (FIG. 1). In various embodiments, any of the devices 1010, 1020, 1030, and 1040 can include the wireless device 202 (FIG. 2).

In a particular embodiment, the wireless network 1050 is an Institute of Electrical and Electronics Engineers (IEEE) 802.11 wireless network (e.g., a Wi-Fi network). For example, the wireless network 61050 can operate in accordance with an IEEE 802.11 standard. In a particular embodiment, the wireless network 1050 supports multiple access communication. For example, the wireless network 1050 can support communication of a single packet 1060 to each of the destination devices 1020, 1030, and 1040, where the single packet 1060 includes individual data portions directed to each of the destination devices. In one example, the packet 1060 can be an OFDMA packet, as further described herein.

The source device 1010 can be an access point (AP) or other device configured to generate and transmit multiple access packet(s) to multiple destination devices. In a particular embodiment, the source device 1010 includes a processor 1011 (e.g., a central processing unit (CPU), a digital signal processor (DSP), a network processing unit (NPU), etc.), a memory 1012 (e.g., a random access memory (RAM), a read-only memory (ROM), etc.), and a wireless interface 1015 configured to send and receive data via the wireless network 1050. The memory 1012 can store binary convolutional code (BCC) interleaving parameters 1013 used by an interleaving system 1014 to interleave data according to the techniques described with respect to an interleaving system 1014 of FIG. 17.

As used herein, a "tone" can represent a frequency or set of frequencies (e.g., a frequency range) within which data can be communicated. A tone can alternately be referred to as a subcarrier. A "tone" can thus be a frequency domain unit, and a packet can span multiple tones. In contrast to tones, a "symbol" can be a time domain unit, and a packet can span (e.g., include) multiple symbols, each symbol having a particular duration. A wireless packet can thus be visualized as a two-dimensional structure that spans a frequency range (e.g., tones) and a time period (e.g., symbols).

As an example, a wireless device can receive a packet via an 80 megahertz (MHz) wireless channel (e.g., a channel having 80 MHz bandwidth). The wireless device can perform a 512-point fast Fourier transform (FFT) to determine 512 tones in the packet. A subset of the tones can be considered "useable" and the remaining tones can be considered "unusable" (e.g., can be guard tones, direct current (DC) tones, etc.). To illustrate, 496 of the 512 tones can be useable, including 474 data tones and 22 pilot tones. As another example, there can be 476 data tones and 20 pilot tones. It should be noted that the aforementioned channel bandwidths, transforms, and tone plans are just examples. In alternate embodiments, different channel bandwidths (e.g., 5 MHz, 6 MHz, 6.5 MHz, 40 MHz, 80 MHz, etc.), different transforms (e.g., 256-point FFT, 1024-point FFT, etc.), and/or different tone plans can be used.

In a particular embodiment, a packet can include different block sizes (e.g., a different number of data tones per sub-band) that are transmitted over one or more spatial streams. For example, the packet can include 12 data tones per sub-band, 36 data tones per sub-band, 72 data tones per sub-band, 120 data tones per sub-band, 156 data tones per sub-band, or 312 data tones per sub-band. Interleaver depths, interleave rotation indexes, and base subcarrier rotations combinations can be provided for each block size.

In a particular embodiment, the interleaving parameters 1013 can be used by the interleaving system 1014 during generation of the multiple access packet 1060 to determine which data tones of the packet 1060 are assigned to individual destination devices. For example, the packet 1060 can include distinct sets of tones allocated to each individual destination device 1020, 1030, and 1040. To illustrate, the packet 1060 can utilize interleaved tone allocation.

The destination devices 1020, 1030, and 1040 can each include a processor (e.g., a processor 1021), a memory (e.g., a memory 1022), and a wireless interface (e.g., a wireless interface 1025). The destination devices 1020, 1030, and 1040 can also each include a deinterleaving system 1024 configured to deinterleave packets (e.g., single access packets or multiple access packets), as described with reference to a MIMO detector 1118 of FIG. 17. In one example, the memory 1022 can store interleaving parameters 1023 identical to the interleaving parameters 1013.

During operation, the source device 1010 can generate and transmit the packet 1060 to each of the destination devices 1020, 1030, and 1040 via the wireless network 1050. The packet 1060 can include distinct sets of data tones that are allocated to each individual destination device according to an interleaved pattern.

The system 1000 of FIG. 16 can thus provide OFDMA data tone interleaving parameters for use by source devices and destination devices to communicate over an IEEE 802.11 wireless network. For example, the interleaving parameters 1013, 1023 (or portions thereof) can be stored in a memory of the source and destination devices, as shown, can be standardized by a wireless standard (e.g., an IEEE 802.11 standard), etc. It should be noted that various data tone plans described herein can be applicable for both downlink (DL) as well as uplink (UL) OFDMA communication.

For example, the source device 1010 (e.g., an access point) can receive signal(s) via the wireless network 1050. The signal(s) can correspond to an uplink packet. In the packet, distinct sets of tones can be allocated to, and carry uplink data transmitted by, each of the destination devices (e.g., mobile stations) 1020, 1030, and 1040.

Figure 17:
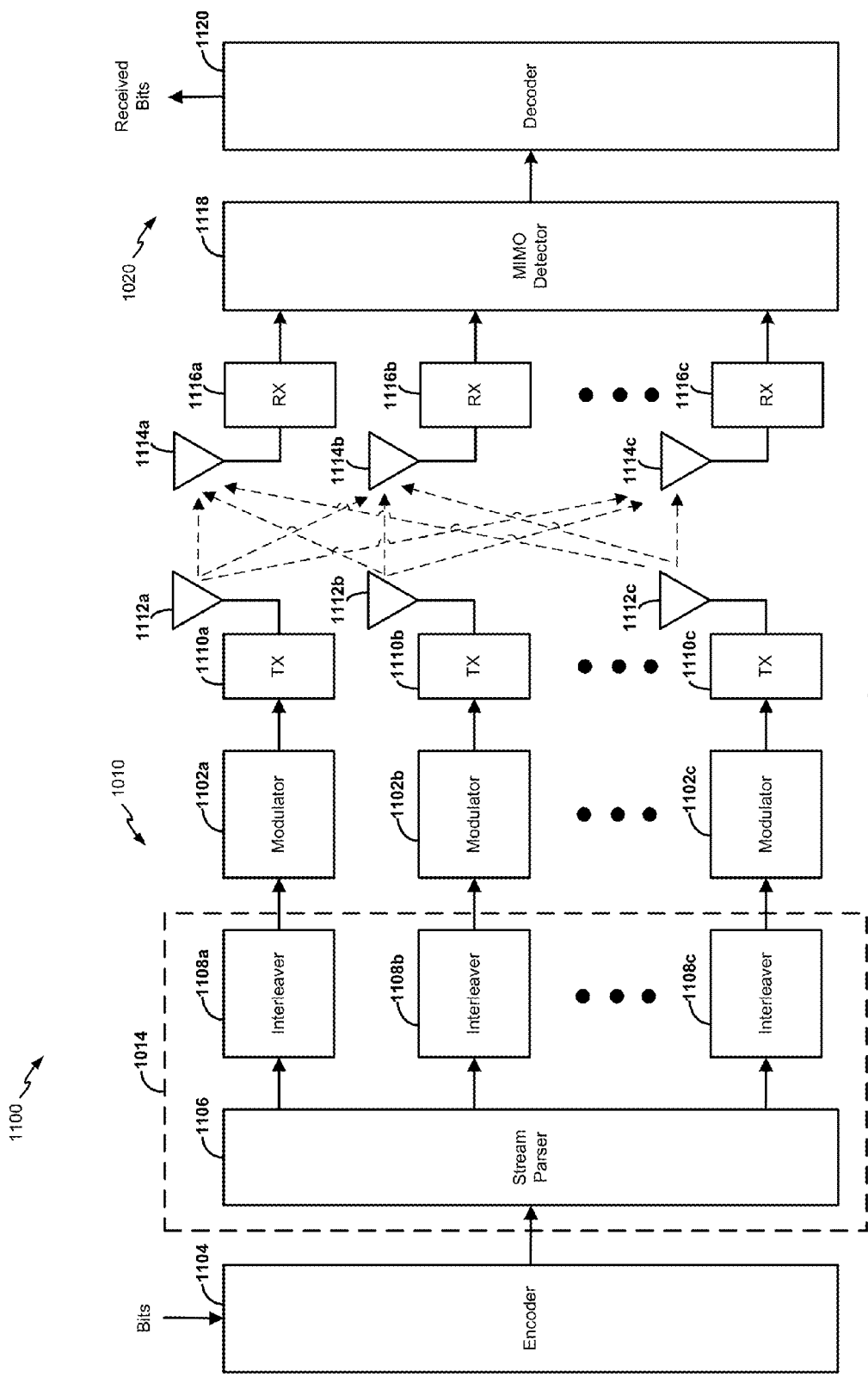
FIG. 17 shows an exemplary multiple-input-multiple-output (MIMO) system that can be implemented in wireless devices, such as the wireless device of FIG. 16, to transmit and receive wireless communications.

FIG. 17 shows an exemplary multiple-input-multiple-output (MIMO) system 1100 that can be implemented in wireless devices, such as the wireless device of FIG. 16, to transmit and receive wireless communications. The system 1100 includes the first device 1010 of FIG. 16 and the destination device 1020 of FIG. 16.

The first device 1010 includes an encoder 1104, the interleaving system 1014, a plurality of modulators 1102a-1102c, a plurality of transmission (TX) circuits 1110a-1110c, and a plurality of antennas 1112a-1112c. The destination device 1020 includes a plurality of antennas 1114a-1114c, a plurality of receive (RX) circuits 1116a-1116c, a MIMO detector 1118, and a decoder 1120.

A bit sequence can be provided to the encoder 1104. The encoder 1104 can be configured to encode the bit sequence. For example, the encoder 1104 can be configured to apply a forward error correcting (FEC) code to the bit sequence. The FEC code can be a block code, a convolutional code (e.g., a binary convolutional code), etc. The encoded bit sequence can be provided to the interleaving system 1014.

The interleaving system 1014 can include a stream parser 1106 and a plurality of spatial stream interleavers 1108a-1108c. The stream parser 1106 can be configured to parse the encoded bit stream from the encoder 1104 to the plurality of spatial stream interleavers 1108a-1108c.

Each interleaver 1108a-1108c can be configured to perform frequency interleaving. For example, the stream parser 1106 can output blocks of coded bits per symbol for each spatial stream. Each block can be interleaved by a corresponding interleaver 1108a-1108c that writes to rows and reads out columns. The number of columns (Ncol), or the interleaver depth, can be based on the number of data tones (Ndata). The number of rows (Nrow) can be a function of the number of columns (Ncol) and the number of data tones (Ndata). For example, the number of rows (Nrow) can be equal to the number of data tones (Ndata) divided by the number of columns (Ncol) (e.g., Nrow=Ndata/Ncol).

Note that the tone plan for each of the bandwidths (e.g., each of 5/10/15/20/30/40/60/80/100/120/140 MHz) may be chosen based on a number of different factors. For example, the upper bound may be determined based, at least in part, on whether a transmission is a single-user bandwidth or is part of an OFDMA bandwidth for a specific total bandwidth. The tone plan may also be chosen based on the needed number of DC tones, depending on the CFO requirement. The tone plan may also be chosen based on the needed number of guard tones in order to meet DL/UL spectral mask, and to minimize interference between transmissions of the different STAs in UL OFDMA. Further, the tone plan may also be chosen based on the number of pilot tones that are needed to ensure there are enough pilot tones for each of DL and UL OFDMA. Generally, the 160 MHz (2048FFT) tone plan may be a duplicate of two 80 MHz (1024FFT) tone plans. Because of these needs for sufficient numbers of DC, guard, and pilot tones, enough leftover tones (upper bounds minus Ndata) need to be spared. Accordingly, this may lead to the choice of Ndata.

FIG. 18 is a chart illustrating candidate interleaver parameters for different numbers of data tones, according to a 64-tone plan embodiment. In a particular embodiment, the interleaver depth (e.g., the number of columns (Ncol)) can be a factor of the number of data tones (Ndata). In various embodiments, a 50 data tone block can have an interleaver depth of 2, 5, 10, or 25. In various embodiments, a 54 data tone block can have an interleaver depth of 2, 3, 6, 9, 18, or 27. In various embodiments, a 56 data tone block can have an interleaver depth of 2, 4, 7, 8, 14, or 28. In various embodiments, a 58 data tone block can have an interleaver depth of 2 or 29. In various embodiments, a 60 data tone block can have an interleaver depth of 2, 3, 4, 5, 6, 10, 12, 15, 20, or 30. In various embodiments, a 50 data tone block can have an interleaver depth of 2 or 31.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 1-26. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 1-18. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 19 is a chart illustrating candidate interleaver parameters for different numbers of data tones, according to a 128-tone plan embodiment. In a particular embodiment, the interleaver depth (e.g., the number of columns (Ncol)) can be a factor of the number of data tones (Ndata). In various embodiments, a 110 data tone block can have an interleaver depth of 2, 5, 10, 11, 22, or 55. In various embodiments, a 112 data tone block can have an interleaver depth of 2, 4, 7, 8, 14, 16, 28, or 56. In various embodiments, a 114 data tone block can have an interleaver depth of 2, 3, 6, 19, 38, or 57. In various embodiments, a 116 data tone block can have an interleaver depth of 2, 4, 29, or 58. In various embodiments, a 118 data tone block can have an interleaver depth of 2 or 59. In various embodiments, a 120 data tone block can have an interleaver depth of 2, 3, 4, 5, 6, 8, 10, 12, 15, 20, 24, 30, 40, or 60. In various embodiments, a 122 data tone block can have an interleaver depth of 2 or 61. In various embodiments, a 124 data tone block can have an interleaver depth of 2, 4, 31, or 62.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 1-42. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 1-26. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 20 is a chart illustrating candidate interleaver parameters for different numbers of data tones, according to a 192-tone plan embodiment. In a particular embodiment, the interleaver depth (e.g., the number of columns (Ncol)) can be a factor of the number of data tones (Ndata). In various embodiments, a 168 data tone block can have an interleaver depth of 2, 3, 4, 6, 7, 8, 12, 14, 21, 24, 28, 42, 56, or 84. In various embodiments, a 170 data tone block can have an interleaver depth of 2, 5, 10, 17, 34, or 85. In various embodiments, a 172 data tone block can have an interleaver depth of 2, 4, 43, or 86. In various embodiments, a 174 data tone block can have an interleaver depth of 2, 3, 6, 29, 58, or 87. In various embodiments, a 176 data tone block can have an interleaver depth of 2, 4, 8, 11, 16, 22, 44, or 88. In various embodiments, a 178 data tone block can have an interleaver depth of 2 or 89. In various embodiments, a 180 data tone block can have an interleaver depth of 2, 3, 4, 5, 6, 9, 10, 12, 15, 18, 20, 30, 36, 45, 60, or 90. In various embodiments, a 182 data tone block can have an interleaver depth of 2, 7, 13, 14, 26, or 91. In various embodiments, a 184 data tone block can have an interleaver depth of 2, 4, 8, 23, 46, or 92. In various embodiments, a 186 data tone block can have an interleaver depth of 2, 3, 6, 31, 62, or 93.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 32-57. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 1-34. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 21 is a chart illustrating candidate interleaver parameters for different numbers of data tones, according to a 256-tone plan embodiment. In a particular embodiment, the interleaver depth (e.g., the number of columns (Ncol)) can be a factor of the number of data tones (Ndata). In various embodiments, a 236 data tone block can have an interleaver depth of 2, 4, 59, or 118. In various embodiments, a 238 data tone block can have an interleaver depth of 2, 7, 14, 17, 34, or 119. In various embodiments, a 240 data tone block can have an interleaver depth of 2, 3, 4, 5, 6, 8, 10, 12, 15, 16, 20, 24, 30, 40, 48, 60, 80, or 120. In various embodiments, a 242 data tone block can have an interleaver depth of 2, 11, 22, or 121. In various embodiments, a 244 data tone block can have an interleaver depth of 2, 4, 61, or 122. In various embodiments, a 246 data tone block can have an interleaver depth of 2, 3, 6, 41, 82, or 123. In various embodiments, a 248 data tone block can have an interleaver depth of 2, 4, 8, 31, 62, or 124.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 49-73. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 1-42. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 22 is a chart illustrating candidate interleaver parameters for different numbers of data tones, according to a 384-tone plan embodiment. In a particular embodiment, the interleaver depth (e.g., the number of columns (Ncol)) can be a factor of the number of data tones (Ndata). In various embodiments, a 350 data tone block can have an interleaver depth of 2, 5, 7, 10, 14, 25, 35, 50, 70, or 175. In various embodiments, a 352 data tone block can have an interleaver depth of 2, 4, 8, 11, 16, 22, 32, 44, 88, or 176. In various embodiments, a 354 data tone block can have an interleaver depth of 2, 3, 6, 59, 118, or 177. In various embodiments, a 356 data tone block can have an interleaver depth of 2, 4, 89, or 178. In various embodiments, a 357 data tone block can have an interleaver depth of 3, 7, 17, 21, 51, or 119. In various embodiments, a 358 data tone block can have an interleaver depth of 2 or 179. In various embodiments, a 360 data tone block can have an interleaver depth of 2, 3, 4, 5, 6, 8, 9, 10, 12, 15, 18, 20, 24, 30, 36, 40, 45, 60, 72, 90, 120, or 180. In various embodiments, a 364 data tone block can have an interleaver depth of 2, 4, 7, 13, 14, 26, 28, 52, 91, or 182. In various embodiments, a 366 data tone block can have an interleaver depth of 2, 3, 6, 61, 122, or 183. In various embodiments, a 368 data tone block can have an interleaver depth of 2, 4, 8, 16, 23, 46, 92, or 184. In various embodiments, a 370 data tone block can have an interleaver depth of 2, 5, 10, 37, 74, or 185. In various embodiments, a 372 data tone block can have an interleaver depth of 2, 3, 4, 6, 12, 31, 62, 93, 124, or 186.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 77-105. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 33-58. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 23 is a chart illustrating candidate interleaver parameters for different numbers of data tones, according to a 512-tone plan embodiment. In a particular embodiment, the interleaver depth (e.g., the number of columns (Ncol)) can be a factor of the number of data tones (Ndata). In various embodiments, a 470 data tone block can have an interleaver depth of 2, 5, 10, 47, 94, or 235. In various embodiments, a 472 data tone block can have an interleaver depth of 2, 4, 8, 59, 118, or 236. In various embodiments, a 474 data tone block can have an interleaver depth of 2, 3, 6, 79, 158, or 237. In various embodiments, a 476 data tone block can have an interleaver depth of 2, 4, 7, 14, 17, 28, 34, 68, 119, or 238. In various embodiments, a 478 data tone block can have an interleaver depth of 2 or 239. In various embodiments, a 480 data tone block can have an interleaver depth of 2, 3, 4, 5, 6, 8, 10, 12, 15, 16, 20, 24, 30, 32, 40, 48, 60, 80, 96, 120, 160, or 240. In various embodiments, a 484 data tone block can have an interleaver depth of 2, 4, 11, 22, 44, 121, or 242. In various embodiments, a 486 data tone block can have an interleaver depth of 2, 3, 6, 9, 18, 27, 54, 81, 162, or 243. In various embodiments, a 488 data tone block can have an interleaver depth of 2, 4, 8, 61, 122, or 244. In various embodiments, a 490 data tone block can have an interleaver depth of 2, 5, 7, 10, 14, 35, 49, 70, 98, or 245. In various embodiments, a 492 data tone block can have an interleaver depth of 2, 3, 4, 6, 12, 41, 82, 123, 164, or 246. In various embodiments, a 496 data tone block can have an interleaver depth of 2, 4, 8, 16, 31, 62, 124, or 248. In various embodiments, a 498 data tone block can have an interleaver depth of 2, 3, 6, 83, 166, or 249.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 107-136. The rotation index (e.g., the 6$^{th}$ column) can be a bit reversal of [0 2 1 3] in this scenario. Alternatively, if the data tone block has more than 4 spatial streams (Nss), the base subcarrier rotation (NROT) can be any of 48-73. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 24 is a chart illustrating candidate interleaver parameters for different numbers of data tones, according to a 768-tone plan embodiment. In a particular embodiment, the interleaver depth (e.g., the number of columns (Ncol)) can be a factor of the number of data tones (Ndata). In various embodiments, a 732 data tone block can have an interleaver depth of 2, 3, 4, 6, 12, 61, 122, 183, 244, or 366. In various embodiments, a 738 data tone block can have an interleaver depth of 2, 3, 6, 9, 18, 41, 82, 123, 246, or 369. In various embodiments, a 740 data tone block can have an interleaver depth of 2, 4, 5, 10, 20, 37, 74, 148, 185, or 370. In various embodiments, a 744 data tone block can have an interleaver depth of 2, 3, 4, 6, 8, 12, 24, 31, 62, 93, 124, 186, 248, or 372.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 173-199. The rotation index (e.g., the 6$^{th}$ column) can be a bit reversal of [0 2 1 3] in this scenario. Alternatively, if the data tone block has more than 4 spatial streams (Nss), the base subcarrier rotation (NROT) can be any of 81-105. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 25A is a chart illustrating candidate interleaver parameters for different numbers of data tones, according to a 1024-tone plan embodiment. FIG. 25B is another chart illustrating candidate interleaver parameters for different numbers of data tones, according to a 1024-tone plan embodiment. In a particular embodiment, the interleaver depth (e.g., the number of columns (Ncol)) can be a factor of the number of data tones (Ndata). In various embodiments, a data tone block of 936 can have an interleaver depth of 2, 3, 4, 6, 8, 9, 12, 13, 18, 24, 26, 36, 39, 52, 72, 78, 104, 117, 156, 234, 312, or 468, a 948 data tone block can have an interleaver depth of 2, 3, 4, 6, 12, 79, 158, 237, 316, or 474. In various embodiments, a 960 data tone block can have an interleaver depth of 2, 3, 4, 5, 6, 8, 10, 12, 15, 16, 20, 24, 30, 32, 40, 48, 60, 64, 80, 96, 120, 160, 192, 240, 320, or 480. In various embodiments, a 972 data tone block can have an interleaver depth of 2, 3, 4, 6, 9, 12, 18, 27, 36, 54, 81, 108, 162, 243, 324, or 486. In various embodiments, a 980 data tone block can have an interleaver depth of 2, 4, 5, 7, 10, 14, 20, 28, 35, 49, 70, 98, 140, 196, 245, or 490. In various embodiments, a 984 data tone block can have an interleaver depth of 2, 3, 4, 6, 8, 12, 24, 41, 82, 123, 164, 246, 328, or 492. In various embodiments, a 990 data tone block can have an interleaver depth of 2, 3, 5, 6, 9, 10, 11, 15, 18, 22, 30, 33, 45, 55, 66, 90, 99, 110, 165, 198, 330, or 495. In various embodiments, a 996 data tone block can have an interleaver depth of 2, 3, 4, 6, 12, 83, 166, 249, 332, or 498.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 227-259. The rotation index (e.g., the 6$^{th}$ column) can be a bit reversal of [0 2 1 3] in this scenario. Alternatively, if the data tone block has more than 4 spatial streams (Nss), the base subcarrier rotation (NROT) can be any of 108-135. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 26 is a chart illustrating candidate interleaver parameters for different numbers of data tones, according to a 1280-tone plan embodiment. In a particular embodiment, the interleaver depth (e.g., the number of columns (Ncol)) can be a factor of the number of data tones (Ndata). In various embodiments, a 1200 data tone block can have an interleaver depth of 2, 3, 4, 5, 6, 8, 10, 12, 15, 16, 20, 24, 25, 30, 40, 48, 50, 60, 75, 80, 100, 120, 150, 200, 240, 300, 400, or 600. In various embodiments, a 1206 data tone block can have an interleaver depth of 2, 3, 6, 9, 18, 67, 134, 201, 402, or 603. In various embodiments, a 1212 data tone block can have an interleaver depth of 2, 3, 4, 6, 12, 101, 202, 303, 404, or 606. In various embodiments, a 1218 data tone block can have an interleaver depth of 2, 3, 6, 7, 14, 21, 29, 42, 58, 87, 174, 203, 406, or 609. In various embodiments, a 1224 data tone block can have an interleaver depth of 2, 3, 4, 6, 8, 9, 12, 17, 18, 24, 34, 36, 51, 68, 72, 102, 136, 153, 204, 306, 408, or 612. In various embodiments, a 1230 data tone block can have an interleaver depth of 2, 3, 5, 6, 10, 15, 30, 41, 82, 123, 205, 246, 410, or 615. In various embodiments, a 1232 data tone block can have an interleaver depth of 2, 4, 7, 8, 11, 14, 16, 22, 28, 44, 56, 77, 88, 112, 154, 176, 308, or 616. In various embodiments, a 1236 data tone block can have an interleaver depth of 2, 3, 4, 6, 12, 103, 206, 309, 412, or 618. In various embodiments, a 1242 data tone block can have an interleaver depth of 2, 3, 6, 9, 18, 23, 27, 46, 54, 69, 138, 207, 414, or 621.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 290-321. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 140-166. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 27 is a chart illustrating candidate interleaver parameters for different numbers of data tones, according to a 1536-tone plan embodiment. In a particular embodiment, the interleaver depth (e.g., the number of columns (Ncol)) can be a factor of the number of data tones (Ndata). In various embodiments, a 1420 data tone block can have an interleaver depth of 2, 4, 5, 10, 20, 71, 142, 284, 355, or 710. In various embodiments, a 1422 data tone block can have an interleaver depth of 2, 3, 6, 9, 18, 79, 158, 237, 474, or 711. In various embodiments, a 1424 data tone block can have an interleaver depth of 2, 4, 8, 16, 89, 178, 356, or 712. In various embodiments, a 1426 data tone block can have an interleaver depth of 2, 23, 31, 46, 62, or 713. In various embodiments, a 1428 data tone block can have an interleaver depth of 2, 3, 4, 6, 7, 12, 14, 17, 21, 28, 34, 42, 51, 68, 84, 102, 119, 204, 238, 357, 476, or 714. In various embodiments, a 1430 data tone block can have an interleaver depth of 2, 5, 10, 11, 13, 22, 26, 55, 65, 110, 130, 143, 286, or 715. In various embodiments, a 1432 data tone block can have an interleaver depth of 2, 4, 8, 179, 358, or 716. In various embodiments, a 1434 data tone block can have an interleaver depth of 2, 3, 6, 239, 478, or 717. In various embodiments, a 1436 data tone block can have an interleaver depth of 2, 4, 359, or 718. In various embodiments, a 1438 data tone block can have an interleaver depth of 2 or 719. In various embodiments, a 1440 data tone block can have an interleaver depth of 2, 3, 4, 5, 6, 8, 9, 10, 12, 15, 16, 18, 20, 24, 30, 32, 36, 40, 45, 48, 60, 72, 80, 90, 96, 120, 144, 160, 180, 240, 288, 360, 480, or 720. In various embodiments, a 1452 data tone block can have an interleaver depth of 2, 3, 4, 6, 11, 12, 22, 33, 44, 66, 121, 132, 242, 363, 484, or 726. In various embodiments, a 1464 data tone block can have an interleaver depth of 2, 3, 4, 6, 8, 12, 24, 61, 122, 183, 244, 366, 488, or 732. In various embodiments, a 1470 data tone block can have an interleaver depth of 2, 3, 5, 6, 7, 10, 14, 15, 21, 30, 35, 42, 49, 70, 98, 105, 147, 210, 245, 294, 490, or 735. In various embodiments, a 1485 data tone block can have an interleaver depth of 3, 5, 9, 11, 15, 27, 33, 45, 55, 99, 135, 165, 297, or 495. In various embodiments, a 1488 data tone block can have an interleaver depth of 2, 3, 4, 6, 8, 12, 16, 24, 31, 48, 62, 93, 124, 186, 248, 372, 496, or 744. In various embodiments, a 1491 data tone block can have an interleaver depth of 3, 7, 21, 71, 213, or 497.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 346-383. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 167-187. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 28 is a chart illustrating candidate interleaver parameters for different numbers of data tones, according to a 1792-tone plan embodiment. In a particular embodiment, the interleaver depth (e.g., the number of columns (Ncol)) can be a factor of the number of data tones (Ndata). In various embodiments, a 1660 data tone block can have an interleaver depth of 2, 4, 5, 10, 20, 83, 166, 332, 415 or 830. In various embodiments, a 1664 data tone block can have an interleaver depth of 2, 4, 8, 13, 16, 26, 32, 52, 64, 104, 128, 208, 416, or 832. In various embodiments, a 1668 data tone block can have an interleaver depth of 2, 3, 4, 6, 12, 139, 278, 417, 556, or 834. In various embodiments, a 1672 data tone block can have an interleaver depth of 2, 4, 8, 11, 19, 22, 38, 44, 76, 88, 152, 209, 418, or 836. In various embodiments, a 1680 data tone block can have an interleaver depth of 2, 3, 4, 5, 6, 7, 8, 10, 12, 14, 15, 16, 20, 21, 24, 28, 30, 35, 40, 42, 48, 56, 60, 70, 80, 84, 105, 112, 120, 140, 168, 210, 240, 280, 336, 420, 560, or 840. In various embodiments, a 1688 data tone block can have an interleaver depth of 2, 4, 8, 211, 422, or 844. In various embodiments, a 1692 data tone block can have an interleaver depth of 2, 3, 4, 6, 9, 12, 18, 36, 47, 94, 141, 188, 282, 423, 564, or 846. In various embodiments, a 1696 data tone block can have an interleaver depth of 2, 4, 8, 16, 32, 53, 106, 212, 424, or 848. In various embodiments, a 1700 data tone block can have an interleaver depth of 2, 4, 5, 10, 17, 20, 25, 34, 50, 68, 85, 100, 170, 340, 425, or 850. In various embodiments, a 1704 data tone block can have an interleaver depth of 2, 3, 4, 6, 8, 12, 24, 71, 142, 213, 284, 426, 568, or 852. In various embodiments, a 1708 data tone block can have an interleaver depth of 2, 4, 7, 14, 28, 61, 122, 244, 427, or 854. In various embodiments, a 1710 data tone block can have an interleaver depth of 2, 3, 5, 6, 9, 10, 15, 18, 19, 30, 38, 45, 57, 90, 95, 114, 171, 190, 285, 342, 570, or 855. In various embodiments, a 1712 data tone block can have an interleaver depth of 2, 4, 8, 16, 107, 214, 428, or 856. In various embodiments, a 1716 data tone block can have an interleaver depth of 2, 3, 4, 6, 11, 12, 13, 22, 26, 33, 39, 44, 52, 66, 78, 132, 143, 156, 286, 429, 572, or 858. In various embodiments, a 1720 data tone block can have an interleaver depth of 2, 4, 5, 8, 10, 20, 40, 43, 86, 172, 215, 344, 430, or 860. In various embodiments, a 1728 data tone block can have an interleaver depth of 2, 3, 4, 6, 8, 9, 12, 16, 18, 24, 27, 32, 36, 48, 54, 64, 72, 96, 108, 144, 192, 216, 288, 432, 576, or 864. In various embodiments, a 1740 data tone block can have an interleaver depth of 2, 3, 4, 5, 6, 10, 12, 15, 20, 29, 30, 58, 60, 87, 116, 145, 174, 290, 348, 435, 580, or 870. In various embodiments, a 1745 data tone block can have an interleaver depth of 5 or 349.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 405-447. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 197-229. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

Referring back to FIG. 17, the outputs of each interleaver 1108a-1108c (e.g., transmit streams) can be provided to the corresponding modulator 1102a-1102c. Each modulator 1102a-1102c can be configured to modulate the corresponding transmit stream and pass the modulated transmit stream to the corresponding transmission circuit 1110a-1110c. In a particular embodiment, the bits (e.g., the transmit streams) can be modulated using Quadrature Phase Shift Keying (QPSK) modulation, Binary Phase Shift Keying (BPSK) modulation, or Quadrature Amplitude Modulation (QAM) (e.g., 16-QAM, 64-QAM, 256-QAM). The transmission circuits 1110a-1110c can be configure to transmit the modulated transmit streams over a wireless network (e.g., an IEEE 802.11 wireless network) via the corresponding antennas 1112a-1112c.

In a particular embodiment, the antennas 1112a-1112c are distinct and spatially separated antennas. In another embodiment, distinct signal can be combined into different polarizations and transmitted via a subset of the antennas 1112-1112c. For example, the distinct signals can be combined where spatial rotation or spatial spreading is performed and multiple spatial streams are mapped to a single antenna.

The receive circuits 1116a-1116c of the destination device 1029 can receive the interleaved encoded bits via the corresponding antennas 1114a-1114c. The outputs of the receive circuits 1116a-1116c are provided to the MIMO detector 1118, and the output of the MIMO detector 1118 is provided to the decoder 1120. In a particular embodiment, the MIMO detector 1118 can include a deinterleaving system configured to perform reverse operations of the interleaving system 1014. The decoder 1120 can output received bits which, without unrecoverable errors, are the same as the transmitted bits provided to the encoder 1104.

Table 1, below, is a chart illustrating exemplary low density parity check (LDPC) tone mapping distances (DTMs) for different numbers of data tones (Ndata).

TABLE 1

| $N_{data}$ | $D_{TM}$ Candidates |
|---|---|
| 50 | 2, 5, 10, 25 |
| 54 | 2, 3, 6, 9, 18, 27 |
| 56 | 2, 4, 7, 8, 14, 28 |
| 58 | 2, 29 |
| 60 | 2, 3, 4, 5, 6, 10, 12, 15, 20, 30 |
| 62 | 2, 31 |
| 110 | 2, 5, 10, 11, 22, 55 |
| 112 | 2, 4, 7, 8, 14, 16, 28, 56 |
| 114 | 2, 3, 6, 19, 38, 57 |
| 116 | 2, 4, 29, 58 |
| 118 | 2, 59 |
| 120 | 2, 3, 4, 5, 6, 8, 10, 12, 15, 20, 24, 30, 40, 60 |
| 122 | 2, 61 |
| 124 | 2, 4, 31, 62 |
| 168 | 2, 3, 4, 6, 7, 8, 12, 14, 21, 24, 28, 42, 56, 84 |
| 170 | 2, 5, 10, 17, 34, 85 |
| 172 | 2, 4, 43, 86 |
| 174 | 2, 3, 6, 29, 58, 87 |

TABLE 1-continued

| $N_{data}$ | $D_{TM}$ Candidates |
|---|---|
| 176 | 2, 4, 8, 11, 16, 22, 44, 88 |
| 178 | 2, 89 |
| 180 | 2, 3, 4, 5, 6, 9, 10, 12, 15, 18, 20, 30, 36, 45, 60, 90 |
| 182 | 2, 7, 13, 14, 26, 91 |
| 184 | 2, 4, 8, 23, 46, 92 |
| 186 | 2, 3, 6, 31, 62, 93 |
| 236 | 2, 4, 59, 118 |
| 238 | 2, 7, 14, 17, 34, 119 |
| 240 | 2, 3, 4, 5, 6, 8, 10, 12, 15, 16, 20, 24, 30, 40, 48, 60, 80, 120 |
| 242 | 2, 11, 22, 121 |
| 244 | 2, 4, 61, 122 |
| 246 | 2, 3, 6, 41, 82, 123 |
| 248 | 2, 4, 8, 31, 62, 124 |
| 350 | 2, 5, 7, 10, 14, 25, 35, 50, 70, 175 |
| 352 | 2, 4, 8, 11, 16, 22, 32, 44, 88, 176 |
| 354 | 2, 3, 6, 59, 118, 177 |
| 356 | 2, 4, 89, 178 |
| 357 | 3, 7, 17, 21, 51, 119 |
| 358 | 2, 179 |
| 360 | 2, 3, 4, 5, 6, 8, 9, 10, 12, 15, 18, 20, 24, 30, 36, 40, 45, 60, 72, 90, 120, 180 |
| 364 | 2, 4, 7, 13, 14, 26, 28, 52, 91, 182 |
| 366 | 2, 3, 6, 61, 122, 183 |
| 368 | 2, 4, 8, 16, 23, 46, 92, 184 |
| 370 | 2, 5, 10, 37, 74, 185 |
| 372 | 2, 3, 4, 6, 12, 31, 62, 93, 124, 186 |
| 470 | 2, 5, 10, 47, 94, 235 |
| 472 | 2, 4, 8, 59, 118, 236 |
| 474 | 2, 3, 6, 79, 158, 237 |
| 476 | 2, 4, 7, 14, 17, 28, 34, 68, 119, 238 |
| 478 | 2, 239 |
| 480 | 2, 3, 4, 5, 6, 8, 10, 12, 15, 16, 20, 24, 30, 32, 40, 48, 60, 80, 96, 120, 160, 240 |
| 484 | 2, 4, 11, 22, 44, 121, 242 |
| 486 | 2, 3, 6, 9, 18, 27, 54, 81, 162, 243 |
| 488 | 2, 4, 8, 61, 122, 244 |
| 490 | 2, 5, 7, 10, 14, 35, 49, 70, 98, 245 |
| 492 | 2, 3, 4, 6, 12, 41, 82, 123, 164, 246 |
| 496 | 2, 4, 8, 16, 31, 62, 124, 248 |
| 498 | 2, 3, 6, 83, 166, 249 |
| 732 | 2, 3, 4, 6, 12, 61, 122, 183, 244, 366 |
| 738 | 2, 3, 6, 9, 18, 41, 82, 123, 246, 369 |
| 740 | 2, 4, 5, 10, 20, 37, 74, 148, 185, 370 |
| 744 | 2, 3, 4, 6, 8, 12, 24, 31, 62, 93, 124, 186, 248, 372 |
| 936 | 2, 3, 4, 6, 8, 9, 12, 13, 18, 24, 26, 36, 39, 52, 72, 78, 104, 117, 156, 234, 312, 468 |
| 948 | 2, 3, 4, 6, 12, 79, 158, 237, 316, 474 |
| 960 | 2, 3, 4, 5, 6, 8, 10, 12, 15, 16, 20, 24, 30, 32, 40, 48, 60, 64, 80, 96, 120, 160, 192, 240, 320, 480 |
| 972 | 2, 3, 4, 6, 9, 12, 18, 27, 36, 54, 81, 108, 162, 243, 324, 486 |
| 980 | 2, 4, 5, 7, 10, 14, 20, 28, 35, 49, 70, 98, 140, 196, 245, 490 |
| 984 | 2, 3, 4, 6, 8, 12, 24, 41, 82, 123, 164, 246, 328, 492 |
| 990 | 2, 3, 5, 6, 9, 10, 11, 15, 18, 22, 30, 33, 45, 55, 66, 90, 99, 110, 165, 198, 330, 495 |
| 996 | 2, 3, 4, 6, 12, 83, 166, 249, 332, 498 |
| 1200 | 2, 3, 4, 5, 6, 8, 10, 12, 15, 16, 20, 24, 25, 30, 40, 48, 50, 60, 75, 80, 100, 120, 150, 200, 240, 300, 400, 600 |
| 1206 | 2, 3, 6, 9, 18, 67, 134, 201, 402, 603 |
| 1212 | 2, 3, 4, 6, 12, 101, 202, 303, 404, 606 |
| 1218 | 2, 3, 6, 7, 14, 21, 29, 42, 58, 87, 174, 203, 406, 609 |
| 1224 | 2, 3, 4, 6, 8, 9, 12, 17, 18, 24, 34, 36, 51, 68, 72, 102, 136, 153, 204, 306, 408, 612 |
| 1230 | 2, 3, 5, 6, 10, 15, 30, 41, 82, 123, 205, 246, 410, 615 |
| 1232 | 2, 4, 7, 8, 11, 14, 16, 22, 28, 44, 56, 77, 88, 112, 154, 176, 308, 616 |
| 1236 | 2, 3, 4, 6, 12, 103, 206, 309, 412, 618 |
| 1242 | 2, 3, 6, 9, 18, 23, 27, 46, 54, 69, 138, 207, 414, 621 |
| 1420 | 2, 4, 5, 10, 20, 71, 142, 284, 355, 710 |
| 1422 | 2, 3, 6, 9, 18, 79, 158, 237, 474, 711 |
| 1424 | 2, 4, 8, 16, 89, 178, 356, 712 |
| 1426 | 2, 23, 31, 46, 62, 713 |
| 1428 | 2, 3, 4, 6, 7, 12, 14, 17, 21, 28, 34, 42, 51, 68, 84, 102, 119, 204, 238, 357, 476, 714 |
| 1430 | 2, 5, 10, 11, 13, 22, 26, 55, 65, 110, 130, 143, 286, 715 |
| 1432 | 2, 4, 8, 179, 358, 716 |
| 1434 | 2, 3, 6, 239, 478, 717 |
| 1436 | 2, 4, 359, 718 |
| 1438 | 2, 719 |
| 1440 | 2, 3, 4, 5, 6, 8, 9, 10, 12, 15, 16, 18, 20, 24, 30, 32, 36, 40, 45, 48, 60, 72, 80, 90, 96, 120, 144, 160, 180, 240, 288, 360, 480, 720 |
| 1452 | 2, 3, 4, 6, 11, 12, 22, 33, 44, 66, 121, 132, 242, 363, 484, 726 |
| 1464 | 2, 3, 4, 6, 8, 12, 24, 61, 122, 183, 244, 366, 488, 732 |
| 1470 | 2, 3, 5, 6, 7, 10, 14, 15, 21, 30, 35, 42, 49, 70, 98, 105, 147, 210, 245, 294, 490, 735 |
| 1485 | 3, 5, 9, 11, 15, 27, 33, 45, 55, 99, 135, 165, 297, 495 |
| 1488 | 2, 3, 4, 6, 8, 12, 16, 24, 31, 48, 62, 93, 124, 186, 248, 372, 496, 744 |
| 1491 | 3, 7, 21, 71, 213, 497 |
| 1660 | 2, 4, 5, 10, 20, 83, 166, 332, 415, 830 |

TABLE 1-continued $N_{data}$  $D_{TM}$ Candidates 1664  2, 4, 8, 13, 16, 26, 32, 52, 64, 104, 128, 208, 416, 832
1668  2, 3, 4, 6, 12, 139, 278, 417, 556, 834
1672  2, 4, 8, 11, 19, 22, 38, 44, 76, 88, 152, 209, 418, 836
1680  2, 3, 4, 5, 6, 7, 8, 10, 12, 14, 15, 16, 20, 21, 24, 28, 30, 35, 40, 42, 48, 56, 60, 70, 80, 84, 105, 112, 120, 140, 168, 210, 240, 280, 336, 420, 560, 840
1688  2, 4, 8, 211, 422, 844
1692  2, 3, 4, 6, 9, 12, 18, 36, 47, 94, 141, 188, 282, 423, 564, 846
1696  2, 4, 8, 16, 32, 53, 106, 212, 424, 848
1700  2, 4, 5, 10, 17, 20, 25, 34, 50, 68, 85, 100, 170, 340, 425, 850
1704  2, 3, 4, 6, 8, 12, 24, 71, 142, 213, 284, 426, 568, 852
1708  2, 4, 7, 14, 28, 61, 122, 244, 427, 854
1710  2, 3, 5, 6, 9, 10, 15, 18, 19, 30, 38, 45, 57, 90, 95, 114, 171, 190, 285, 342, 570, 855
1712  2, 4, 8, 16, 107, 214, 428, 856
1716  2, 3, 4, 6, 11, 12, 13, 22, 26, 33, 39, 44, 52, 66, 78, 132, 143, 156, 286, 429, 572, 858
1720  2, 4, 5, 8, 10, 20, 40, 43, 86, 172, 215, 344, 430, 860
1728  2, 3, 4, 6, 8, 9, 12, 16, 18, 24, 27, 32, 36, 48, 54, 64, 72, 96, 108, 144, 192, 216, 288, 432, 576, 864
1740  2, 3, 4, 5, 6, 10, 12, 15, 20, 29, 30, 58, 60, 87, 116, 145, 174, 290, 348, 435, 580, 870
1745  5, 349

Generally, LDPC tone mapping distance (DTM) is defined in the IEEE 802.11ac specification. The mapping distance (DTM) can be at least as large as the number of coded bits per OFDM symbol (NCBPS) divided by the LDPC codeword length (LCW) (e.g., NCBPS/LCW≤DTM) so that each LDPC codeword covers the full range of tones. Additionally, the mapping distance (DTM) can be an integer divisor of the number of subcarriers (Ndata). The mapping distance (DTM) can be constant over rates within each bandwidth to enable a tone de-mapper implemented at a Fast Fourier Transform (FFT) module of the receive circuits 1116a-1116c with fixed tone processing.

Thus, table 1 illustrates each of the mapping distances (DTM) which may be used with any given number of data tones (Ndata). In some aspects, the mapping distances listed in Table 1, for any given number of data tones, may be the same as the NCOL candidates for the given Ndata, as listed in FIGS. 18-28.

Table 2, below, is a chart illustrating exemplary modulation and coding scheme (MCS) validity for different numbers of data tones (Ndata).

TABLE 2

| $N_{data}$ | # exclusions | Exclusions |
|---|---|---|
| 50 | 6 | MCS9 & $N_{ss}$ = 1, 2, 4, 5, 7, 8 |
| 54 | 0 | |
| 56 | 6 | MCS9 & $N_{ss}$ = 1, 2, 4, 5, 7, 8 |
| 58 | 6 | MCS9 & $N_{ss}$ = 1, 2, 4, 5, 7, 8 |
| 60 | 0 | |
| 62 | 6 | MCS9 & $N_{ss}$ = 1, 2, 4, 5, 7, 8 |
| 110 | 10 | MCS6 & $N_{ss}$ = 5, 7; MCS7 & $N_{ss}$ = 8; MCS9 & $N_{ss}$ = 1, 2, 4, 5, 6, 7, 8 |
| 112 | 8 | MCS7 & $N_{ss}$ = 8; MCS9 & $N_{ss}$ = 1, 2, 4, 5, 6, 7, 8 |
| 114 | 4 | MCS6 & $N_{ss}$ = 5, 7; MCS9 & $N_{ss}$ = 7, 8 |
| 116 | 8 | MCS7 & $N_{ss}$ = 8; MCS9 & $N_{ss}$ = 1, 2, 4, 5, 6, 7, 8 |
| 118 | 10 | MCS6 & $N_{ss}$ = 5, 7; MCS7 & $N_{ss}$ = 8; MCS9 & $N_{ss}$ = 1, 2, 4, 5, 6, 7, 8 |
| 120 | 2 | MCS9 & $N_{ss}$ = 7, 8 |
| 122 | 10 | MCS6 & $N_{ss}$ = 5, 7; MCS7 & $N_{ss}$ = 8; MCS9 & $N_{ss}$ = 1, 2, 4, 5, 6, 7, 8 |
| 124 | 9 | MCS7 & $N_{ss}$ = 7, 8; MCS9 & $N_{ss}$ = 1, 2, 4, 5, 6, 7, 8 |
| 168 | 2 | MCS9 & $N_{ss}$ = 4, 5 |
| 170 | 11 | MCS5 & $N_{ss}$ = 7, 8; MCS6 & $N_{ss}$ = 3, 5; MCS7 & $N_{ss}$ = 7; MCS9 & $N_{ss}$ = 1, 2, 4, 5, 7, 8 |
| 172 | 9 | MCS5 & $N_{ss}$ = 7, 8; MCS7 & $N_{ss}$ = 7; MCS9 & $N_{ss}$ = 1, 2, 4, 5, 7, 8 |
| 174 | 4 | MCS6 & $N_{ss}$ = 3, 5; MCS9 & $N_{ss}$ = 4, 5 |
| 176 | 10 | MCS5 & $N_{ss}$ = 7, 8; MCS7 & $N_{ss}$ = 5, 7; MCS9 & $N_{ss}$ = 1, 2, 4, 5, 7, 8 |
| 178 | 12 | MCS5 & $N_{ss}$ = 7, 8; MCS6 & $N_{ss}$ = 3, 5; MCS7 & $N_{ss}$ = 5, 7; MCS9 & $N_{ss}$ = 1, 2, 4, 5, 7, 8 |
| 180 | 0 | |
| 182 | 13 | MCS5 & $N_{ss}$ = 7, 8; MCS6 & $N_{ss}$ = 3, 5; MCS7 & $N_{ss}$ = 5, 7; MCS8 & $N_{ss}$ = 8; MCS9 & $N_{ss}$ = 1, 2, 4, 5, 7, 8 |
| 184 | 11 | MCS5 & $N_{ss}$ = 7, 8; MCS7 & $N_{ss}$ = 5, 7; MCS8 & $N_{ss}$ = 8; MCS9 & $N_{ss}$ = 1, 2, 4, 5, 7, 8 |
| 186 | 6 | MCS6 & $N_{ss}$ = 3, 5; MCS7 & $N_{ss}$ = 7; MCS8 & $N_{ss}$ = 8; MCS9 & $N_{ss}$ = 4, 5 |
| 236 | 12 | MCS5 & $N_{ss}$ = 5; MCS6 & $N_{ss}$ = 7; MCS7 & $N_{ss}$ = 4, 5; MCS8 & $N_{ss}$ = 7; MCS9 & $N_{ss}$ = 1, 2, 3, 4, 5, 7, 8 |
| 238 | 15 | MCS2 & $N_{ss}$ = 7; MCS5 & $N_{ss}$ = 5; MCS6 & $N_{ss}$ = 3, 7; MCS7 & $N_{ss}$ = 4, 5, 7; MCS8 & $N_{ss}$ = 7; MCS9 & $N_{ss}$ = 1, 2, 3, 4, 5, 7, 8 |
| 240 | 3 | MCS9 & $N_{ss}$ = 4, 7, 8 |
| 242 | 18 | MCS2 & $N_{ss}$ = 7; MCS5 & $N_{ss}$ = 5; MCS6 & $N_{ss}$ = 3, 6, 7, 8; MCS7 & $N_{ss}$ = 4, 5, 7; MCS8 & $N_{ss}$ = 6, 7; MCS9 & $N_{ss}$ = 1, 2, 3, 4, 5, 7, 8 |
| 244 | 14 | MCS5 & $N_{ss}$ = 5; MCS6 & $N_{ss}$ = 7, 8; MCS7 & $N_{ss}$ = 4, 5; MCS8 & $N_{ss}$ = 6, 7; MCS9 & $N_{ss}$ = 1, 2, 3, 4, 5, 7, 8 |
| 246 | 10 | MCS2 & $N_{ss}$ = 7; MCS6 & $N_{ss}$ = 3, 6, 7, 8; MCS7 & $N_{ss}$ = 7; MCS8 & $N_{ss}$ = 6, 7; MCS9 & $N_{ss}$ = 7, 8 |

TABLE 2-continued

| $N_{data}$ | # exclusions | Exclusions |
|---|---|---|
| 248 | 13 | MCS5 & $N_{ss}$ = 5; MCS6 & $N_{ss}$ = 8; MCS7 & $N_{ss}$ = 4, 5; MCS8 & $N_{ss}$ = 6, 7; MCS9 & $N_{ss}$ = 1, 2, 3, 4, 5, 7, 8 |
| 350 | 16 | MCS2 & $N_{ss}$ = 5, 7; MCS3 & $N_{ss}$ = 7, 8; MCS4 & $N_{ss}$ = 7; MCS5 & $N_{ss}$ = 4, 8; MCS6 & $N_{ss}$ = 5, 7; MCS7 & $N_{ss}$ = 7; MCS9 & $N_{ss}$ = 1, 2, 4, 5, 7, 8 |
| 352 | 15 | MCS3 & $N_{ss}$ = 7, 8; MCS5 & $N_{ss}$ = 4, 7, 8; MCS6 & $N_{ss}$ = 6; MCS7 & $N_{ss}$ = 7, 8; MCS9 & $N_{ss}$ = 1, 2, 4, 5, 6, 7, 8 |
| 354 | 12 | MCS2 & $N_{ss}$ = 5, 7; MCS4 & $N_{ss}$ = 7; MCS5 & $N_{ss}$ = 7; MCS6 & $N_{ss}$ = 5, 6, 7; MCS7 & $N_{ss}$ = 8; MCS9 & $N_{ss}$ = 2, 5, 6, 8 |
| 356 | 16 | MCS3 & $N_{ss}$ = 7, 8; MCS5 & $N_{ss}$ = 4, 7, 8; MCS6 & $N_{ss}$ = 5, 6; MCS7 & $N_{ss}$ = 7, 8; MCS9 & $N_{ss}$ = 1, 2, 4, 5, 6, 7, 8 |
| 357 | 24 | MCS0 & $N_{ss}$ = 1, 3, 5, 7; MCS1 & $N_{ss}$ = 7; MCS2 & $N_{ss}$ = 1, 3, 5, 6, 7; MCS4 & $N_{ss}$ = 3, 7; MCS5 & $N_{ss}$ = 7; MCS6 & $N_{ss}$ = 1, 2, 3, 5, 6, 7; MCS7 & $N_{ss}$ = 7; MCS9 & $N_{ss}$ = 2, 5, 7, 8 |
| 358 | 20 | MCS2 & $N_{ss}$ = 5, 7; MCS3 & $N_{ss}$ = 7, 8; MCS4 & $N_{ss}$ = 7; MCS5 & $N_{ss}$ = 4, 7, 8; MCS6 & $N_{ss}$ = 5, 6, 7; MCS7 & $N_{ss}$ = 7, 8; MCS9 & $N_{ss}$ = 1, 2, 4, 5, 6, 7, 8 |
| 360 | 3 | MCS7 & $N_{ss}$ = 8; MCS9 & $N_{ss}$ = 6, 8 |
| 364 | 18 | MCS3 & $N_{ss}$ = 7, 8; MCS4 & $N_{ss}$ = 8; MCS5 & $N_{ss}$ = 4, 6, 7, 8; MCS6 & $N_{ss}$ = 5, 6; MCS7 & $N_{ss}$ = 7; MCS8 & $N_{ss}$ = 4, 8; MCS9 & $N_{ss}$ = 1, 2, 4, 5, 7, 8 |
| 366 | 17 | MCS2 & $N_{ss}$ = 5, 7; MCS4 & $N_{ss}$ = 7, 8; MCS5 & $N_{ss}$ = 6, 7; MCS6 & $N_{ss}$ = 5, 6, 7, 8; MCS7 & $N_{ss}$ = 8; MCS8 & $N_{ss}$ = 4, 6, 7; MCS9 & $N_{ss}$ = 2, 5, 6 |
| 368 | 21 | MCS3 & $N_{ss}$ = 7, 8; MCS4 & $N_{ss}$ = 8; MCS5 & $N_{ss}$ = 4, 6, 7, 8; MCS6 & $N_{ss}$ = 6, 8; MCS7 & $N_{ss}$ = 7, 8; MCS8 & $N_{ss}$ = 4, 6, 8; MCS9 & $N_{ss}$ = 1, 2, 4, 5, 6, 7, 8 |
| 370 | 22 | MCS2 & $N_{ss}$ = 5, 7; MCS3 & $N_{ss}$ = 7, 8; MCS4 & $N_{ss}$ = 7; MCS5 & $N_{ss}$ = 4, 8; MCS6 & $N_{ss}$ = 5, 7, 8; MCS7 & $N_{ss}$ = 7, 8; MCS8 & $N_{ss}$ = 6, 7, 8; MCS9 & $N_{ss}$ = 1, 2, 4, 5, 6, 7, 8 |
| 372 | 13 | MCS4 & $N_{ss}$ = 8; MCS5 & $N_{ss}$ = 6, 7; MCS6 & $N_{ss}$ = 5, 6, 8; MCS7 & $N_{ss}$ = 8; MCS8 & $N_{ss}$ = 4, 6; MCS9 & $N_{ss}$ = 2, 5, 6, 7 |
| 470 | 19 | MCS2 & $N_{ss}$ = 5; MCS3 & $N_{ss}$ = 5; MCS4 & $N_{ss}$ = 5; MCS5 & $N_{ss}$ = 8; MCS7 & $N_{ss}$ = 2, 3, 5, 6, 7, 8; MCS8 & $N_{ss}$ = 5, 8; MCS9 & $N_{ss}$ = 1, 2, 4, 5, 6, 7, 8 |
| 472 | 17 | MCS3 & $N_{ss}$ = 5; MCS4 & $N_{ss}$ = 7; MCS5 & $N_{ss}$ = 8; MCS7 & $N_{ss}$ = 2, 5, 6, 8; MCS8 & $N_{ss}$ = 5, 7, 8; MCS9 & $N_{ss}$ = 1, 2, 4, 5, 6, 7, 8 |
| 474 | 15 | MCS2 & $N_{ss}$ = 5; MCS4 & $N_{ss}$ = 5, 7; MCS7 & $N_{ss}$ = 3, 6, 7, 8; MCS8 & $N_{ss}$ = 5, 7, 8; MCS9 & $N_{ss}$ = 2, 4, 6, 7, 8 |
| 476 | 15 | MCS3 & $N_{ss}$ = 5; MCS4 & $N_{ss}$ = 7; MCS7 & $N_{ss}$ = 2, 5, 7, 8; MCS8 & $N_{ss}$ = 7, 8; MCS9 & $N_{ss}$ = 1, 2, 4, 5, 6, 7, 8 |
| 478 | 20 | MCS2 & $N_{ss}$ = 5; MCS3 & $N_{ss}$ = 5; MCS4 & $N_{ss}$ = 5, 7; MCS7 & $N_{ss}$ = 2, 3, 5, 6, 7, 8; MCS8 & $N_{ss}$ = 5, 7, 8; MCS9 & $N_{ss}$ = 1, 2, 4, 5, 6, 7, 8 |
| 480 | 9 | MCS7 & $N_{ss}$ = 6, 8; MCS8 & $N_{ss}$ = 5, 8; MCS9 & $N_{ss}$ = 2, 4, 6, 7, 8 |
| 484 | 22 | MCS3 & $N_{ss}$ = 5; MCS4 & $N_{ss}$ = 6, 7; MCS6 & $N_{ss}$ = 3, 4, 6, 7; MCS7 & $N_{ss}$ = 2, 5, 6, 7, 8; MCS8 & $N_{ss}$ = 3, 5, 7; MCS9 & $N_{ss}$ = 1, 2, 4, 5, 6, 7, 8 |
| 486 | 19 | MCS2 & $N_{ss}$ = 3, 5; MCS4 & $N_{ss}$ = 5, 6, 7; MCS6 & $N_{ss}$ = 1, 3, 4, 6, 7; MCS7 & $N_{ss}$ = 3, 6, 7; MCS8 & $N_{ss}$ = 3, 5, 7, 8; MCS9 & $N_{ss}$ = 7 |
| 488 | 19 | MCS3 & $N_{ss}$ = 5; MCS4 & $N_{ss}$ = 6, 7; MCS6 & $N_{ss}$ = 4, 6, 7; MCS7 & $N_{ss}$ = 2, 5, 6; MCS8 & $N_{ss}$ = 3, 5, 7, 8; MCS9 & $N_{ss}$ = 1, 2, 4, 5, 7, 8 |
| 490 | 19 | MCS2 & $N_{ss}$ = 3, 5; MCS3 & $N_{ss}$ = 5; MCS4 & $N_{ss}$ = 5; MCS6 & $N_{ss}$ = 1, 3, 5, 7; MCS7 & $N_{ss}$ = 2, 3, 5, 7; MCS8 & $N_{ss}$ = 8; MCS9 & $N_{ss}$ = 1, 2, 4, 5, 7, 8 |
| 492 | 15 | MCS4 & $N_{ss}$ = 6, 7; MCS6 & $N_{ss}$ = 3, 4, 6, 7; MCS7 & $N_{ss}$ = 6, 7; MCS8 & $N_{ss}$ = 3, 5, 7; MCS9 & $N_{ss}$ = 4, 7, 8 |
| 496 | 18 | MCS3 & $N_{ss}$ = 5; MCS4 & $N_{ss}$ = 6, 7; MCS6 & $N_{ss}$ = 4, 6; MCS7 & $N_{ss}$ = 2, 5, 6, 7; MCS8 & $N_{ss}$ = 3, 5, 7; MCS9 & $N_{ss}$ = 1, 2, 4, 5, 7, 8 |
| 498 | 20 | MCS2 & $N_{ss}$ = 3, 5; MCS4 & $N_{ss}$ = 5, 6, 7; MCS6 & $N_{ss}$ = 1, 3, 4, 6, 7; MCS7 & $N_{ss}$ = 3, 6, 7; MCS8 & $N_{ss}$ = 3, 5, 7; MCS9 & $N_{ss}$ = 4, 7, 8 |
| 732 | 32 | MCS2 & $N_{ss}$ = 7, 8; MCS3 & $N_{ss}$ = 6, 7; MCS4 & $N_{ss}$ = 4, 6, 7; MCS5 & $N_{ss}$ = 3, 5, 7, 8; MCS6 & $N_{ss}$ = 3, 4, 5, 6, 7, 8; MCS7 & $N_{ss}$ = 4, 5, 6, 8; MCS8 & $N_{ss}$ = 2, 3, 5, 6, 7, 8; MCS9 & $N_{ss}$ = 1, 3, 5, 6, 8 |
| 738 | 37 | MCS0 & $N_{ss}$ = 7; MCS2 & $N_{ss}$ = 3, 6, 7, 8; MCS3 & $N_{ss}$ = 6, 7; MCS4 & $N_{ss}$ = 3, 4, 6, 7; MCS5 & $N_{ss}$ = 3, 5, 7, 8; MCS6 & $N_{ss}$ = 1, 2, 3, 4, 5, 6, 7, 8; MCS7 & $N_{ss}$ = 4, 6, 7, 8; MCS8 & $N_{ss}$ = 2, 3, 5, 6, 7, 8; MCS9 & $N_{ss}$ = 3, 6, 7, 8 |
| 740 | 35 | MCS1 & $N_{ss}$ = 7, 8; MCS2 & $N_{ss}$ = 7; MCS3 & $N_{ss}$ = 4, 8; MCS4 & $N_{ss}$ = 6, 7, 8; MCS5 & $N_{ss}$ = 2, 4, 5, 6, 8; MCS6 & $N_{ss}$ = 4, 5, 7, 8; MCS7 & $N_{ss}$ = 4, 5, 6, 7, 8; MCS8 & $N_{ss}$ = 3, 4, 5, 6, 8; MCS9 & $N_{ss}$ = 1, 2, 3, 4, 5, 6, 7, 8 |
| 744 | 31 | MCS2 & $N_{ss}$ = 8; MCS3 & $N_{ss}$ = 6, 7; MCS4 & $N_{ss}$ = 4, 6; MCS5 & $N_{ss}$ = 3, 5, 7; MCS6 & $N_{ss}$ = 3, 4, 5, 6, 7, 8; MCS7 & $N_{ss}$ = 4, 5, 6, 7, 8; MCS8 & $N_{ss}$ = 2, 3, 5, 6, 7, 8; MCS9 & $N_{ss}$ = 1, 3, 5, 6, 7, 8 |
| 936 | 14 | MCS2 & $N_{ss}$ = 7; MCS3 & $N_{ss}$ = 8; MCS4 & $N_{ss}$ = 5, 7, 8; MCS5 & $N_{ss}$ = 4, 6, 8; MCS7 & $N_{ss}$ = 3, 5, 7; MCS8 & $N_{ss}$ = 4, 7, 8 |
| 948 | 27 | MCS2 & $N_{ss}$ = 5, 7; MCS4 & $N_{ss}$ = 5, 7, 8; MCS5 & $N_{ss}$ = 5, 6, 7, 8; MCS7 & $N_{ss}$ = 3, 4, 5, 6, 7, 8; MCS8 & $N_{ss}$ = 4, 5, 7, 8; MCS9 & $N_{ss}$ = 1, 2, 3, 4, 5, 6, 7, 8 |
| 960 | 21 | MCS4 & $N_{ss}$ = 5, 8; MCS5 & $N_{ss}$ = 5, 6, 7; MCS7 & $N_{ss}$ = 3, 4, 6, 8; MCS8 & $N_{ss}$ = 4, 5, 7, 8; MCS9 & $N_{ss}$ = 1, 2, 3, 4, 5, 6, 7, 8 |
| 972 | 24 | MCS2 & $N_{ss}$ = 5, 6, 7; MCS4 & $N_{ss}$ = 3, 5, 7, 8; MCS5 & $N_{ss}$ = 6, 7, 8; MCS6 & $N_{ss}$ = 2, 3, 5, 6, 7, 8; MCS7 & $N_{ss}$ = 3, 6, 7; MCS8 & $N_{ss}$ = 4, 5, 6, 7, 8 |
| 980 | 23 | MCS1 & $N_{ss}$ = 5; MCS2 & $N_{ss}$ = 5; MCS4 & $N_{ss}$ = 8; MCS5 & $N_{ss}$ = 6, 7, 8; MCS6 & $N_{ss}$ = 5, 6, 8; MCS7 & $N_{ss}$ = 1, 5, 7, 8; MCS8 & $N_{ss}$ = 4, 6, 8; MCS9 & $N_{ss}$ = 1, 2, 4, 5, 6, 7, 8 |
| 984 | 29 | MCS2 & $N_{ss}$ = 6, 7; MCS4 & $N_{ss}$ = 3, 5, 7, 8; MCS5 & $N_{ss}$ = 6, 7, 8; MCS6 & $N_{ss}$ = 2, 3, 5, 6, 7, 8; MCS7 & $N_{ss}$ = 3, 6, 7; MCS8 & $N_{ss}$ = 4, 5, 6, 7, 8; MCS9 & $N_{ss}$ = 2, 4, 6, 7, 8 |

TABLE 2-continued

| $N_{data}$ | # exclusions | Exclusions |
|---|---|---|
| 990 | 20 | MCS0 & $N_{ss}$ = 5, 7; MCS1 & $N_{ss}$ = 7; MCS2 & $N_{ss}$ = 5; MCS4 & $N_{ss}$ = 5; MCS5 & $N_{ss}$ = 7; MCS6 & $N_{ss}$ = 3, 6, 8; MCS7 & $N_{ss}$ = 3, 5, 6, 7, 8; MCS8 & $N_{ss}$ = 5, 6; MCS9 & $N_{ss}$ = 2, 4, 5, 6 |
| 996 | 27 | MCS2 & $N_{ss}$ = 5, 6, 7; MCS4 & $N_{ss}$ = 3, 5, 7; MCS5 & $N_{ss}$ = 7, 8; MCS6 & $N_{ss}$ = 2, 3, 5, 6, 7, 8; MCS7 & $N_{ss}$ = 3, 6, 7, 8; MCS8 & $N_{ss}$ = 5, 6, 7, 8; MCS9 & $N_{ss}$ = 2, 4, 6, 7, 8 |
| 1200 | 22 | MCS2 & $N_{ss}$ = 8; MCS3 & $N_{ss}$ = 6, 8; MCS4 & $N_{ss}$ = 4, 8; MCS5 & $N_{ss}$ = 3, 4, 6, 8; MCS6 & $N_{ss}$ = 5; MCS7 & $N_{ss}$ = 5, 6, 8; MCS8 & $N_{ss}$ = 2, 4, 5, 8; MCS9 & $N_{ss}$ = 4, 5, 6, 7, 8 |
| 1206 | 36 | MCS0 & $N_{ss}$ = 5, 7; MCS1 & $N_{ss}$ = 7, 8; MCS2 & $N_{ss}$ = 7, 8; MCS3 & $N_{ss}$ = 4, 6, 7; MCS4 & $N_{ss}$ = 4, 6, 7, 8; MCS5 & $N_{ss}$ = 2, 3, 6, 7; MCS6 & $N_{ss}$ = 3, 4, 5, 6, 7, 8; MCS7 & $N_{ss}$ = 5, 6, 7, 8; MCS8 & $N_{ss}$ = 2, 3, 4, 5, 6, 7; MCS9 & $N_{ss}$ = 5, 6, 7 |
| 1212 | 31 | MCS1 & $N_{ss}$ = 8; MCS2 & $N_{ss}$ = 8; MCS3 & $N_{ss}$ = 4, 6, 8; MCS4 & $N_{ss}$ = 4, 6, 8; MCS5 & $N_{ss}$ = 2, 3, 4, 6, 8; MCS6 & $N_{ss}$ = 3, 4, 5, 6, 8; MCS7 & $N_{ss}$ = 6, 8; MCS8 & $N_{ss}$ = 2, 3, 4, 5, 6, 8; MCS9 & $N_{ss}$ = 4, 5, 6, 7, 8 |
| 1218 | 29 | MCS0 & $N_{ss}$ = 5, 7; MCS1 & $N_{ss}$ = 7, 8; MCS2 & $N_{ss}$ = 7; MCS3 & $N_{ss}$ = 4, 7, 8; MCS4 & $N_{ss}$ = 6, 7; MCS5 & $N_{ss}$ = 2, 4, 7, 8; MCS6 & $N_{ss}$ = 3, 4, 5, 6, 7; MCS7 & $N_{ss}$ = 6, 7, 8; MCS8 & $N_{ss}$ = 3, 5, 7; MCS9 & $N_{ss}$ = 5, 6, 7, 8 |
| 1224 | 28 | MCS1 & $N_{ss}$ = 8; MCS2 & $N_{ss}$ = 8; MCS3 & $N_{ss}$ = 4, 6, 8; MCS4 & $N_{ss}$ = 4, 6, 8; MCS5 & $N_{ss}$ = 2, 3, 4, 6, 8; MCS6 & $N_{ss}$ = 3, 4, 5, 6, 8; MCS7 & $N_{ss}$ = 8; MCS8 & $N_{ss}$ = 2, 3, 4, 6, 8; MCS9 & $N_{ss}$ = 5, 6, 7, 8 |
| 1230 | 33 | MCS0 & $N_{ss}$ = 5, 7; MCS1 & $N_{ss}$ = 7; MCS2 & $N_{ss}$ = 7, 8; MCS3 & $N_{ss}$ = 6, 7; MCS4 & $N_{ss}$ = 4, 6, 7, 8; MCS5 & $N_{ss}$ = 3, 6, 7, 8; MCS6 & $N_{ss}$ = 3, 4, 5, 6, 7; MCS7 & $N_{ss}$ = 7, 8; MCS8 & $N_{ss}$ = 2, 3, 4, 6, 7, 8; MCS9 & $N_{ss}$ = 5, 6, 7, 8 |
| 1232 | 31 | MCS0 & $N_{ss}$ = 8; MCS1 & $N_{ss}$ = 4, 5, 8; MCS3 & $N_{ss}$ = 2, 4, 5, 8; MCS4 & $N_{ss}$ = 5; MCS5 & $N_{ss}$ = 1, 2, 4, 5, 8; MCS6 & $N_{ss}$ = 5; MCS7 & $N_{ss}$ = 1, 2, 3, 4, 5, 6, 8; MCS8 & $N_{ss}$ = 5; MCS9 & $N_{ss}$ = 1, 2, 3, 4, 5, 6, 7, 8 |
| 1236 | 33 | MCS1 & $N_{ss}$ = 7, 8; MCS2 & $N_{ss}$ = 8; MCS3 & $N_{ss}$ = 4, 6, 7, 8; MCS4 & $N_{ss}$ = 4, 6, 7, 8; MCS5 & $N_{ss}$ = 2, 3, 4, 6, 7, 8; MCS6 & $N_{ss}$ = 3, 4, 5, 6, 7, 8; MCS7 & $N_{ss}$ = 8; MCS8 & $N_{ss}$ = 2, 3, 4, 6, 7, 8; MCS9 & $N_{ss}$ = 6, 7, 8 |
| 1242 | 31 | MCS0 & $N_{ss}$ = 5; MCS1 & $N_{ss}$ = 7, 8; MCS2 & $N_{ss}$ = 8; MCS3 & $N_{ss}$ = 4, 6, 8; MCS4 & $N_{ss}$ = 4, 6, 7, 8; MCS5 & $N_{ss}$ = 2, 3, 4, 6, 7, 8; MCS6 & $N_{ss}$ = 3, 4, 5, 6, 7, 8; MCS8 & $N_{ss}$ = 2, 3, 4, 6, 7, 8; MCS9 & $N_{ss}$ = 7, 8 |
| 1420 | 27 | MCS0 & $N_{ss}$ = 7, 8; MCS1 & $N_{ss}$ = 4, 8; MCS3 & $N_{ss}$ = 2, 4, 5, 8; MCS5 & $N_{ss}$ = 1, 2, 4, 5, 7, 8; MCS7 & $N_{ss}$ = 2, 4, 5, 7, 8; MCS9 & $N_{ss}$ = 1, 2, 3, 4, 5, 6, 7, 8 |
| 1422 | 23 | MCS0 & $N_{ss}$ = 5; MCS1 & $N_{ss}$ = 5, 7; MCS3 & $N_{ss}$ = 5, 7, 8; MCS5 & $N_{ss}$ = 4, 5, 7, 8; MCS7 & $N_{ss}$ = 1, 2, 4, 5, 7, 8; MCS9 & $N_{ss}$ = 2, 3, 4, 5, 6, 7, 8 |
| 1424 | 29 | MCS0 & $N_{ss}$ = 7, 8; MCS1 & $N_{ss}$ = 4, 7, 8; MCS3 & $N_{ss}$ = 2, 4, 5, 7, 8; MCS5 & $N_{ss}$ = 1, 2, 4, 5, 7, 8; MCS7 & $N_{ss}$ = 2, 4, 5, 7, 8; MCS9 & $N_{ss}$ = 1, 2, 3, 4, 5, 6, 7, 8 |
| 1426 | 32 | MCS0 & $N_{ss}$ = 5, 7, 8; MCS1 & $N_{ss}$ = 4, 5, 7, 8; MCS3 & $N_{ss}$ = 2, 4, 5, 7, 8; MCS5 & $N_{ss}$ = 1, 2, 4, 5, 7, 8; MCS7 & $N_{ss}$ = 1, 2, 4, 5, 7, 8; MCS9 & $N_{ss}$ = 1, 2, 3, 4, 5, 6, 7, 8 |
| 1428 | 14 | MCS1 & $N_{ss}$ = 7; MCS3 & $N_{ss}$ = 7, 8; MCS5 & $N_{ss}$ = 4, 7, 8; MCS7 & $N_{ss}$ = 7, 8; MCS9 & $N_{ss}$ = 2, 4, 5, 6, 7, 8 |
| 1430 | 27 | MCS0 & $N_{ss}$ = 5, 7, 8; MCS1 & $N_{ss}$ = 4, 5, 8; MCS3 & $N_{ss}$ = 2, 4, 5; MCS5 & $N_{ss}$ = 1, 2, 5, 7; MCS7 & $N_{ss}$ = 1, 2, 4, 5, 7, 8; MCS9 & $N_{ss}$ = 1, 2, 3, 4, 5, 6, 7, 8 |
| 1432 | 29 | MCS0 & $N_{ss}$ = 7, 8; MCS1 & $N_{ss}$ = 4, 7, 8; MCS3 & $N_{ss}$ = 2, 4, 5, 7, 8; MCS5 & $N_{ss}$ = 1, 2, 4, 5, 7, 8; MCS7 & $N_{ss}$ = 2, 4, 5, 7, 8; MCS9 & $N_{ss}$ = 1, 2, 3, 4, 5, 6, 7, 8 |
| 1434 | 23 | MCS0 & $N_{ss}$ = 5; MCS1 & $N_{ss}$ = 5, 7; MCS3 & $N_{ss}$ = 5, 7, 8; MCS5 & $N_{ss}$ = 4, 5, 7, 8; MCS7 & $N_{ss}$ = 1, 2, 4, 5, 7, 8; MCS9 & $N_{ss}$ = 2, 3, 4, 5, 6, 7, 8 |
| 1436 | 29 | MCS0 & $N_{ss}$ = 7, 8; MCS1 & $N_{ss}$ = 4, 7, 8; MCS3 & $N_{ss}$ = 2, 4, 5, 7, 8; MCS5 & $N_{ss}$ = 1, 2, 4, 5, 7, 8; MCS7 & $N_{ss}$ = 2, 4, 5, 7, 8; MCS9 & $N_{ss}$ = 1, 2, 3, 4, 5, 6, 7, 8 |
| 1438 | 32 | MCS0 & $N_{ss}$ = 5, 7, 8; MCS1 & $N_{ss}$ = 4, 5, 7, 8; MCS3 & $N_{ss}$ = 2, 4, 5, 7, 8; MCS5 & $N_{ss}$ = 1, 2, 4, 5, 7, 8; MCS7 & $N_{ss}$ = 1, 2, 4, 5, 7, 8; MCS9 & $N_{ss}$ = 1, 2, 3, 4, 5, 6, 7, 8 |
| 1440 | 16 | MCS3 & $N_{ss}$ = 5, 8; MCS5 & $N_{ss}$ = 4, 5, 7, 8; MCS7 & $N_{ss}$ = 2, 4, 5, 8; MCS9 & $N_{ss}$ = 2, 3, 4, 5, 6, 8 |
| 1452 | 43 | MCS1 & $N_{ss}$ = 6, 7; MCS2 & $N_{ss}$ = 3, 4, 6, 7; MCS3 & $N_{ss}$ = 3, 5, 7; MCS4 & $N_{ss}$ = 2, 3, 6, 7, 8; MCS5 & $N_{ss}$ = 5, 6, 7; MCS6 & $N_{ss}$ = 1, 2, 3, 4, 5, 6, 8; MCS7 & $N_{ss}$ = 2, 4, 5, 6, 7, 8; MCS8 & $N_{ss}$ = 1, 3, 4, 5, 6, 7; MCS9 & $N_{ss}$ = 2, 3, 4, 5, 6, 7, 8 |
| 1464 | 45 | MCS1 & $N_{ss}$ = 6, 7; MCS2 & $N_{ss}$ = 4, 6, 7; MCS3 & $N_{ss}$ = 3, 5, 7, 8; MCS4 & $N_{ss}$ = 2, 3, 5, 6, 7, 8; MCS5 & $N_{ss}$ = 4, 5, 6, 7, 8; MCS6 & $N_{ss}$ = 2, 3, 4, 5, 6, 7, 8; MCS7 & $N_{ss}$ = 2, 3, 4, 5, 6, 7, 8; MCS8 & $N_{ss}$ = 1, 3, 4, 5, 6, 7; MCS9 & $N_{ss}$ = 3, 4, 5, 6, 8 |
| 1470 | 34 | MCS0 & $N_{ss}$ = 3, 5; MCS1 & $N_{ss}$ = 5; MCS2 & $N_{ss}$ = 1, 3, 5, 7; MCS3 & $N_{ss}$ = 8; MCS4 & $N_{ss}$ = 5, 6, 8; MCS5 & $N_{ss}$ = 4, 6, 8; MCS6 & $N_{ss}$ = 1, 3, 4, 5, 6, 7, 8; MCS7 & $N_{ss}$ = 1, 3, 5, 7; MCS8 & $N_{ss}$ = 3, 4, 6, 7, 8; MCS9 & $N_{ss}$ = 4, 5, 7, 8 |
| 1485 | 40 | MCS0 & $N_{ss}$ = 1, 3, 5, 7; MCS1 & $N_{ss}$ = 5; MCS2 & $N_{ss}$ = 1, 3, 5, 6, 7; MCS3 & $N_{ss}$ = 5; MCS4 & $N_{ss}$ = 3, 6, 8; MCS5 & $N_{ss}$ = 5, 6; MCS6 & $N_{ss}$ = 1, 2, 3, 4, 5, 6, 7, 8; MCS7 & $N_{ss}$ = 1, 2, 4, 5, 6, 8; MCS8 & $N_{ss}$ = 3, 4, 5, 6, 7; MCS9 & $N_{ss}$ = 3, 4, 5, 6, 8 |
| 1488 | 44 | MCS1 & $N_{ss}$ = 6, 7; MCS2 & $N_{ss}$ = 4, 6; MCS3 & $N_{ss}$ = 3, 5, 7; MCS4 & $N_{ss}$ = 2, 3, 5, 6, 7, 8; MCS5 & $N_{ss}$ = 5, 6, 7, 8; MCS6 & $N_{ss}$ = 2, 3, 4, 5, 6, 7, 8; MCS7 & $N_{ss}$ = 2, 3, 4, 5, 6, 7, 8; MCS8 & $N_{ss}$ = 1, 3, 4, 5, 6, 7, 8; MCS9 & $N_{ss}$ = 3, 4, 5, 6, 8 |
| 1491 | 43 | MCS0 & $N_{ss}$ = 1, 3, 5, 7; MCS1 & $N_{ss}$ = 5, 6, 7; MCS2 & $N_{ss}$ = 1, 3, 4, 5, 7; MCS3 & $N_{ss}$ = 3, 7; MCS4 & $N_{ss}$ = 2, 5, 6, 7, 8; MCS5 & $N_{ss}$ = 6, 7, 8; MCS6 & $N_{ss}$ = 1, 3, 4, 5, 6, 7, 8; MCS7 & $N_{ss}$ = 1, 3, 5, 7; MCS8 & $N_{ss}$ = 1, 3, 4, 6, 7, 8; MCS9 & $N_{ss}$ = 4, 5, 7, 8 |
| 1660 | 39 | MCS0 & $N_{ss}$ = 7; MCS1 & $N_{ss}$ = 7, 8; MCS2 & $N_{ss}$ = 3, 6, 7; MCS3 & $N_{ss}$ = 6, 7, 8; MCS4 & $N_{ss}$ = 3, 6, 7, 8; MCS5 & $N_{ss}$ = 2, 4, 6, 7, 8; MCS6 & $N_{ss}$ = 1, 2, 3, 4, 6, 7, 8; MCS7 & $N_{ss}$ = 7, 8; MCS8 & $N_{ss}$ = 3, 4, 6, 7, 8; MCS9 & $N_{ss}$ = 1, 2, 4, 5, 6, 7, 8 |
| 1664 | 45 | MCS0 & $N_{ss}$ = 7; MCS1 & $N_{ss}$ = 6, 7, 8; MCS2 & $N_{ss}$ = 4, 6, 7, 8; MCS3 & $N_{ss}$ = 3, 4, 6, 7; MCS4 & $N_{ss}$ = 2, 3, 4, 6, 7, 8; MCS5 & $N_{ss}$ = 2, 3, 6, 7, 8; MCS6 & $N_{ss}$ = 2, 3, 4, 6, 7, 8; MCS7 & $N_{ss}$ = 7, 8; MCS8 & $N_{ss}$ = 1, 2, 3, 4, 6, 7, 8; MCS9 & $N_{ss}$ = 1, 2, 4, 5, 6, 7, 8 |

TABLE 2-continued

| $N_{data}$ | # exclusions | Exclusions |
|---|---|---|
| 1668 | 45 | MCS1 & $N_{ss}$ = 6, 8; MCS2 & $N_{ss}$ = 3, 4, 6, 8; MCS3 & $N_{ss}$ = 3, 4, 6, 7, 8; MCS4 & $N_{ss}$ = 2, 3, 4, 6, 7, 8; MCS5 & $N_{ss}$ = 2, 3, 4, 6, 7, 8; MCS6 & $N_{ss}$ = 1, 2, 3, 4, 6, 7, 8; MCS7 & $N_{ss}$ = 8; MCS8 & $N_{ss}$ = 1, 2, 3, 4, 6, 7, 8; MCS9 & $N_{ss}$ = 1, 2, 4, 5, 6, 7, 8 |
| 1672 | 38 | MCS0 & $N_{ss}$ = 7; MCS1 & $N_{ss}$ = 6, 7, 8; MCS2 & $N_{ss}$ = 4, 6, 7, 8; MCS3 & $N_{ss}$ = 3, 4, 6, 8; MCS4 & $N_{ss}$ = 2, 3, 4, 6, 7; MCS5 & $N_{ss}$ = 2, 3, 4, 8; MCS6 & $N_{ss}$ = 2, 4, 6, 7, 8; MCS7 & $N_{ss}$ = 8; MCS8 & $N_{ss}$ = 1, 2, 3, 6; MCS9 & $N_{ss}$ = 1, 2, 4, 5, 6, 7, 8 |
| 1680 | 19 | MCS3 & $N_{ss}$ = 7, 8; MCS4 & $N_{ss}$ = 7, 8; MCS5 & $N_{ss}$ = 4, 6, 7, 8; MCS6 & $N_{ss}$ = 3, 7; MCS8 & $N_{ss}$ = 4, 7, 8; MCS9 & $N_{ss}$ = 1, 2, 4, 5, 7, 8 |
| 1688 | 41 | MCS0 & $N_{ss}$ = 7; MCS1 & $N_{ss}$ = 6, 7, 8; MCS2 & $N_{ss}$ = 4, 7, 8; MCS3 & $N_{ss}$ = 3, 4, 6, 7, 8; MCS4 & $N_{ss}$ = 2, 4, 6, 7, 8; MCS5 & $N_{ss}$ = 2, 3, 4, 6, 7, 8; MCS6 & $N_{ss}$ = 3, 4, 6, 7, 8; MCS8 & $N_{ss}$ = 1, 2, 3, 4, 6, 7, 8; MCS9 & $N_{ss}$ = 1, 2, 4, 5, 7, 8 |
| 1692 | 42 | MCS1 & $N_{ss}$ = 6, 8; MCS2 & $N_{ss}$ = 3, 4, 6, 8; MCS3 & $N_{ss}$ = 3, 4, 6, 7, 8; MCS4 & $N_{ss}$ = 2, 3, 4, 6, 7, 8; MCS5 & $N_{ss}$ = 2, 3, 4, 6, 7, 8; MCS6 & $N_{ss}$ = 1, 2, 3, 4, 6, 7, 8; MCS8 & $N_{ss}$ = 1, 2, 3, 4, 6, 7, 8; MCS9 & $N_{ss}$ = 2, 4, 5, 7, 8 |
| 1696 | 41 | MCS0 & $N_{ss}$ = 7; MCS1 & $N_{ss}$ = 6, 7, 8; MCS2 & $N_{ss}$ = 4, 7, 8; MCS3 & $N_{ss}$ = 3, 4, 6, 7, 8; MCS4 & $N_{ss}$ = 2, 4, 6, 7, 8; MCS5 & $N_{ss}$ = 2, 3, 4, 6, 7, 8; MCS6 & $N_{ss}$ = 3, 4, 6, 7, 8; MCS8 & $N_{ss}$ = 1, 2, 3, 4, 6, 7, 8; MCS9 & $N_{ss}$ = 1, 2, 4, 5, 7, 8 |
| 1700 | 30 | MCS0 & $N_{ss}$ = 7; MCS1 & $N_{ss}$ = 7, 8; MCS2 & $N_{ss}$ = 3, 6, 7; MCS3 & $N_{ss}$ = 4, 7, 8; MCS4 & $N_{ss}$ = 3, 8; MCS5 & $N_{ss}$ = 2, 4, 6, 7, 8; MCS6 & $N_{ss}$ = 1, 2, 3, 6, 8; MCS8 & $N_{ss}$ = 4, 6, 8; MCS9 & $N_{ss}$ = 1, 2, 4, 5, 7, 8 |
| 1704 | 37 | MCS1 & $N_{ss}$ = 6, 8; MCS2 & $N_{ss}$ = 4, 8; MCS3 & $N_{ss}$ = 3, 4, 6, 8; MCS4 & $N_{ss}$ = 2, 4, 6, 7, 8; MCS5 & $N_{ss}$ = 2, 3, 4, 6, 7, 8; MCS6 & $N_{ss}$ = 3, 4, 6, 7, 8; MCS8 & $N_{ss}$ = 1, 2, 3, 4, 6, 7, 8; MCS9 & $N_{ss}$ = 1, 2, 4, 5, 7, 8 |
| 1708 | 43 | MCS0 & $N_{ss}$ = 7; MCS1 & $N_{ss}$ = 6, 7; MCS2 & $N_{ss}$ = 3, 4, 6, 7, 8; MCS3 & $N_{ss}$ = 3, 6, 7, 8; MCS4 & $N_{ss}$ = 2, 3, 4, 6, 7, 8; MCS5 & $N_{ss}$ = 3, 4, 6, 7, 8; MCS6 & $N_{ss}$ = 1, 2, 3, 4, 6, 7, 8; MCS8 & $N_{ss}$ = 1, 2, 3, 4, 6, 7, 8; MCS9 & $N_{ss}$ = 1, 2, 4, 5, 7, 8 |
| 1710 | 44 | MCS0 & $N_{ss}$ = 3, 5; MCS1 & $N_{ss}$ = 5, 8; MCS2 & $N_{ss}$ = 1, 3, 5, 6; MCS3 & $N_{ss}$ = 4, 5, 8; MCS4 & $N_{ss}$ = 3, 5, 7; MCS5 & $N_{ss}$ = 2, 4, 5, 7, 8; MCS6 & $N_{ss}$ = 1, 2, 3, 5, 6, 7, 8; MCS7 & $N_{ss}$ = 1, 2, 3, 4, 5, 6, 7, 8; MCS8 & $N_{ss}$ = 5, 6, 7; MCS9 & $N_{ss}$ = 2, 3, 4, 5, 6, 7, 8 |
| 1712 | 41 | MCS0 & $N_{ss}$ = 7; MCS1 & $N_{ss}$ = 6, 7, 8; MCS2 & $N_{ss}$ = 4, 7, 8; MCS3 & $N_{ss}$ = 3, 4, 6, 7, 8; MCS4 & $N_{ss}$ = 2, 4, 6, 7, 8; MCS5 & $N_{ss}$ = 2, 3, 4, 6, 7, 8; MCS6 & $N_{ss}$ = 3, 4, 6, 7, 8; MCS8 & $N_{ss}$ = 1, 2, 3, 4, 6, 7, 8; MCS9 & $N_{ss}$ = 1, 2, 4, 5, 7, 8 |
| 1716 | 33 | MCS1 & $N_{ss}$ = 6, 8; MCS2 & $N_{ss}$ = 3, 4, 6, 8; MCS3 & $N_{ss}$ = 3, 4, 6; MCS4 & $N_{ss}$ = 2, 3, 4, 6, 7, 8; MCS5 & $N_{ss}$ = 2, 3, 6, 7; MCS6 & $N_{ss}$ = 1, 2, 4, 8; MCS8 & $N_{ss}$ = 1, 2, 3, 4, 6, 7; MCS9 & $N_{ss}$ = 1, 5, 7, 8 |
| 1720 | 25 | MCS0 & $N_{ss}$ = 7; MCS1 & $N_{ss}$ = 7, 8; MCS2 & $N_{ss}$ = 7; MCS3 & $N_{ss}$ = 4, 7, 8; MCS4 & $N_{ss}$ = 7; MCS5 & $N_{ss}$ = 2, 4, 7, 8; MCS6 & $N_{ss}$ = 3, 6, 7, 8; MCS8 & $N_{ss}$ = 6, 7, 8; MCS9 & $N_{ss}$ = 1, 2, 4, 5, 7, 8 |
| 1728 | 36 | MCS1 & $N_{ss}$ = 6, 8; MCS2 & $N_{ss}$ = 4, 8; MCS3 & $N_{ss}$ = 3, 4, 6, 8; MCS4 & $N_{ss}$ = 2, 4, 6, 7, 8; MCS5 & $N_{ss}$ = 2, 3, 4, 6, 7, 8; MCS6 & $N_{ss}$ = 3, 4, 6, 7, 8; MCS8 & $N_{ss}$ = 1, 2, 3, 4, 6, 7, 8; MCS9 & $N_{ss}$ = 2, 4, 5, 7, 8 |
| 1740 | 36 | MCS1 & $N_{ss}$ = 8; MCS2 & $N_{ss}$ = 3, 5, 6; MCS3 & $N_{ss}$ = 4, 5, 8; MCS4 & $N_{ss}$ = 3, 5, 7; MCS5 & $N_{ss}$ = 2, 4, 5, 7, 8; MCS6 & $N_{ss}$ = 1, 2, 3, 5, 6, 7; MCS7 & $N_{ss}$ = 2, 3, 4, 5, 8; MCS8 & $N_{ss}$ = 7, 8; MCS9 & $N_{ss}$ = 1, 2, 3, 4, 5, 6, 7, 8 |
| 1745 | 45 | MCS0 & $N_{ss}$ = 1, 3, 5, 7; MCS1 & $N_{ss}$ = 7, 8; MCS2 & $N_{ss}$ = 1, 3, 5, 6, 7; MCS3 & $N_{ss}$ = 4, 5, 7, 8; MCS4 & $N_{ss}$ = 3, 5, 7; MCS5 & $N_{ss}$ = 2, 4, 5, 7, 8; MCS6 & $N_{ss}$ = 1, 2, 3, 5, 6, 7; MCS7 & $N_{ss}$ = 2, 3, 4, 5, 7, 8; MCS8 & $N_{ss}$ = 7, 8; MCS9 & $N_{ss}$ = 1, 2, 3, 4, 5, 6, 7, 8 |
| 1872 | 27 | MCS1 & $N_{ss}$ = 8; MCS2 & $N_{ss}$ = 5, 7, 8; MCS3 & $N_{ss}$ = 4, 6, 8; MCS4 & $N_{ss}$ = 4, 7, 8; MCS5 & $N_{ss}$ = 2, 3, 4, 6, 7, 8; MCS7 & $N_{ss}$ = 5, 7, 8; MCS8 & $N_{ss}$ = 2, 4, 7, 8; MCS9 & $N_{ss}$ = 5, 6, 7, 8 |
| 1896 | 37 | MCS2 & $N_{ss}$ = 5, 7, 8; MCS3 & $N_{ss}$ = 5, 6, 7, 8; MCS4 & $N_{ss}$ = 4, 5, 7, 8; MCS5 & $N_{ss}$ = 3, 4, 5, 6, 7, 8; MCS7 & $N_{ss}$ = 2, 3, 4, 5, 6, 7, 8; MCS8 & $N_{ss}$ = 2, 4, 5, 7, 8; MCS9 & $N_{ss}$ = 1, 2, 3, 4, 5, 6, 7, 8 |
| 1920 | 33 | MCS2 & $N_{ss}$ = 5, 8; MCS3 & $N_{ss}$ = 5, 6, 7; MCS4 & $N_{ss}$ = 4, 5, 7, 8; MCS5 & $N_{ss}$ = 3, 5, 6, 7, 8; MCS7 & $N_{ss}$ = 2, 3, 4, 5, 6, 8; MCS8 & $N_{ss}$ = 2, 4, 5, 7, 8; MCS9 & $N_{ss}$ = 1, 2, 3, 4, 5, 6, 7, 8 |
| 1944 | 33 | MCS2 & $N_{ss}$ = 3, 5, 7, 8; MCS3 & $N_{ss}$ = 6, 7, 8; MCS4 & $N_{ss}$ = 4, 5, 6, 7, 8; MCS5 & $N_{ss}$ = 3, 4, 6, 7, 8; MCS6 & $N_{ss}$ = 1, 3, 4, 5, 6, 7, 8; MCS7 & $N_{ss}$ = 3, 5, 7; MCS8 & $N_{ss}$ = 2, 3, 4, 6, 7, 8 |
| 1960 | 37 | MCS0 & $N_{ss}$ = 5; MCS2 & $N_{ss}$ = 8; MCS3 & $N_{ss}$ = 6, 7, 8; MCS4 & $N_{ss}$ = 4, 6, 8; MCS5 & $N_{ss}$ = 3, 4, 5, 6, 7, 8; MCS6 & $N_{ss}$ = 3, 4, 6, 7, 8; MCS7 & $N_{ss}$ = 4, 5, 7, 8; MCS8 & $N_{ss}$ = 2, 3, 4, 6, 7, 8; MCS9 & $N_{ss}$ = 1, 2, 3, 4, 5, 6, 7, 8 |
| 1968 | 46 | MCS2 & $N_{ss}$ = 3, 5, 7, 8; MCS3 & $N_{ss}$ = 6, 7, 8; MCS4 & $N_{ss}$ = 4, 5, 6, 7, 8; MCS5 & $N_{ss}$ = 3, 4, 5, 6, 7, 8; MCS6 & $N_{ss}$ = 1, 3, 4, 5, 6, 7, 8; MCS7 & $N_{ss}$ = 3, 4, 5, 6, 7, 8; MCS8 & $N_{ss}$ = 2, 3, 4, 5, 6, 7, 8; MCS9 & $N_{ss}$ = 1, 2, 3, 4, 5, 6, 7, 8 |
| 1980 | 27 | MCS0 & $N_{ss}$ = 7; MCS2 & $N_{ss}$ = 5; MCS3 & $N_{ss}$ = 7; MCS4 & $N_{ss}$ = 5, 6; MCS5 & $N_{ss}$ = 5, 7; MCS6 & $N_{ss}$ = 3, 4, 5, 6, 7; MCS7 & $N_{ss}$ = 3, 4, 5, 6, 8; MCS8 & $N_{ss}$ = 3, 5, 7; MCS9 & $N_{ss}$ = 1, 2, 3, 5, 6, 7, 8 |
| 1992 | 40 | MCS2 & $N_{ss}$ = 3, 5, 7; MCS3 & $N_{ss}$ = 7, 8; MCS4 & $N_{ss}$ = 5, 6, 7, 8; MCS5 & $N_{ss}$ = 4, 5, 6, 7, 8; MCS6 & $N_{ss}$ = 1, 3, 4, 5, 6, 7, 8; MCS7 & $N_{ss}$ = 3, 4, 6, 7, 8; MCS8 & $N_{ss}$ = 3, 4, 5, 6, 7, 8; MCS9 & $N_{ss}$ = 1, 2, 3, 4, 5, 6, 7, 8 |

The chart illustrates invalid MCS scenarios for MCS0-MCS9 for spatial streams up to eight spatial streams. MCS validity is defined in the IEEE 802.11ac specification. Generally, the rule for determining whether an MCS is valid is that the number of coded bits per subcarrier must be an integer multiple of the number of encoding streams. Further, the number of coded bits per encoding stream must be an integer multiple of the denominator in the code rate. Accordingly, certain MCS and spatial stream combinations may be invalid when these conditions are not met. Thus, for each potential Ndata value discussed above, a number of exclusions are provided, along with the listing of the various exclusions. In some aspects, it may be beneficial to select a value of Ndata that has a minimum number of exclusions. It may be observed that MCS exclusions for various 2048FFT configurations (which are two 80 MHz 1024FFT tone plans) vary from those of the 1024FFT tone plans. Accordingly, the MCS exclusions for 2048FFT tone plans are listed above.

Figure 29:
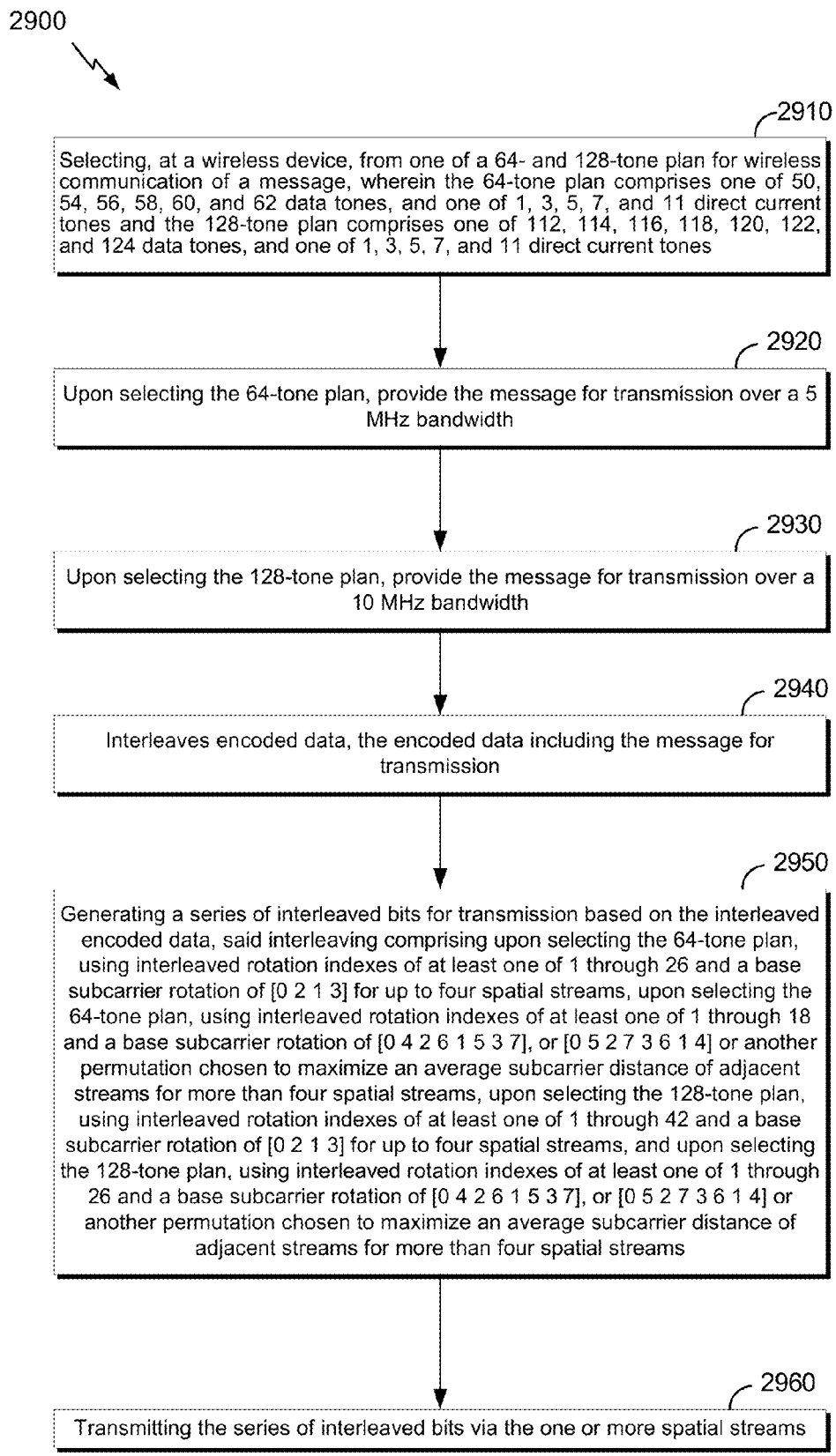
FIG. 29 shows a flowchart for an exemplary method of wireless communication that can be employed within the wireless communication system 100 of FIG. 1.

FIG. 29 shows a flowchart 2900 for an exemplary method of wireless communication that can be employed within the wireless communication system 100 of FIG. 1. The method can be implemented in whole or in part by the devices described herein, such as the AP 104 (FIG. 1), any of the STAs 106A-106D (FIG. 1), the wireless device 202 shown in FIG. 2, the devices 1010, 1020, 1030, or 1040 (FIG. 16). Although the illustrated method is described herein with reference to the wireless communication system 100 discussed above with respect to FIG. 1, the wireless device 202 discussed above with respect to FIG. 2, the system 1000 of FIG. 16, a person having ordinary skill in the art will appreciate that the illustrated method can be implemented by another device described herein, or any other suitable device. Although the illustrated method is described herein with reference to a particular order, in various embodiments, blocks herein can be performed in a different order, or omitted, and additional blocks can be added.

First, at block 2910, a wireless device selects from one of a 64- and 128-tone plan for wireless communication of a message, wherein the 64-tone plan comprises one of 50, 54, 56, 58, 60, and 62 data tones, and one of 1, 3, 5, 7, and 11 direct current tones and the 128-tone plan comprises one of 110, 112, 114, 116, 118, 120, 122, and 124 data tones, and one of 1, 3, 5, 7, and 11 direct current tones. For example, the AP 104 can select from one of the tone plans discussed above with respect to FIGS. 18 and 19. In some aspects, the means for selecting may be a processor.

At block 2920, the wireless device is configured to, upon selecting the 64-tone plan, provide the message for transmission over a 5 MHz bandwidth. For example, the AP 104 can provide the message to the transmitter 210 for transmission over the antenna 216 according to the 64-tone plan. In various embodiments, the 64-tone plan can be applied to a 5 MHz system having a 4× symbol duration. In various embodiments, other bandwidths and/or symbol durations can be used. In some aspects, the means for providing may include a processor.

At block 2930, the wireless device is configured to, upon selecting the 128-tone plan, provide the message for transmission over a 10 MHz bandwidth. For example, the AP 104 can provide the message to the transmitter 210 for transmission over the antenna 216 according to the 128-tone plan. In various embodiments, the 128-tone plan can be applied to a 10 MHz system having a 4× symbol duration. In various embodiments, other bandwidths and/or symbol durations can be used. In some aspects, the means for providing may include a processor.

At block 2940, the wireless device interleaves the encoded data, the encoded data including the message for transmission. In some aspects, the means for interleaving includes an interleaver.

At block 2950, the wireless device is configured to generate a series of interleaved bits for transmission based on the interleaved encoded data, said interleaving comprising upon selecting the 64-tone plan, using interleaved rotation indexes of at least one of 1 through 26 and a base subcarrier rotation of [0 2 1 3] for up to four spatial streams, upon selecting the 64-tone plan, using interleaved rotation indexes of at least one of 1 through 18 and a base subcarrier rotation of [0 4 2 6 1 5 3 7], or [0 5 2 7 3 6 1 4] or another permutation chosen to maximize an average subcarrier distance of adjacent streams for more than four spatial streams, upon selecting the 128-tone plan, using interleaved rotation indexes of at least one of 1 through 42 and a base subcarrier rotation of [0 2 1 3] for up to four spatial streams, and upon selecting the 128-tone plan, using interleaved rotation indexes of at least one of 1 through 26 and a base subcarrier rotation of [0 4 2 6 1 5 3 7], or [0 5 2 7 3 6 1 4] or another permutation chosen to maximize an average subcarrier distance of adjacent streams for more than four spatial streams. In some aspects, the means for generating the series of interleaved bits may include an interleaver.

At block 2960, the wireless device is configured to transmit the series of interleaved bits via the one or more spatial streams. In some aspects, the means for transmitting the interleaved bits includes a transmitter.

Figure 30:
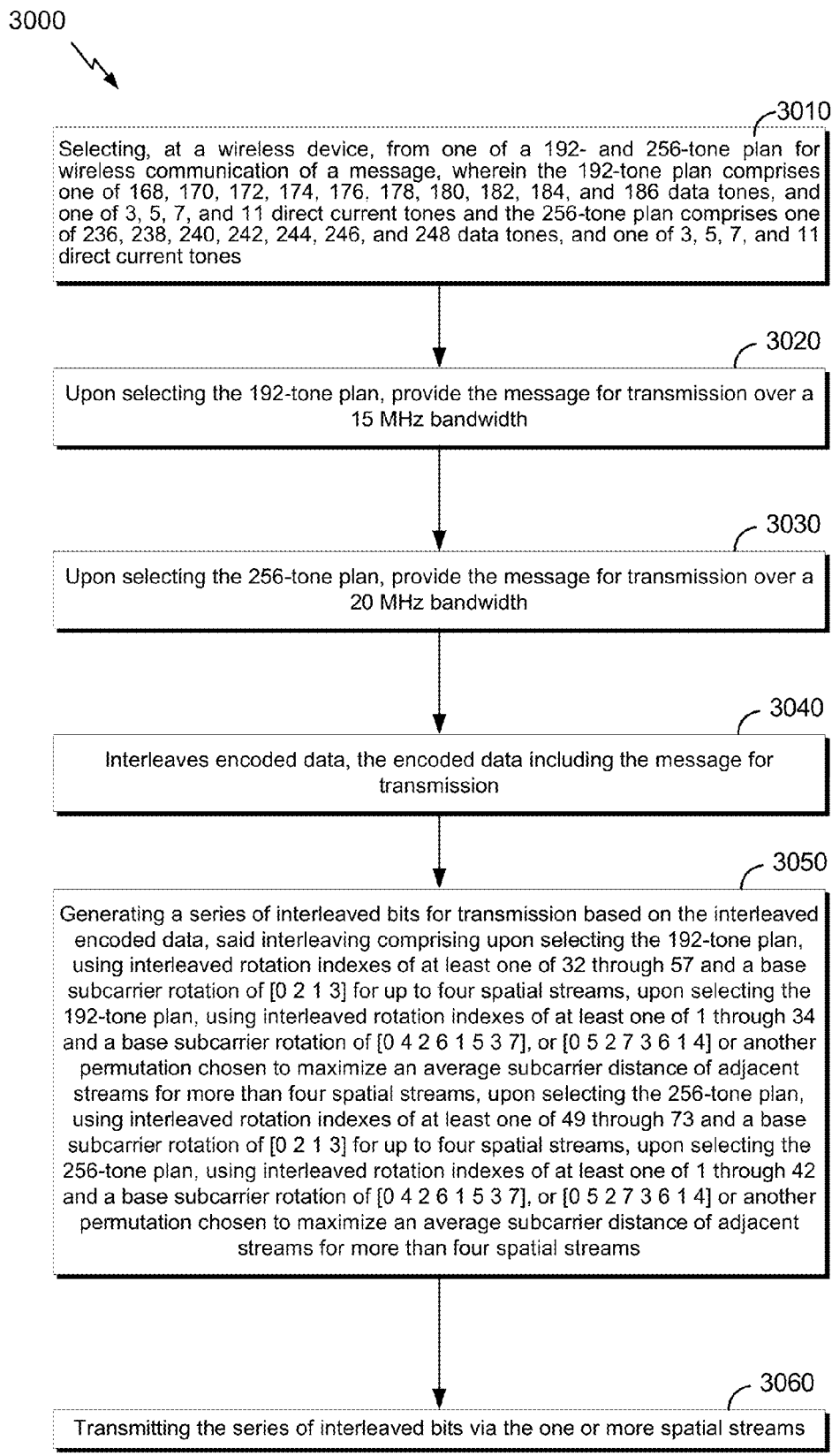
FIG. 30 shows a flowchart for another exemplary method of wireless communication that can be employed within the wireless communication system 100 of FIG. 1.

FIG. 30 shows a flowchart 3000 for an exemplary method of wireless communication that can be employed within the wireless communication system 100 of FIG. 1. The method can be implemented in whole or in part by the devices described herein, such as the AP 104 (FIG. 1), any of the STAs 106A-106D (FIG. 1), the wireless device 202 shown in FIG. 2, the devices 1010, 1020, 1030, or 1040 (FIG. 16). Although the illustrated method is described herein with reference to the wireless communication system 100 discussed above with respect to FIG. 1, the wireless device 202 discussed above with respect to FIG. 2, the system 1000 of FIG. 16, a person having ordinary skill in the art will appreciate that the illustrated method can be implemented by another device described herein, or any other suitable device. Although the illustrated method is described herein with reference to a particular order, in various embodiments, blocks herein can be performed in a different order, or omitted, and additional blocks can be added.

First, at block 3010, a wireless device selects from one of a 192- and 256-tone plan for wireless communication of a message, wherein the 192-tone plan comprises one of 168, 170, 172, 174, 176, 178, 180, 182, 184, and 186 data tones, and one of 3, 5, 7, and 11 direct current tones and the 256-tone plan comprises one of 236, 238, 240, 242, 244, 246, and 248 data tones, and one of 3, 5, 7, and 11 direct current tones. For example, the AP 104 can select from one of the tone plans discussed above with respect to FIGS. 20 and 21. In some aspects, the means for selecting may be a processor.

At block 3020, the wireless device is configured to, upon selecting the 192-tone plan, provide the message for transmission over a 15 MHz bandwidth. For example, the AP 104 can provide the message to the transmitter 210 for transmission over the antenna 216 according to the 192-tone plan. In various embodiments, the 192-tone plan can be applied to a 15 MHz system having a 4× symbol duration. In various embodiments, other bandwidths and/or symbol durations can be used. In some aspects, the means for providing may include a processor.

At block 3030, the wireless device is configured to, upon selecting the 256-tone plan, provide the message for transmission over a 20 MHz bandwidth. For example, the AP 104 can provide the message to the transmitter 210 for transmission over the antenna 216 according to the 256-tone plan. In various embodiments, the 256-tone plan can be applied to a 20 MHz system having a 4× symbol duration. In various embodiments, other bandwidths and/or symbol durations can be used. In some aspects, the means for providing may include a processor.

At block 3040, the wireless device interleaves the encoded data, the encoded data including the message for transmission. In some aspects, the means for interleaving includes an interleaver.

At block 3050, the wireless device is configured to generate a series of interleaved bits for transmission based on the interleaved encoded data, said interleaving comprising upon selecting the 192-tone plan, using interleaved rotation indexes of at least one of 32 through 57 and a base subcarrier rotation of [0 2 1 3] for up to four spatial streams, upon selecting the 192-tone plan, using interleaved rotation indexes of at least one of 1 through 34 and a base subcarrier rotation of [0 4 2 6 1 5 3 7], or [0 5 2 7 3 6 1 4] or another permutation chosen to maximize an average subcarrier distance of adjacent streams for more than four spatial streams, upon selecting the 256-tone plan, using interleaved rotation indexes of at least one of 49 through 73 and a base subcarrier rotation of [0 2 1 3] for up to four spatial streams, upon selecting the 256-tone plan, using interleaved rotation indexes of at least one of 1 through 42 and a base subcarrier rotation of [0 4 2 6 1 5 3 7], or [0 5 2 7 3 6 1 4] or another permutation chosen to maximize an average subcarrier distance of adjacent streams for more than four spatial streams. In some aspects, the means for generating the series of interleaved bits may include an interleaver.

At block 3060, the wireless device is configured to transmit the series of interleaved bits via the one or more spatial streams. In some aspects, the means for transmitting the interleaved bits includes a transmitter.

Figure 31:
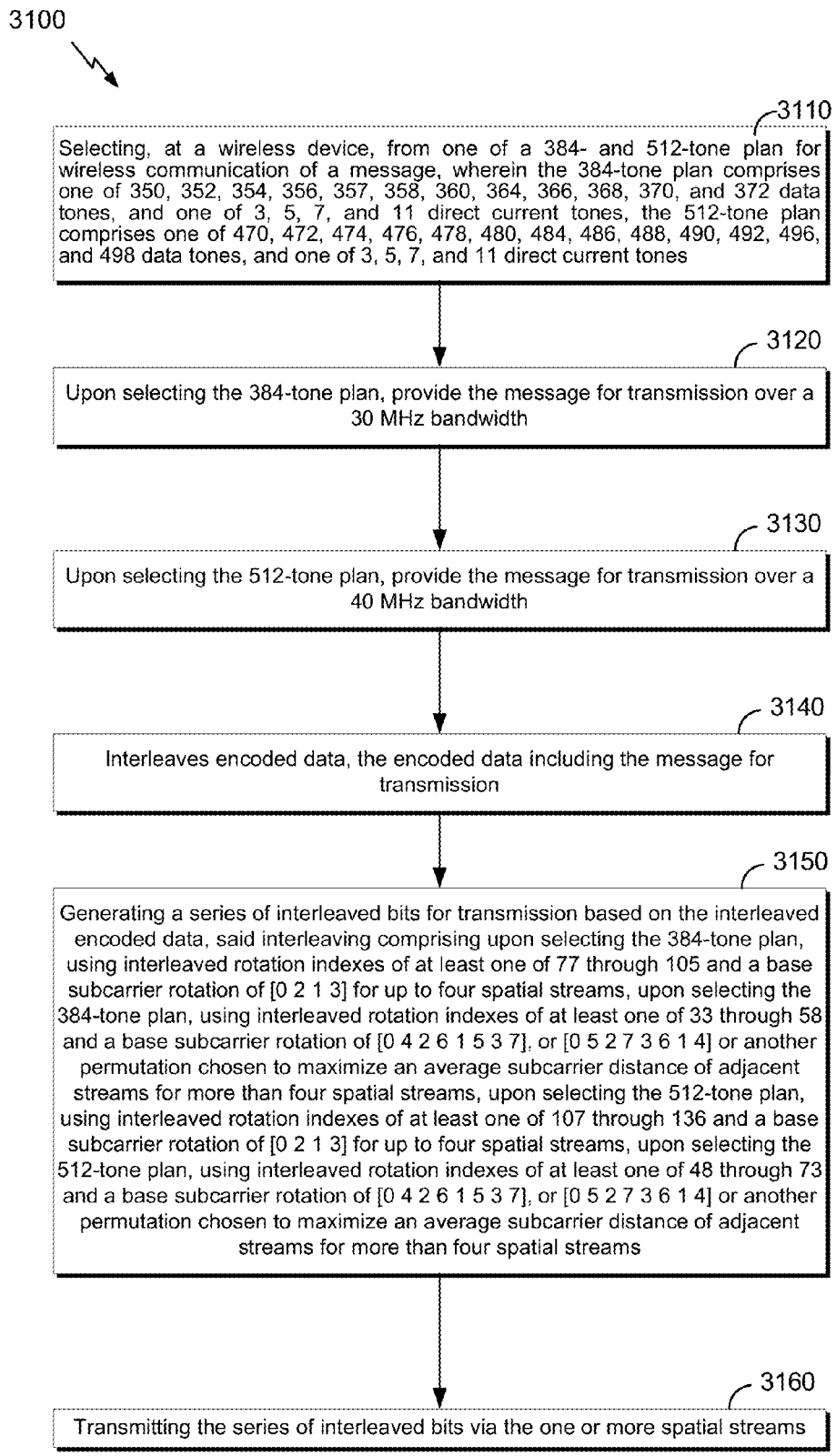
FIG. 31 shows a flowchart for another exemplary method of wireless communication that can be employed within the wireless communication system 100 of FIG. 1.

FIG. 31 shows a flowchart 3100 for an exemplary method of wireless communication that can be employed within the wireless communication system 100 of FIG. 1. The method can be implemented in whole or in part by the devices described herein, such as the AP 104 (FIG. 1), any of the STAs 106A-106D (FIG. 1), the wireless device 202 shown in FIG. 2, the devices 1010, 1020, 1030, or 1040 (FIG. 16). Although the illustrated method is described herein with reference to the wireless communication system 100 discussed above with respect to FIG. 1, the wireless device 202 discussed above with respect to FIG. 2, the system 1000 of FIG. 16, a person having ordinary skill in the art will appreciate that the illustrated method can be implemented by another device described herein, or any other suitable device. Although the illustrated method is described herein with reference to a particular order, in various embodiments, blocks herein can be performed in a different order, or omitted, and additional blocks can be added.

First, at block 3110, a wireless device selects from one of a 384- and 512-tone plan for wireless communication of a message, wherein the 384-tone plan comprises one of 350, 352, 354, 356, 357, 358, 360, 364, 366, 368, 370, and 372 data tones, and one of 3, 5, 7, and 11 direct current tones, the 512-tone plan comprises one of 470, 472, 474, 476, 478, 480, 484, 486, 488, 490, 492, 496, and 498 data tones, and one of 3, 5, 7, and 11 direct current tones. For example, the AP 104 can select from one of the tone plans discussed above with respect to FIGS. 22 and 23. In some aspects, the means for selecting may be a processor.

At block 3120, the wireless device is configured to, upon selecting the 384-tone plan, provide the message for transmission over a 30 MHz bandwidth. For example, the AP 104 can provide the message to the transmitter 210 for transmission over the antenna 216 according to the 384-tone plan. In various embodiments, the 384-tone plan can be applied to a 30 MHz system having a 4× symbol duration. In various embodiments, other bandwidths and/or symbol durations can be used. In some aspects, the means for providing may include a processor.

At block 3130, the wireless device is configured to, upon selecting the 512-tone plan, provide the message for transmission over a 40 MHz bandwidth. For example, the AP 104 can provide the message to the transmitter 210 for transmission over the antenna 216 according to the 512-tone plan. In various embodiments, the 512-tone plan can be applied to a 40 MHz system having a 4× symbol duration. In various embodiments, other bandwidths and/or symbol durations can be used. In some aspects, the means for providing may include a processor.

At block 3140, the wireless device interleaves the encoded data, the encoded data including the message for transmission. In some aspects, the means for interleaving includes an interleaver.

At block 3150, the wireless device is configured to generate a series of interleaved bits for transmission based on the interleaved encoded data, said interleaving comprising upon selecting the 384-tone plan, using interleaved rotation indexes of at least one of 77 through 105 and a base subcarrier rotation of [0 2 1 3] for up to four spatial streams, upon selecting the 384-tone plan, using interleaved rotation indexes of at least one of 33 through 58 and a base subcarrier rotation of [0 4 2 6 1 5 3 7], or [0 5 2 7 3 6 1 4] or another permutation chosen to maximize an average subcarrier distance of adjacent streams for more than four spatial streams, upon selecting the 512-tone plan, using interleaved rotation indexes of at least one of 107 through 136 and a base subcarrier rotation of [0 2 1 3] for up to four spatial streams, upon selecting the 512-tone plan, using interleaved rotation indexes of at least one of 48 through 73 and a base subcarrier rotation of [0 4 2 6 1 5 3 7], or [0 5 2 7 3 6 1 4] or another permutation chosen to maximize an average subcarrier distance of adjacent streams for more than four spatial streams. In some aspects, the means for generating the series of interleaved bits may include an interleaver.

At block 3160, the wireless device is configured to transmit the series of interleaved bits via the one or more spatial streams. In some aspects, the means for transmitting the interleaved bits includes a transmitter.

Figure 32:
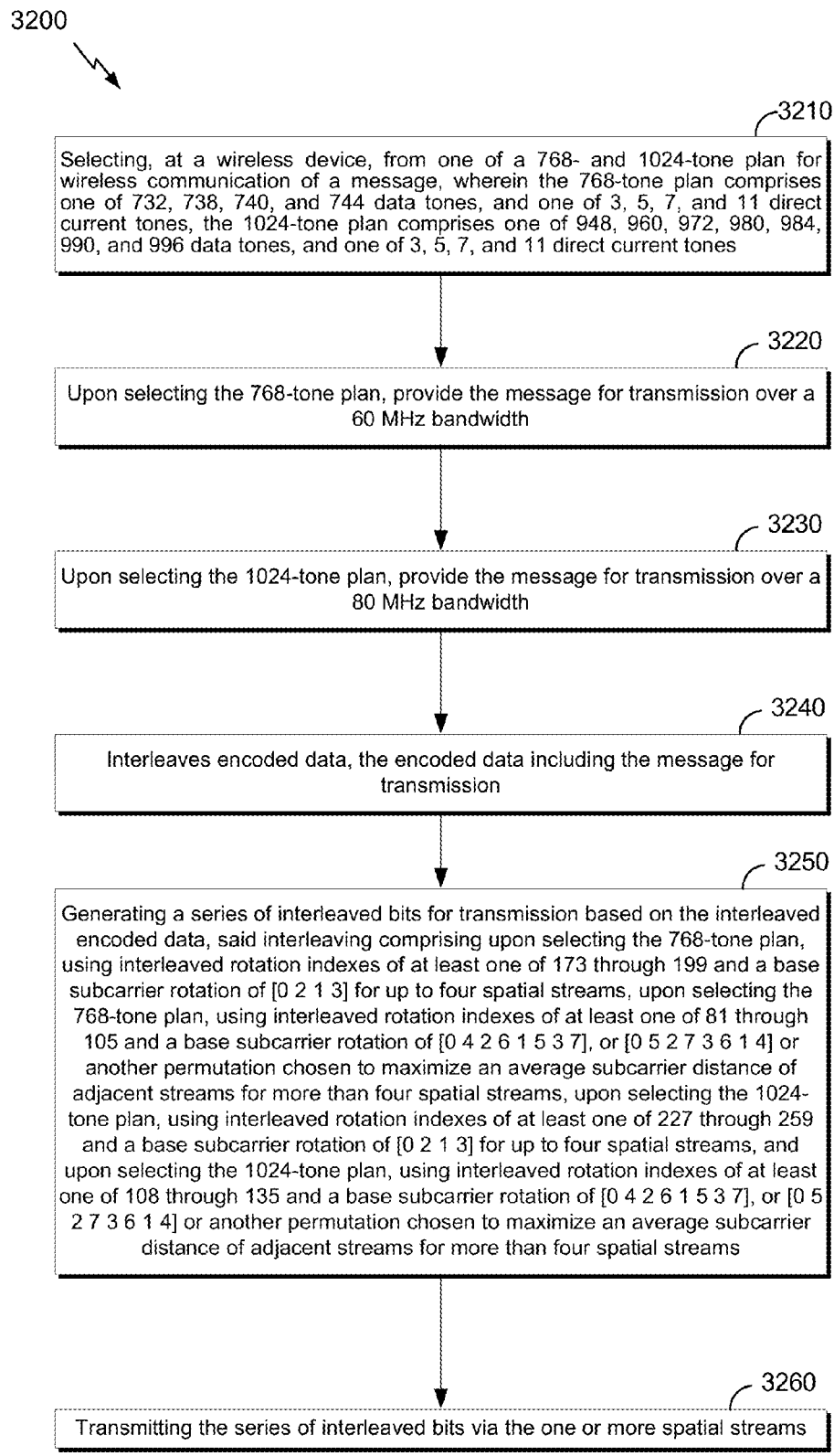
FIG. 32 shows a flowchart for another exemplary method of wireless communication that can be employed within the wireless communication system 100 of FIG. 1.

FIG. 32 shows a flowchart 3200 for an exemplary method of wireless communication that can be employed within the wireless communication system 100 of FIG. 1. The method can be implemented in whole or in part by the devices described herein, such as the AP 104 (FIG. 1), any of the STAs 106A-106D (FIG. 1), the wireless device 202 shown in FIG. 2, the devices 1010, 1020, 1030, or 1040 (FIG. 16). Although the illustrated method is described herein with reference to the wireless communication system 100 discussed above with respect to FIG. 1, the wireless device 202 discussed above with respect to FIG. 2, the system 1000 of FIG. 16, a person having ordinary skill in the art will appreciate that the illustrated method can be implemented by another device described herein, or any other suitable device. Although the illustrated method is described herein with reference to a particular order, in various embodiments, blocks herein can be performed in a different order, or omitted, and additional blocks can be added.

First, at block 3210, a wireless device selects Selecting, at a wireless device, from one of a 768- and 1024-tone plan for wireless communication of a message, wherein the 768-tone plan comprises one of 732, 738, 740, and 744 data tones, and one of 3, 5, 7, and 11 direct current tones, the 1024-tone plan comprises one of 936, 948, 960, 972, 980, 984, 990, and 996 data tones, and one of 3, 5, 7, and 11 direct current tones. For example, the AP 104 can select from one of the tone plans discussed above with respect to FIGS. 24 and 25. In some aspects, the means for selecting may be a processor.

At block 3220, the wireless device is configured to, upon selecting the 768-tone plan, provide the message for transmission over a 60 MHz bandwidth. For example, the AP 104 can provide the message to the transmitter 210 for transmission over the antenna 216 according to the 768-tone plan. In various embodiments, the 768-tone plan can be applied to a 60 MHz system having a 4× symbol duration. In various embodiments, other bandwidths and/or symbol durations can be used. In some aspects, the means for providing may include a processor.

At block 3230, the wireless device is configured to, upon selecting the 1024-tone plan, provide the message for transmission over a 80 MHz bandwidth. For example, the AP 104 can provide the message to the transmitter 210 for transmission over the antenna 216 according to the 1024-tone plan. In various embodiments, the 1024-tone plan can be applied to a 80 MHz system having a 4× symbol duration. In various embodiments, other bandwidths and/or symbol durations can be used. In some aspects, the means for providing may include a processor.

At block 3240, the wireless device interleaves the encoded data, the encoded data including the message for transmission. In some aspects, the means for interleaving includes an interleaver.

At block 3250, the wireless device is configured to generate a series of interleaved bits for transmission based on the interleaved encoded data, said interleaving comprising upon selecting the 768-tone plan, using interleaved rotation indexes of at least one of 173 through 199 and a base subcarrier rotation of [0 2 1 3] for up to four spatial streams, upon selecting the 768-tone plan, using interleaved rotation indexes of at least one of 81 through 105 and a base subcarrier rotation of [0 4 2 6 1 5 3 7], or [0 5 2 7 3 6 1 4] or another permutation chosen to maximize an average subcarrier distance of adjacent streams for more than four spatial streams, upon selecting the 1024-tone plan, using interleaved rotation indexes of at least one of 227 through 259 and a base subcarrier rotation of [0 2 1 3] for up to four spatial streams, and upon selecting the 1024-tone plan, using interleaved rotation indexes of at least one of 108 through 135 and a base subcarrier rotation of [0 4 2 6 1 5 3 7], or [0 5 2 7 3 6 1 4] or another permutation chosen to maximize an average subcarrier distance of adjacent streams for more than four spatial streams. In some aspects, the means for generating the series of interleaved bits may include an interleaver.

At block 3260, the wireless device is configured to transmit the series of interleaved bits via the one or more spatial streams. In some aspects, the means for transmitting the interleaved bits includes a transmitter.

Figure 33:
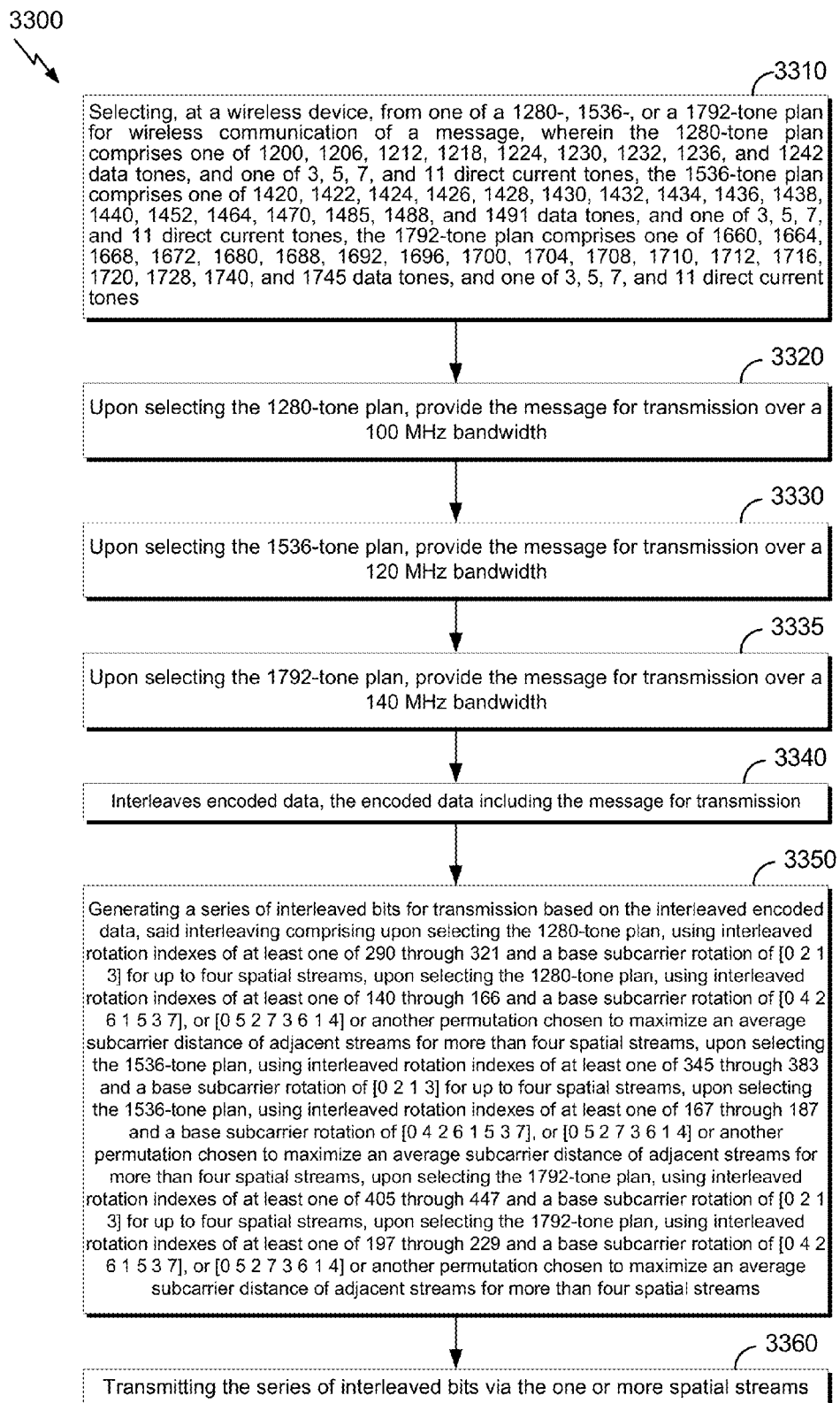
FIG. 33 shows a flowchart for another exemplary method of wireless communication that can be employed within the wireless communication system 100 of FIG. 1.

FIG. 33 shows a flowchart 3300 for an exemplary method of wireless communication that can be employed within the wireless communication system 100 of FIG. 1. The method can be implemented in whole or in part by the devices described herein, such as the AP 104 (FIG. 1), any of the STAs 106A-106D (FIG. 1), the wireless device 202 shown in FIG. 2, the devices 1010, 1020, 1030, or 1040 (FIG. 16). Although the illustrated method is described herein with reference to the wireless communication system 100 discussed above with respect to FIG. 1, the wireless device 202 discussed above with respect to FIG. 2, the system 1000 of FIG. 16, a person having ordinary skill in the art will appreciate that the illustrated method can be implemented by another device described herein, or any other suitable device. Although the illustrated method is described herein with reference to a particular order, in various embodiments, blocks herein can be performed in a different order, or omitted, and additional blocks can be added.

First, at block 3310, a wireless device selects from one of a 1280-, 1536-, or a 1792-tone plan for wireless communication of a message, wherein the 1280-tone plan comprises one of 1200, 1206, 1212, 1218, 1224, 1230, 1232, 1236, and 1242 data tones, and one of 3, 5, 7, and 11 direct current tones, the 1536-tone plan comprises one of 1420, 1422, 1424, 1426, 1428, 1430, 1432, 1434, 1436, 1438, 1440, 1452, 1464, 1470, 1485, 1488, and 1491 data tones, and one of 3, 5, 7, and 11 direct current tones, the 1792-tone plan comprises one of 1660, 1664, 1668, 1672, 1680, 1688, 1692, 1696, 1700, 1704, 1708, 1710, 1712, 1716, 1720, 1728, 1740, and 1745 data tones, and one of 3, 5, 7, and 11 direct current tones. For example, the AP 104 can select from one of the tone plans discussed above with respect to FIGS. 26-28. In some aspects, the means for selecting may be a processor.

At block 3320, the wireless device is configured to, upon selecting the 1280-tone plan, provide the message for transmission over a 100 MHz bandwidth. For example, the AP 104 can provide the message to the transmitter 210 for transmission over the antenna 216 according to the 1280-tone plan. In various embodiments, the 1280-tone plan can be applied to a 100 MHz system having a 4× symbol duration. In various embodiments, other bandwidths and/or symbol durations can be used. In some aspects, the means for providing may include a processor.

At block 3330, the wireless device is configured to, upon selecting the 1536-tone plan, provide the message for transmission over a 120 MHz bandwidth. For example, the AP 104 can provide the message to the transmitter 210 for transmission over the antenna 216 according to the 1536-tone plan. In various embodiments, the 1536-tone plan can be applied to a 120 MHz system having a 4× symbol duration. In various embodiments, other bandwidths and/or symbol durations can be used. In some aspects, the means for providing may include a processor.

At block 3335, the wireless device is configured to, upon selecting the 1792-tone plan, provide the message for transmission over a 140 MHz bandwidth. For example, the AP 104 can provide the message to the transmitter 210 for transmission over the antenna 216 according to the 1792-tone plan. In various embodiments, the 1792-tone plan can be applied to a 140 MHz system having a 4× symbol duration. In various embodiments, other bandwidths and/or symbol durations can be used. In some aspects, the means for providing may include a processor.

At block 3340, the wireless device interleaves the encoded data, the encoded data including the message for transmission. In some aspects, the means for interleaving includes an interleaver.

At block 3350, the wireless device is configured to generate a series of interleaved bits for transmission based on the interleaved encoded data, said interleaving comprising upon selecting the 1280-tone plan, using interleaved rotation indexes of at least one of 290 through 321 and a base subcarrier rotation of [0 2 1 3] for up to four spatial streams, upon selecting the 1280-tone plan, using interleaved rotation indexes of at least one of 140 through 166 and a base subcarrier rotation of [0 4 2 6 1 5 3 7], or [0 5 2 7 3 6 1 4] or another permutation chosen to maximize an average subcarrier distance of adjacent streams for more than four spatial streams, upon selecting the 1536-tone plan, using interleaved rotation indexes of at least one of 345 through 383 and a base subcarrier rotation of [0 2 1 3] for up to four spatial streams, upon selecting the 1536-tone plan, using interleaved rotation indexes of at least one of 167 through 187 and a base subcarrier rotation of [0 4 2 6 1 5 3 7], or [0 5 2 7 3 6 1 4] or another permutation chosen to maximize an average subcarrier distance of adjacent streams for more than four spatial streams, upon selecting the 1792-tone plan, using interleaved rotation indexes of at least one of 405 through 447 and a base subcarrier rotation of [0 2 1 3] for up to four spatial streams, upon selecting the 1792-tone plan, using interleaved rotation indexes of at least one of 197 through 229 and a base subcarrier rotation of [0 4 2 6 1 5 3 7], or [0 5 2 7 3 6 1 4] or another permutation chosen to maximize an average subcarrier distance of adjacent streams for more than four spatial streams. In some aspects, the means for generating the series of interleaved bits may include an interleaver.

At block 3360, the wireless device is configured to transmit the series of interleaved bits via the one or more spatial streams. In some aspects, the means for transmitting the interleaved bits includes a transmitter.

In an embodiment, the methods shown in FIGS. 29-33 can be implemented in a wireless device that can include a selecting circuit, a providing circuit, and a interleaving circuit. Those skilled in the art will appreciate that a wireless device can have more components than the simplified wireless device described herein. The wireless device described herein includes only those components useful for describing some prominent features of implementations within the scope of the claims.

The selecting circuit can be configured to selecting the tone plan for wireless communication of the message. In an embodiment, the selecting circuit can be configured to implement block 1110 of the flowchart 1100 (FIG. 17). The selecting circuit can include one or more of the DSP 220 (FIG. 2), the processor 204 (FIG. 2), and the memory 206 (FIG. 2). In some implementations, means for selecting can include the selecting circuit.

The providing circuit can be configured to provide the message for transmission according to the selected tone plan. In an embodiment, the providing circuit can be configured to implement any of blocks 1120-1130 of the flowchart 1100 (FIG. 17). The providing circuit can include one or more of the transmitter 210 (FIG. 2), the transceiver 214 (FIG. 2), the processor 206 (FIG. 2), the DSP 220 (FIG. 2), and the memory 204 (FIG. 2). In some implementations, means for providing can include the providing circuit.

The interleaving circuit can be configured to interleave data for transmission. The interleaving circuit can include one or more of the interleaving system 1014 (FIG. 16), the stream parser 1106 (FIG. 17), any of the interleavers 1108A-1108C (FIG. 17), the processor 206 (FIG. 2), the DSP 220 (FIG. 2), and the memory 204 (FIG. 2). In some implementations, means for interleaving can include the interleaving circuit.

In some aspects, a data transmission that uses 512 tones, such as a 40 MHz transmission, may need only 10 pilot tones rather than 12 pilot tones. Further, in some aspects, MCS exclusions may be calculated based upon using transmissions with a 4× symbol duration (compared to the symbol duration used in IEEE 802.11ac, symbols may be transmitted with a 4× longer duration). Finally, in some aspects, it may be desirable to provide tone plans for FFTs of 2048 tones, which may correspond with a transmission over 160 MHz.

FIG. 34 is an illustration of the upper bounds for the number of data tones in a number of different transmissions. For example, a transmission with an FFT size of 512 may use 3, 5, 7, or 11 DC tones, 11 guard tones, and 10 pilot tones. Accordingly, such a transmission may include a maximum of 488, 486, 484, or 480 data tones, respectively, for the various number of DC tones that may be included in such a transmission. In some aspects, certain other values on this table may correspond with those found in FIG. 4, but may reflect a 512-tone transmission that includes only 10 pilot tones rather than 12 pilot tones.

FIG. 35 shows upper bounds for 32-tone, 2.5 MHz tone plans according to various embodiments. Generally, these tone allocations may be transmitted to a user as a part of a larger transmission, such as a 20 MHz or larger transmission. For example, a single user may be allocated 2.5 MHz out of a 20 MHz transmission. Accordingly, it would be desirable to determine how many data tones a user may have when allocated 2.5 MHz.

In a 20 MHz OFDMA transmission, the number of data tones in a 2.5 MHz portion when there are 3 DC tones may be Floor(234/8)=29. In this calculation, 234 is the upper bound of Ndata in a 20 MHz transmission with 3 DC tones, as shown in FIG. 34. Accordingly, each of the eight 2.5 MHz portions of the 20 MHz transmission may have up to one-eighth, rounded down, data tones. In a 20 MHz OFDMA transmission, the number of data tones in a 2.5 MHz portion when there are 5 DC tones may be Floor(232/8)=29. In a 20 MHz OFDMA transmission, the number of data tones in a 2.5 MHz portion when there are 7 DC tones may be Floor(230/8)=28.

In a 40 MHz OFDMA transmission, the number of data tones in a 2.5 MHz portion when there are 3 DC tones may be Floor(488/16)=30. In a 40 MHz OFDMA transmission, the number of data tones in a 2.5 MHz portion when there are 5 DC tones may be Floor(486/16)=30. In a 40 MHz OFDMA transmission, the number of data tones in a 2.5 MHz portion when there are 7 DC tones may be Floor(484/16)=30. In a 40 MHz OFDMA transmission, the number of data tones in a 2.5 MHz portion when there are 11 DC tones may be Floor(480/16)=30.

In a 80 or 160 MHz OFDMA transmission, the number of data tones in a 2.5 MHz portion when there are 3 DC tones may be Floor(998/32)=31. In a 80 or 160 MHz OFDMA transmission, the number of data tones in a 2.5 MHz portion when there are 5 DC tones may be Floor(996/32)=31. In a 80 or 160 MHz OFDMA transmission, the number of data tones in a 2.5 MHz portion when there are 7 DC tones may be Floor(994/32)=31. In a 80 or 160 MHz OFDMA transmission, the number of data tones in a 2.5 MHz portion when there are 11 DC tones may be Floor(990/32)=30. Accordingly, the unified upper bound for a 64-tone transmission may be 31 data tones. This is the highest number of data tones possible, in any of the listed configurations.

Generally, when a single device is assigned a 2.5 MHz portion of a transmission, that device may receive data tones from one 32-tone portion of the spectrum. Accordingly, interleaver parameters for a number of data tones provided to the device in that portion may be desired.

FIG. 47 is a chart illustrating candidate interleaver parameters for different numbers of data tones, according to a 32-tone plan embodiment. In a particular embodiment, the interleaver depth (e.g., the number of columns (Ncol)) can be a factor of the number of data tones (Ndata). In various embodiments, a 20 data tone block can have an interleaver depth of 2, 4, 5, or 10. In various embodiments, a 22 data tone block can have an interleaver depth of 2 or 11. In various embodiments, a 26 data tone block can have an interleaver depth of 2 or 13. In various embodiments, a 28 data tone block can have an interleaver depth of 2, 4, 7, or 14.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 1-17. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 1-14. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes (or increases) average subcarrier distance of adjacent streams may be used, and [0 5 2 7 3 6 1 4] is only one example.

FIG. 36 shows upper bounds for 64-tone, 5 MHz tone plans according to various embodiments. For example, with a single user, if 1 DC tones is used, there may be 52 data tones. If 3 DC tones are used, there may be 50 data tones for a single user. If 5 DC tones are used, there may be 48 data tones for a single user. If 7 DC tones are used, there may be 46 data tones for a single user. In an OFDMA transmission with a different total bandwidth, the number of data tones which may use may be different. In a 20 MHz OFDMA transmission, the number of data tones in a 5 MHz portion when there are 3 DC tones may be Floor(234/4)=58. In this calculation, 234 is the upper bound of Ndata in a 20 MHz transmission with 3 DC tones, as shown in FIG. 4. Accordingly, each of the four 5 MHz portions of the 20 MHz transmission may have up to one-quarter, rounded down, data tones. In a 20 MHz OFDMA transmission, the number of data tones in a 5 MHz portion when there are 5 DC tones may be Floor(232/4)=58. In a 20 MHz OFDMA transmission, the number of data tones in a 5 MHz portion when there are 7 DC tones may be Floor(230/4)=57.

In a 40 MHz OFDMA transmission, the number of data tones in a 5 MHz portion when there are 3 DC tones may be Floor(488/8)=61. In a 40 MHz OFDMA transmission, the number of data tones in a 5 MHz portion when there are 5 DC tones may be Floor(486/8)=60. In a 40 MHz OFDMA transmission, the number of data tones in a 5 MHz portion when there are 7 DC tones may be Floor(484/8)=60. In a 40 MHz OFDMA transmission, the number of data tones in a 5 MHz portion when there are 11 DC tones may be Floor(480/8)=60.

In a 80 or 160 MHz OFDMA transmission, the number of data tones in a 5 MHz portion when there are 3 DC tones may be Floor(998/16)=62. In a 80 or 160 MHz OFDMA transmission, the number of data tones in a 5 MHz portion when there are 5 DC tones may be Floor(996/16)=62. In a 80 or 160 MHz OFDMA transmission, the number of data tones in a 5 MHz portion when there are 7 DC tones may be Floor(994/16)=62. In a 80 or 160 MHz OFDMA transmission, the number of data tones in a 5 MHz portion when there are 11 DC tones may be Floor(990/16)=61. Accordingly, the unified upper bound for a 64-tone transmission may be 62 data tones. This is the highest number of data tones possible, in any of the listed configurations.

FIG. 37 shows upper bounds for 128-tone, 10 MHz tone plans according to various embodiments. For example, with a single user, if 3 DC tones are used, there may be 108 data tones. If 5 DC tones are used, there may be 106 data tones for a single user. If 7 DC tones are used, there may be 104 data tones for a single user. In an OFDMA transmission with a different total bandwidth, the number of data tones which may use may be different. In a 20 MHz OFDMA transmission, the number of data tones in a 10 MHz portion when there are 3 DC tones may be Floor(234/2)=117. In a 20 MHz OFDMA transmission, the number of data tones in a 10 MHz portion when there are 5 DC tones may be Floor(232/2)=116. In a 20 MHz OFDMA transmission, the number of data tones in a 10 MHz portion when there are 7 DC tones may be Floor(230/2)=115.

In a 40 MHz OFDMA transmission, the number of data tones in a 10 MHz portion when there are 3 DC tones may be Floor(488/4)=122. In a 40 MHz OFDMA transmission, the number of data tones in a 10 MHz portion when there are 5 DC tones may be Floor(486/4)=121. In a 40 MHz OFDMA transmission, the number of data tones in a 10 MHz portion when there are 7 DC tones may be Floor(484/4)=120. In a 40 MHz OFDMA transmission, the number of data tones in a 10 MHz portion when there are 11 DC tones may be Floor(480/4)=120.

In a 80 or 160 MHz OFDMA transmission, the number of data tones in a 10 MHz portion when there are 3 DC tones may be Floor(998/8)=124. In a 80 or 160 MHz OFDMA transmission, the number of data tones in a 10 MHz portion when there are 5 DC tones may be Floor(996/8)=124. In a 80 or 160 MHz OFDMA transmission, the number of data tones in a 10 MHz portion when there are 7 DC tones may be Floor(994/8)=124. In a 80 or 160 MHz OFDMA transmission, the number of data tones in a 10 MHz portion when there are 11 DC tones may be Floor(990/8)=123. Accordingly, the unified upper bound for a 128-tone transmission may be 124 data tones. This is the highest number of data tones possible, in any of the listed configurations.

FIG. 38 shows upper bounds for 192-tone, 15 MHz tone plans according to various embodiments. Generally, 15 MHz may not be used by a single user. In an OFDMA transmission with a different total bandwidth, the number of data tones which may use may be different. In a 20 MHz OFDMA transmission, the number of data tones in a 15 MHz portion when there are 3 DC tones may be Floor(234*3/4)=175. In a 20 MHz OFDMA transmission, the number of data tones in a 15 MHz portion when there are 5 DC tones may be Floor(232*3/4)=174. In a 20 MHz OFDMA transmission, the number of data tones in a 15 MHz portion when there are 7 DC tones may be Floor(230*3/4)=172.

In a 40 MHz OFDMA transmission, the number of data tones in a 15 MHz portion when there are 3 DC tones may be Floor(488*3/8)=183. In a 40 MHz OFDMA transmission, the number of data tones in a 15 MHz portion when there are 5 DC tones may be Floor(486*3/8)=183. In a 40 MHz OFDMA transmission, the number of data tones in a 15 MHz portion when there are 7 DC tones may be Floor(484*3/8)=181. In a 40 MHz OFDMA transmission, the number of data tones in a 15 MHz portion when there are 11 DC tones may be Floor(480*3/8)=180.

In a 80 or 160 MHz OFDMA transmission, the number of data tones in a 15 MHz portion when there are 3 DC tones may be Floor(998*3/16)=187. In a 80 or 160 MHz OFDMA transmission, the number of data tones in a 15 MHz portion when there are 5 DC tones may be Floor(996*3/16)=186. In a 80 or 160 MHz OFDMA transmission, the number of data tones in a 15 MHz portion when there are 7 DC tones may be Floor(994*3/16)=186. In a 80 or 160 MHz OFDMA transmission, the number of data tones in a 15 MHz portion when there are 11 DC tones may be Floor(990*3/16)=185. Accordingly, the unified upper bound for a 192-tone transmission may be 187 data tones. This is the highest number of data tones possible, in any of the listed configurations.

FIG. 39 shows upper bounds for 256-tone, 20 MHz tone plans according to various embodiments. For example, with a single user, if 3 DC tones are used, there may be 234 data tones. If 5 DC tones are used, there may be 232 data tones for a single user. If 7 DC tones are used, there may be 230 data tones for a single user. In an OFDMA transmission with a different total bandwidth, the number of data tones which may use may be different. In a 20 MHz OFDMA transmission, the number of data tones in a 20 MHz portion (that is, the entire transmission) when there are 3 DC tones may be 234. In a 20 MHz OFDMA transmission, the number of data tones in a 20 MHz portion when there are 5 DC tones may be 232. In a 20 MHz OFDMA transmission, the number of data tones in a 20 MHz portion when there are 7 DC tones may be 230.

In a 40 MHz OFDMA transmission, the number of data tones in a 20 MHz portion when there are 3 DC tones may be Floor(488/2)=244. In a 40 MHz OFDMA transmission, the number of data tones in a 20 MHz portion when there are 5 DC tones may be Floor(486/2)=243. In a 40 MHz OFDMA transmission, the number of data tones in a 20 MHz portion when there are 7 DC tones may be Floor(484/2)=242. In a 40 MHz OFDMA transmission, the number of data tones in a 20 MHz portion when there are 11 DC tones may be Floor(480/2)=240.

In a 80 or 160 MHz OFDMA transmission, the number of data tones in a 20 MHz portion when there are 3 DC tones may be Floor(998/4)=249. In a 80 or 160 MHz OFDMA transmission, the number of data tones in a 20 MHz portion when there are 5 DC tones may be Floor(996/4)=249. In a 80 or 160 MHz OFDMA transmission, the number of data tones in a 20 MHz portion when there are 7 DC tones may be Floor(994/4)=248. In a 80 or 160 MHz OFDMA transmission, the number of data tones in a 20 MHz portion when there are 11 DC tones may be Floor(990/4)=247. Accordingly, the unified upper bound for a 256-tone transmission may be 249 data tones. This is the highest number of data tones possible, in any of the listed configurations.

FIG. 40 shows upper bounds for 384-tone, 30 MHz tone plans according to various embodiments. In a 40 MHz OFDMA transmission, the number of data tones in a 30 MHz portion when there are 3 DC tones may be Floor (488*3/4)=366. In a 40 MHz OFDMA transmission, the number of data tones in a 30 MHz portion when there are 5 DC tones may be Floor(486*3/4)=364. In a 40 MHz OFDMA transmission, the number of data tones in a 30 MHz portion when there are 7 DC tones may be Floor (484*3/4)=365. In a 40 MHz OFDMA transmission, the number of data tones in a 30 MHz portion when there are 11 DC tones may be Floor(480*3/4)=360.

In a 80 or 160 MHz OFDMA transmission, the number of data tones in a 30 MHz portion when there are 3 DC tones may be Floor(998*3/8)=374. In a 80 or 160 MHz OFDMA transmission, the number of data tones in a 30 MHz portion when there are 5 DC tones may be Floor(996*3/8)=373. In a 80 or 160 MHz OFDMA transmission, the number of data tones in a 30 MHz portion when there are 7 DC tones may be Floor(994*3/8)=372. In a 80 or 160 MHz OFDMA transmission, the number of data tones in a 30 MHz portion when there are 11 DC tones may be Floor(990*3/8)=371. Accordingly, the unified upper bound for a 384-tone transmission may be 374 data tones. This is the highest number of data tones possible, in any of the listed configurations.

FIG. 41A shows upper bounds for 512-tone, 40 MHz tone plans according to various embodiments. For example, with a single user, if 3 DC tones are used, there may be 488 data tones. If 5 DC tones are used, there may be 486 data tones for a single user. If 7 DC tones are used, there may be 484 data tones for a single user. If 11 DC tones are used, there may be 480 data tones for a single user. Similarly, in an OFDMA transmission with 40 MHz total bandwidth, the same number of data tones may be used.

In a 80 or 160 MHz OFDMA transmission, the number of data tones in a 40 MHz portion when there are 3 DC tones may be Floor(998/2)=499. In a 80 or 160 MHz OFDMA transmission, the number of data tones in a 40 MHz portion when there are 5 DC tones may be Floor(996/2)=498. In a 80 or 160 MHz OFDMA transmission, the number of data tones in a 40 MHz portion when there are 7 DC tones may be Floor(994/2)=497. In a 80 or 160 MHz OFDMA transmission, the number of data tones in a 40 MHz portion when there are 11 DC tones may be Floor(990/2)=495. Accordingly, the unified upper bound for a 512-tone transmission may be 499 data tones. This is the highest number of data tones possible, in any of the listed configurations.

FIG. 41B shows gain from any of the feasible 40 MHz tone plans over other possible tone plans, including some existing tone plans. For example, using 470 data tones may represent a 0.43% gain over 468 data tones. Using 472 data tones may represent a 0.85% gain over 468 data tones. Using 474 data tones may represent a 1.28% gain over 468 data tones. Using 476 data tones may represent a 1.71% gain over 468 data tones. Using 478 data tones may represent a 2.14% gain over 468 data tones. Using 480 data tones may represent a 2.56% gain over 468 data tones. Using 482 data tones may represent a 2.99% gain over 468 data tones. Using 484 data tones may represent a 3.42% gain over 468 data tones. Using 486 data tones may represent a 3.85% gain over 468 data tones. Using 488 data tones may represent a 4.27% gain over 468 data tones. Using 490 data tones may represent a 4.70% gain over 468 data tones. Using 492 data tones may represent a 5.13% gain over 468 data tones. Using 494 data tones may represent a 5.56% gain over 468 data tones. Using 496 data tones may represent a 5.98% gain over 468 data tones. Using 498 data tones may represent a 6.41% gain over 468 data tones.

FIG. 42 shows gain from any of the feasible 60 MHz tone plans over other possible tone plans, including some existing tone plans. For example, using 732 data tones may represent a 2.14% loss compared to using 478 data tones. Using 738 data tones may represent a 1.34% loss compared to using 478 data tones. Using 740 data tones may represent a 1.07% loss compared to using 478 data tones. Using 744 data tones may represent a 0.53% loss compared to using 478 data tones. Using 748 data tones may represent no loss compared to using 478 data tones in other tone plans.

FIG. 43 shows gain from any of the feasible 80 MHz tone plans over other possible tone plans, including some existing tone plans. For example, using 936 data tones may represent no gain over 936 data tones. Using 938 data tones may represent a 0.21% gain over 936 data tones. Using 940 data tones may represent a 0.43% gain over 936 data tones. Using 942 data tones may represent a 0.64% gain over 936 data tones. Using 944 data tones may represent a 0.85% gain over 936 data tones. Using 946 data tones may represent a 1.07% gain over 936 data tones. Using 948 data tones may represent a 1.28% gain over 936 data tones. Using 950 data tones may represent a 1.50% gain over 936 data tones. Using 952 data tones may represent a 1.71% gain over 936 data tones. Using 954 data tones may represent a 1.92% gain over 936 data tones. Using 956 data tones may represent a 2.14% gain over 936 data tones. Using 958 data tones may represent a 2.35% gain over 936 data tones. Using 960 data tones may represent a 2.56% gain over 936 data tones. Using 962 data tones may represent a 2.78% gain over 936 data tones. Using 964 data tones may represent a 2.99% gain over 936 data tones. Using 966 data tones may represent a 3.21% gain over 936 data tones. Using 968 data tones may represent a 3.42% gain over 936 data tones. Using 970 data tones may represent a 3.63% gain over 936 data tones. Using 972 data tones may represent a 3.84% gain over 936 data tones. Using 974 data tones may represent a 4.06% gain over 936 data tones. Using 976 data tones may represent a 4.27% gain over 936 data tones. Using 978 data tones may represent a 4.49% gain over 936 data tones. Using 980 data tones may represent a 4.70% gain over 936 data tones. Using 982 data tones may represent a 4.91% gain over 936 data tones. Using 984 data tones may represent a 5.13% gain over 936 data tones. Using 986 data tones may represent a 5.34% gain over 936 data tones. Using 988 data tones may represent a 5.56% gain over 936 data tones. Using 990 data tones may represent a 5.77% gain over 936 data tones. Using 992 data tones may represent a 5.98% gain over 936 data tones. Using 994 data tones may represent a 6.20% gain over 936 data tones. Using 996 data tones may represent a 6.41% gain over 936 data tones. Using 998 data tones may represent a 6.62% gain over 936 data tones.

FIG. 44 shows gain from any of the feasible 100 MHz tone plans over other possible tone plans, including some existing tone plans. For example, using 1200 data tones may represent a 3.77% loss compared to using 1247 data tones. Using 1203 data tones may represent a 3.53% loss compared to using 1247 data tones. Using 1204 data tones may represent a 3.45% loss compared to using 1247 data tones. Using 1206 data tones may represent a 3.29% loss compared to using 1247 data tones. Using 1208 data tones may represent a 3.13% loss compared to using 1247 data tones. Using 1209 data tones may represent a 3.05% loss compared to using 1247 data tones. Using 1210 data tones may represent a 2.97% loss compared to using 1247 data tones. Using 1212 data tones may represent a 2.81% loss compared to using 1247 data tones. Using 1215 data tones may represent a 2.57% loss compared to using 1247 data tones. Using 1216 data tones may represent a 2.49% loss compared to using 1247 data tones. Using 1218 data tones may represent a 2.33% loss compared to using 1247 data tones. Using 1220 data tones may represent a 2.17% loss compared to using 1247 data tones. Using 1221 data tones may represent a 2.09% loss compared to using 1247 data tones. Using 1224 data tones may represent a 1.84% loss compared to using 1247 data tones. Using 1227 data tones may represent a 1.60% loss compared to using 1247 data tones. Using 1228 data tones may represent a 1.52% loss compared to using 1247 data tones. Using 1230 data tones may represent a 1.36% loss compared to using 1247 data tones. Using 1232 data tones may represent a 1.20% loss compared to using 1247 data tones. Using 1233 data tones may represent a 1.12% loss compared to using 1247 data tones. Using 1236 data tones may represent a 0.88% loss compared to using 1247 data tones. Using 1240 data tones may represent a 0.56% loss compared to using 1247 data tones. Using 1242 data tones may represent a 0.40% loss compared to using 1247 data tones. Using 1244 data tones may represent a 0.24% loss compared to using 1247 data tones.

FIG. 45 shows gain from any of the feasible 120 MHz tone plans over other possible tone plans, including some existing tone plans. For example, using 1420 data tones may represent a 5.14% loss compared to using 1497 data tones. Using 1422 data tones may represent a 5.01% loss compared to using 1497 data tones. Using 1424 data tones may represent a 4.88% loss compared to using 1497 data tones. Using 1426 data tones may represent a 4.74% loss compared to using 1497 data tones. Using 1428 data tones may represent a 4.61% loss compared to using 1497 data tones. Using 1430 data tones may represent a 4.48% loss compared to using 1497 data tones. Using 1432 data tones may represent a 4.34% loss compared to using 1497 data tones. Using 1434 data tones may represent a 4.21% loss compared to using 1497 data tones. Using 1436 data tones may represent a 4.07% loss compared to using 1497 data tones. Using 1438 data tones may represent a 3.94% loss compared to using 1497 data tones. Using 1440 data tones may represent a 3.81% loss compared to using 1497 data tones. Using 1446 data tones may represent a 3.41% loss compared to using 1497 data tones. Using 1452 data tones may represent a 3.01% loss compared to using 1497 data tones. Using 1456 data tones may represent a 2.74% loss compared to using 1497 data tones. Using 1458 data tones may represent a 2.61% loss compared to using 1497 data tones. Using 1460 data tones may represent a 2.47% loss compared to using 1497 data tones. Using 1464 data tones may represent a 2.20% loss compared to using 1497 data tones. Using 1470 data tones may represent a 1.80% loss compared to using 1497 data tones. Using 1476 data tones may represent a 1.40% loss compared to using 1497 data tones. Using 1480 data tones may represent a 1.14% loss compared to using 1497 data tones. Using 1482 data tones may represent a 1.00% loss compared to using 1497 data tones. Using 1484 data tones may represent a 0.87% loss compared to using 1497 data tones. Using 1488 data tones may represent a 0.60% loss compared to using 1497 data tones. Using 1496 data tones may represent a 0.07% loss compared to using 1497 data tones.

FIG. 46 shows gain from any of the feasible 140 MHz tone plans over other possible tone plans, including some existing tone plans. For example, using 1660 data tones may represent a 4.93% loss compared to using 1746 data tones. Using 1662 data tones may represent a 4.81% loss compared to using 1746 data tones. Using 1664 data tones may represent a 4.70% loss compared to using 1746 data tones. Using 1666 data tones may represent a 4.58% loss compared to using 1746 data tones. Using 1668 data tones may represent a 4.47% loss compared to using 1746 data tones. Using 1670 data tones may represent a 4.35% loss compared to using 1746 data tones. Using 1672 data tones may represent a 4.24% loss compared to using 1746 data tones. Using 1674 data tones may represent a 4.12% loss compared to using 1746 data tones. Using 1676 data tones may represent a 4.01% loss compared to using 1746 data tones. Using 1678 data tones may represent a 3.89% loss compared to using 1746 data tones. Using 1680 data tones may represent a 3.78% loss compared to using 1746 data tones. Using 1682 data tones may represent a 3.67% loss compared to using 1746 data tones. Using 1684 data tones may represent a 3.55% loss compared to using 1746 data tones. Using 1686 data tones may represent a 3.43% loss compared to using 1746 data tones. Using 1688 data tones may represent a 3.32% loss compared to using 1746 data tones. Using 1690 data tones may represent a 3.21% loss compared to using 1746 data tones. Using 1692 data tones may represent a 3.09% loss compared to using 1746 data tones. Using 1694 data tones may represent a 2.98% loss compared to using 1746 data tones. Using 1696 data tones may represent a 2.86% loss compared to using 1746 data tones. Using 1698 data tones may represent a 2.75% loss compared to using 1746 data tones. Using 1700 data tones may represent a 2.63% loss compared to using 1746 data tones. Using 1702 data tones may represent a 2.52% loss compared to using 1746 data tones. Using 1704 data tones may represent a 2.41% loss compared to using 1746 data tones. Using 1706 data tones may represent a 2.29% loss compared to using 1746 data tones. Using 1708 data tones may represent a 2.18% loss compared to using 1746 data tones. Using 1710 data tones may represent a 2.06% loss compared to using 1746 data tones. Using 1712 data tones may represent a 1.95% loss compared to using 1746 data tones. Using 1714 data tones may represent a 1.83% loss compared to using 1746 data tones. Using 1716 data tones may represent a 1.72% loss compared to using 1746 data tones. Using 1718 data tones may represent a 1.60% loss compared to using 1746 data tones. Using 1720 data tones may represent a 1.49% loss compared to using 1746 data tones. Using 1722 data tones may represent a 1.37% loss compared to using 1746 data tones. Using 1724 data tones may represent a 1.26% loss compared to using 1746 data tones. Using 1726 data tones may represent a 1.15% loss compared to using 1746 data tones. Using 1728 data tones may represent a 1.03% loss compared to using 1746 data tones. Using 1734 data tones may represent a 0.69% loss compared to using 1746 data tones. Using 1736 data tones may represent a 0.57% loss compared to using 1746 data tones. Using 1740 data tones may represent a 0.34% loss compared to using 1746 data tones. Using 1746 data tones may represent no loss compared to using 1746 data tones.

Tone plans may also be designed for 160 MHz transmissions, which may include 2048 tones. Generally, a 160 MHz transmission may be made up of two 80 MHz transmissions. Accordingly, the number of data tones in a 160 MHz, 2048FFT, transmission may be twice the number included in an 80 MHz transmission. For example, an 80 MHz transmission may include one of 936, 938, 940, 942, 944, 946, 948, 950, 952, 954, 956, 958, 960, 962, 964, 966, 968, 970, 972, 974, 976, 978, 980, 982, 984, 986, 988, 990, 992, 994, 996, and 998 data tones. Thus, a 160 MHz transmission may include one of 1872, 1876, 1880, 1884, 1888, 1892, 1896, 1900, 1904, 1908, 1912, 1916, 1920, 1924, 1928, 1932, 1936, 1940, 1944, 1948, 1952, 1956, 1960, 1964, 1968, 1972, 1976, 1980, 1984, 1988, 1992, and 1996 data tones. In previous versions of Wi-Fi, such as IEEE 802.11ac, a 160 MHz and 80+80 MHz transmission was divided into two 80 MHz frequency segments by a segment parser. BCC interleaving and LDPC tone mapping may be done in each of the two 80 MHz segments, as they would be with a 1024 FFT tone plan, such as an 80 MHz transmission. However, the number of BCC encoders and MCS validity in a 160 MHz transmission may rely upon the entire 2048FFT/160 MHz tone plan. Thus, the MCS exclusions for such a 2048FFT tone plan may be different from those which are present in a 1024FFT tone plan.

FIG. 48 is a chart illustrating certain candidate interleaver parameters for different numbers of data tones, according to a 384-tone plan embodiment. For example, these parameters may be used when a device is allocated 30 MHz in a particular transmission. In a particular embodiment, the interleaver depth (e.g., the number of columns (Ncol)) can be a factor of the number of data tones (Ndata). In various embodiments, a 362 data tone block can have an interleaver depth of 2 or 181. In various embodiments, a 374 data tone block can have an interleaver depth of 2, 11, 17, 22, 34, or 187.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 77-105. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 33-58. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 49 is a chart illustrating certain candidate interleaver parameters for different numbers of data tones, according to a 512-tone plan embodiment. For example, these parameters may be used when a device is allocated 40 MHz in a particular transmission. In a particular embodiment, the interleaver depth (e.g., the number of columns (Ncol)) can be a factor of the number of data tones (Ndata). In various embodiments, a 482 data tone block can have an interleaver depth of 2 or 241. In various embodiments, a 494 data tone block can have an interleaver depth of 2, 13, 19, 26, 38, or 247.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss).

For example, if the data tone block has 4 or less spatial streams (Nss), the base subcarrier rotation (NROT) can be any of 107-136. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 48-73. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 50 is a chart illustrating certain candidate interleaver parameters for different numbers of data tones, according to a 1024-tone plan embodiment. For example, these parameters may be used when a device is allocated 80 MHz in a particular transmission. In a particular embodiment, the interleaver depth (e.g., the number of columns (Ncol)) can be a factor of the number of data tones (Ndata). In various embodiments, the number of data tones may be one of 938, 940, 942, 944, 946, 950, 952, 954, 956, 962, 964, 966, or 968. For each of these values of Ndata, the candidates for Ncol may include any factor of the value of Ndata (that is, any whole number that multiplies with another whole number to form Ndata as a product, excluding one and the value of Ndata itself), as illustrated in the chart.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 224-252. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 107-131. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 51 is an additional chart illustrating additional candidate interleaver parameters for different numbers of data tones, according to a 1024-tone plan embodiment. For example, these parameters may be used when a device is allocated 80 MHz in a particular transmission. In a particular embodiment, the interleaver depth (e.g., the number of columns (Ncol)) can be a factor of the number of data tones (Ndata). In various embodiments, the number of data tones may be one of 970, 974, 976, 978, 982, 986, 988, 992, 994, or 998. For each of these values of Ndata, the candidates for Ncol may include any factor of the value of Ndata (other than 1 and Ndata), as illustrated in the chart.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 232-260. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 111-135. It may be observed that, therefore, for various values of Ndata in a 1024-tone transmission, the NROT values may be any of 224-260 with 4 or less spatial streams (based on FIGS. 50 and 51). Further, when there are more than 4 spatial streams, the NROT may be any of 107-135. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 52 is a chart illustrating candidate interleaver parameters for different numbers of data tones, according to a 1280-tone plan embodiment. For example, these parameters may be used when a device is allocated 100 MHz in a particular transmission. In a particular embodiment, the interleaver depth (e.g., the number of columns (Ncol)) can be a factor of the number of data tones (Ndata). In various embodiments, the number of data tones may be one of 1203, 1204, 1208, 1209, 1210, 1215, 1216, 1220, 1221, 1227, 1228, 1233, 1240, and 1244. For each of these values of Ndata, the candidates for Ncol may include any factor of the value of Ndata (other than 1 and Ndata), as illustrated in the chart.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 290-321. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 140-166. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 53 is a chart illustrating candidate interleaver parameters for different numbers of data tones, according to a 1536-tone plan embodiment. For example, these parameters may be used when a device is allocated 120 MHz in a particular transmission. In a particular embodiment, the interleaver depth (e.g., the number of columns (Ncol)) can be a factor of the number of data tones (Ndata). In various embodiments, the number of data tones may be one of 1446, 1456, 1458, 1460, 1476, 1480, 1482, 1484, and 1496. For each of these values of Ndata, the candidates for Ncol may include any factor of the value of Ndata (other than 1 and Ndata), as illustrated in the chart.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 351-384. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 170-197. The rotation index (e.g., the 7th column) can be a bit reversal of

[0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

FIG. 54 is a chart illustrating candidate interleaver parameters for different numbers of data tones, according to a 1792-tone plan embodiment. For example, these parameters may be used when a device is allocated 140 MHz in a particular transmission. In a particular embodiment, the interleaver depth (e.g., the number of columns (Ncol)) can be a factor of the number of data tones (Ndata). In various embodiments, the number of data tones may be one of 1662, 1666, 1670, 1674, 1676, 1678, 1682, 1684, 1686, 1690, 1694, 1698, 1702, 1706, 1714, 1718, 1722, 1724, 1726, 1734, 1736, and 1746. For each of these values of Ndata, the candidates for Ncol may include any factor of the value of Ndata (other than 1 and Ndata), as illustrated in the chart.

A frequency rotation can be applied to the spatial streams if there is more than one spatial stream. The frequency rotation can be based on a base subcarrier rotation (NROT) and a rotation index. The base subcarrier rotation (NROT) and the rotation index can be based on the number of data tones (Ndata) and the number of spatial streams (Nss). For example, if the data tone block has 4 or less spatial streams (Nss), the base subcarrier rotation (NROT) can be any of 405-447. The rotation index (e.g., the $6^{th}$ column) can be a bit reversal of [0 2 1 3] in this scenario. Alternatively, if the data tone block has more than 4 spatial streams (Nss), the base subcarrier rotation (NROT) can be any of 197-229. The rotation index (e.g., the 7th column) can be a bit reversal of [0 4 2 6 1 5 3 7] in some embodiments, or the rotation index can be chosen to maximize (or increase) an average subcarrier distance of adjacent streams in other embodiments (e.g., [0 5 2 7 3 6 1 4]). Although a rotation index of [0 5 2 7 3 6 1 4] is used herein as one example of an index maximizing average subcarrier distance, any other rotation indexes that maximizes (or increases) average subcarrier distance can be used. For example, any permutation which maximizes the average subcarrier distance of adjacent streams may be used, and [0 5 2 7 3 6 1 4] is only one example.

Table 3, below, is a chart illustrating exemplary low density parity check (LDPC) tone mapping distances (DTMs) for different numbers of data tones (Ndata).

TABLE 3

| $N_{data}$ | $D_{TM}$ Candidates |
|---|---|
| 20 | 2, 4, 5, 10 |
| 22 | 2, 11 |
| 26 | 2, 13 |
| 28 | 2, 4, 7, 14 |
| 362 | 2, 181 |
| 374 | 2, 11, 17, 22, 34, 187 |
| 482 | 2, 241 |
| 494 | 2, 13, 19, 26, 38, 247 |
| 748 | 2, 4, 11, 17, 22, 34, 44, 68, 187, 374 |
| 938 | 2, 7, 14, 67, 134, 469 |
| 940 | 2, 4, 5, 10, 20, 47, 94, 188, 235, 470 |
| 942 | 2, 3, 6, 157, 314, 471 |
| 944 | 2, 4, 8, 16, 59, 118, 236, 472 |
| 946 | 2, 11, 22, 43, 86, 473 |
| 950 | 2, 5, 10, 19, 25, 38, 50, 95, 190, 475 |

TABLE 3-continued

| $N_{data}$ | $D_{TM}$ Candidates |
|---|---|
| 952 | 2, 4, 7, 8, 14, 17, 28, 34, 56, 68, 119, 136, 238, 476 |
| 954 | 2, 3, 6, 9, 18, 53, 106, 159, 318, 477 |
| 956 | 2, 4, 239, 478 |
| 958 | 2, 479 |
| 962 | 2, 13, 26, 37, 74, 481 |
| 964 | 2, 4, 241, 482 |
| 966 | 2, 3, 6, 7, 14, 21, 23, 42, 46, 69, 138, 161, 322, 483 |
| 968 | 2, 4, 8, 11, 22, 44, 88, 121, 242, 484 |
| 970 | 2, 5, 10, 97, 194, 485 |
| 974 | 2, 487 |
| 976 | 2, 4, 8, 16, 61, 122, 244, 488 |
| 978 | 2, 3, 6, 163, 326, 489 |
| 982 | 2, 491 |
| 986 | 2, 17, 29, 34, 58, 493 |
| 988 | 2, 4, 13, 19, 26, 38, 52, 76, 247, 494 |
| 992 | 2, 4, 8, 16, 31, 32, 62, 124, 248, 496 |
| 994 | 2, 7, 14, 71, 142, 497 |
| 998 | 2, 499 |
| 1203 | 3, 401 |
| 1204 | 2, 4, 7, 14, 28, 43, 86, 172, 301, 602 |
| 1208 | 2, 4, 8, 151, 302, 604 |
| 1209 | 3, 13, 31, 39, 93, 403 |
| 1210 | 2, 5, 10, 11, 22, 55, 110, 121, 242, 605 |
| 1215 | 3, 5, 9, 15, 27, 45, 81, 135, 243, 405 |
| 1216 | 2, 4, 8, 16, 19, 32, 38, 64, 76, 152, 304, 608 |
| 1220 | 2, 4, 5, 10, 20, 61, 122, 244, 305, 610 |
| 1221 | 3, 11, 33, 37, 111, 407 |
| 1227 | 3, 409 |
| 1228 | 2, 4, 307, 614 |
| 1233 | 3, 9, 137, 411 |
| 1240 | 2, 4, 5, 8, 10, 20, 31, 40, 62, 124, 155, 248, 310, 620 |
| 1244 | 2, 4, 311, 622 |
| 1446 | 2, 3, 6, 241, 482, 723 |
| 1456 | 2, 4, 7, 8, 13, 14, 16, 26, 28, 52, 56, 91, 104, 112, 182, 208, 364, 728 |
| 1458 | 2, 3, 6, 9, 18, 27, 54, 81, 162, 243, 486, 729 |
| 1460 | 2, 4, 5, 10, 20, 73, 146, 292, 365, 730 |
| 1476 | 2, 3, 4, 6, 9, 12, 18, 36, 41, 82, 123, 164, 246, 369, 492, 738 |
| 1480 | 2, 4, 5, 8, 10, 20, 37, 40, 74, 148, 185, 296, 370, 740 |
| 1482 | 2, 3, 6, 13, 19, 26, 38, 39, 57, 78, 114, 247, 494, 741 |
| 1484 | 2, 4, 7, 14, 28, 53, 106, 212, 371, 742 |
| 1496 | 2, 4, 8, 11, 17, 22, 34, 44, 68, 88, 136, 187, 374, 748 |
| 1662 | 2, 3, 6, 277, 554, 831 |
| 1666 | 2, 7, 14, 17, 34, 49, 98, 119, 238, 833 |
| 1670 | 2, 5, 10, 167, 334, 835 |
| 1674 | 2, 3, 6, 9, 18, 27, 31, 54, 62, 93, 186, 279, 558, 837 |
| 1676 | 2, 4, 419, 838 |
| 1678 | 2, 839 |
| 1682 | 2, 29, 58, 841 |
| 1684 | 2, 4, 421, 842 |
| 1686 | 2, 3, 6, 281, 562, 843 |
| 1690 | 2, 5, 10, 13, 26, 65, 130, 169, 338, 845 |
| 1694 | 2, 7, 11, 14, 22, 77, 121, 154, 242, 847 |
| 1698 | 2, 3, 6, 283, 566, 849 |
| 1702 | 2, 23, 37, 46, 74, 851 |
| 1706 | 2, 853 |
| 1714 | 2, 857 |
| 1718 | 2, 859 |
| 1722 | 2, 3, 6, 7, 14, 21, 41, 42, 82, 123, 246, 287, 574, 861 |
| 1724 | 2, 4, 431, 862 |
| 1726 | 2, 863 |
| 1734 | 2, 3, 6, 17, 34, 51, 102, 289, 578, 867 |
| 1736 | 2, 4, 7, 8, 14, 28, 31, 56, 62, 124, 217, 248, 434, 868 |
| 1746 | 2, 3, 6, 9, 18, 97, 194, 291, 582, 873 |

Generally, LDPC tone mapping distance (DTM) is defined in the IEEE 802.11ac specification. The mapping distance (DTM) can be at least as large as the number of coded bits per OFDM symbol (NCBPS) divided by the LDPC codeword length (LCW) (e.g., NCBPS/LCW≤DTM) so that each LDPC codeword covers the full range of tones. Additionally, the mapping distance (DTM) can be an integer divisor of the number of subcarriers (Ndata). The mapping distance (DTM) can be constant over rates within each bandwidth to enable a tone de-mapper implemented at a Fast Fourier Transform (FFT) module of the receive circuits 1116a-1116c with fixed tone processing.

Thus, Table 3 illustrates each of the mapping distances (DTM) which may be used with any given number of data tones (Ndata). In some aspects, the mapping distances listed in Table 3, for any given number of data tones, may be the same as the NCOL candidates for the given Ndata, as listed in FIGS. 47-54.

Table 4, below, is a chart illustrating exemplary modulation and coding scheme (MCS) validity for different numbers of data tones (Ndata). The data in this table has been obtained based on the use of 4× symbol duration, compared to the symbol duration found in an IEEE 802.11ac transmission.

TABLE 4

| $N_{data}$ | # exclusions | Exclusions |
|---|---|---|
| 20 | 6 | MCS9 & Nss = 1, 2, 4, 5, 7, 8 |
| 22 | 6 | MCS9 & Nss = 1, 2, 4, 5, 7, 8 |
| 26 | 6 | MCS9 & Nss = 1, 2, 4, 5, 7, 8 |
| 28 | 6 | MCS9 & Nss = 1, 2, 4, 5, 7, 8 |
| 38 | 6 | MCS9 & Nss = 1, 2, 4, 5, 7, 8 |
| 40 | 6 | MCS9 & Nss = 1, 2, 4, 5, 7, 8 |
| 42 | 0 | |
| 44 | 6 | MCS9 & Nss = 1, 2, 4, 5, 7, 8 |
| 46 | 6 | MCS9 & Nss = 1, 2, 4, 5, 7, 8 |
| 48 | 0 | |
| 50 | 6 | MCS9 & Nss = 1, 2, 4, 5, 7, 8 |
| 54 | 0 | |
| 56 | 6 | MCS9 & Nss = 1, 2, 4, 5, 7, 8 |
| 58 | 6 | MCS9 & Nss = 1, 2, 4, 5, 7, 8 |
| 60 | 0 | |
| 62 | 6 | MCS9 & Nss = 1, 2, 4, 5, 7, 8 |
| 96 | 0 | |
| 98 | 6 | MCS9 & Nss = 1, 2, 4, 5, 7, 8 |
| 100 | 6 | MCS9 & Nss = 1, 2, 4, 5, 7, 8 |
| 102 | 0 | |
| 104 | 6 | MCS9 & Nss = 1, 2, 4, 5, 7, 8 |
| 106 | 6 | MCS9 & Nss = 1, 2, 4, 5, 7, 8 |
| 108 | 0 | |
| 110 | 6 | MCS9 & Nss = 1, 2, 4, 5, 7, 8 |
| 112 | 6 | MCS9 & Nss = 1, 2, 4, 5, 7, 8 |
| 114 | 0 | |
| 116 | 6 | MCS9 & Nss = 1, 2, 4, 5, 7, 8 |
| 118 | 6 | MCS9 & Nss = 1, 2, 4, 5, 7, 8 |
| 120 | 0 | |
| 122 | 6 | MCS9 & Nss = 1, 2, 4, 5, 7, 8 |
| 124 | 6 | MCS9 & Nss = 1, 2, 4, 5, 7, 8 |
| 168 | 0 | |
| 170 | 6 | MCS9 & Nss = 1, 2, 4, 5, 7, 8 |
| 172 | 6 | MCS9 & Nss = 1, 2, 4, 5, 7, 8 |
| 174 | 0 | |
| 176 | 6 | MCS9 & Nss = 1, 2, 4, 5, 7, 8 |
| 178 | 6 | MCS9 & Nss = 1, 2, 4, 5, 7, 8 |
| 180 | 0 | |
| 182 | 6 | MCS9 & Nss = 1, 2, 4, 5, 7, 8 |
| 184 | 6 | MCS9 & Nss = 1, 2, 4, 5, 7, 8 |
| 186 | 0 | |
| 216 | 0 | |
| 218 | 6 | MCS9 & Nss = 1, 2, 4, 5, 7, 8 |
| 220 | 6 | MCS9 & Nss = 1, 2, 4, 5, 7, 8 |
| 222 | 0 | |
| 224 | 6 | MCS9 & Nss = 1, 2, 4, 5, 7, 8 |
| 226 | 6 | MCS9 & Nss = 1, 2, 4, 5, 7, 8 |
| 228 | 0 | |
| 230 | 6 | MCS9 & Nss = 1, 2, 4, 5, 7, 8 |
| 232 | 6 | MCS9 & Nss = 1, 2, 4, 5, 7, 8 |
| 236 | 6 | MCS9 & Nss = 1, 2, 4, 5, 7, 8 |
| 238 | 6 | MCS9 & Nss = 1, 2, 4, 5, 7, 8 |
| 240 | 0 | |
| 242 | 6 | MCS9 & Nss = 1, 2, 4, 5, 7, 8 |
| 244 | 6 | MCS9 & Nss = 1, 2, 4, 5, 7, 8 |
| 246 | 0 | |
| 248 | 6 | MCS9 & Nss = 1, 2, 4, 5, 7, 8 |
| 350 | 7 | MCS6 & Nss = 7; MCS9 & Nss = 1, 2, 4, 5, 7, 8 |
| 352 | 6 | MCS9 & Nss = 1, 2, 4, 5, 7, 8 |
| 354 | 2 | MCS6 & Nss = 7; MCS9 & Nss = 8 |
| 356 | 6 | MCS9 & Nss = 1, 2, 4, 5, 7, 8 |
| 358 | 7 | MCS6 & Nss = 7; MCS9 & Nss = 1, 2, 4, 5, 7, 8 |
| 360 | 0 | |
| 362 | 7 | MCS6 & Nss = 7; MCS9 & Nss = 1, 2, 4, 5, 7, 8 |
| 364 | 6 | MCS9 & Nss = 1, 2, 4, 5, 7, 8 |
| 366 | 2 | MCS6 & Nss = 7; MCS9 & Nss = 8 |
| 368 | 6 | MCS9 & Nss = 1, 2, 4, 5, 7, 8 |

TABLE 4-continued

| $N_{data}$ | # exclusions | Exclusions |
|---|---|---|
| 370 | 7 | MCS6 & Nss = 7; MCS9 & Nss = 1, 2, 4, 5, 7, 8 |
| 372 | 2 | MCS9 & Nss = 7, 8 |
| 374 | 7 | MCS6 & Nss = 7; MCS9 & Nss = 1, 2, 4, 5, 7, 8 |
| 470 | 10 | MCS6 & Nss = 5, 7; MCS7 & Nss = 8; MCS9 & Nss = 1, 2, 4, 5, 6, 7, 8 |
| 472 | 8 | MCS7 & Nss = 8; MCS9 & Nss = 1, 2, 4, 5, 6, 7, 8 |
| 474 | 4 | MCS6 & Nss = 5, 7; MCS9 & Nss = 7, 8 |
| 476 | 8 | MCS7 & Nss = 8; MCS9 & Nss = 1, 2, 4, 5, 6, 7, 8 |
| 478 | 10 | MCS6 & Nss = 5, 7; MCS7 & Nss = 8; MCS9 & Nss = 1, 2, 4, 5, 6, 7, 8 |
| 480 | 2 | MCS9 & Nss = 7, 8 |
| 482 | 10 | MCS6 & Nss = 5, 7; MCS7 & Nss = 8; MCS9 & Nss = 1, 2, 4, 5, 6, 7, 8 |
| 484 | 8 | MCS7 & Nss = 8; MCS9 & Nss = 1, 2, 4, 5, 6, 7, 8 |
| 486 | 2 | MCS6 & Nss = 5, 7 |
| 488 | 8 | MCS7 & Nss = 8; MCS9 & Nss = 1, 2, 4, 5, 6, 7, 8 |
| 490 | 10 | MCS6 & Nss = 5, 7; MCS7 & Nss = 8; MCS9 & Nss = 1, 2, 4, 5, 6, 7, 8 |
| 492 | 1 | MCS9 & Nss = 7 |
| 494 | 11 | MCS6 & Nss = 5, 7; MCS7 & Nss = 7, 8; MCS9 & Nss = 1, 2, 4, 5, 6, 7, 8 |
| 496 | 9 | MCS7 & Nss = 7, 8; MCS9 & Nss = 1, 2, 4, 5, 6, 7, 8 |
| 498 | 3 | MCS6 & Nss = 5, 7; MCS9 & Nss = 7 |
| 732 | 3 | MCS8 & Nss = 8; MCS9 & Nss = 4, 5 |
| 738 | 3 | MCS6 & Nss = 3, 5; MCS8 & Nss = 8 |
| 740 | 10 | MCS5 & Nss = 7, 8; MCS7 & Nss = 5, 7; MCS9 & Nss = 1, 2, 4, 5, 7, 8 |
| 744 | 3 | MCS8 & Nss = 8; MCS9 & Nss = 4, 5 |
| 748 | 10 | MCS5 & Nss = 7, 8; MCS7 & Nss = 5; MCS8 & Nss = 8; MCS9 & Nss = 1, 2, 4, 5, 7, 8 |
| 936 | 1 | MCS8 & Nss = 7 |
| 938 | 15 | MCS2 & Nss = 7; MCS5 & Nss = 5; MCS6 & Nss = 3, 7; MCS7 & Nss = 4, 5, 7; MCS8 & Nss = 7; MCS9 & Nss = 1, 2, 3, 4, 5, 7, 8 |
| 940 | 11 | MCS5 & Nss = 5; MCS6 & Nss = 7; MCS7 & Nss = 4, 5; MCS9 & Nss = 1, 2, 3, 4, 5, 7, 8 |
| 942 | 8 | MCS2 & Nss = 7; MCS6 & Nss = 3, 7; MCS7 & Nss = 7; MCS8 & Nss = 7; MCS9 & Nss = 4, 7, 8 |
| 944 | 11 | MCS5 & Nss = 5; MCS7 & Nss = 4, 5; MCS8 & Nss = 7; MCS9 & Nss = 1, 2, 3, 4, 5, 7, 8 |
| 946 | 15 | MCS2 & Nss = 7; MCS5 & Nss = 5; MCS6 & Nss = 3, 7; MCS7 & Nss = 4, 5, 7; MCS8 & Nss = 7; MCS9 & Nss = 1, 2, 3, 4, 5, 7, 8 |
| 948 | 5 | MCS6 & Nss = 7; MCS8 & Nss = 7; MCS9 & Nss = 4, 7, 8 |
| 950 | 14 | MCS2 & Nss = 7; MCS5 & Nss = 5; MCS6 & Nss = 3, 7; MCS7 & Nss = 4, 5, 7; MCS9 & Nss = 1, 2, 3, 4, 5, 7, 8 |
| 952 | 11 | MCS5 & Nss = 5; MCS7 & Nss = 4, 5; MCS8 & Nss = 7; MCS9 & Nss = 1, 2, 3, 4, 5, 7, 8 |
| 954 | 5 | MCS2 & Nss = 7; MCS6 & Nss = 3, 7; MCS7 & Nss = 7; MCS8 & Nss = 7 |
| 956 | 12 | MCS5 & Nss = 5; MCS6 & Nss = 7; MCS7 & Nss = 4, 5; MCS8 & Nss = 7; MCS9 & Nss = 1, 2, 3, 4, 5, 7, 8 |
| 958 | 15 | MCS2 & Nss = 7; MCS5 & Nss = 5; MCS6 & Nss = 3, 7; MCS7 & Nss = 4, 5, 7; MCS8 & Nss = 7; MCS9 & Nss = 1, 2, 3, 4, 5, 7, 8 |
| 960 | 3 | MCS9 & Nss = 4, 7, 8 |
| 962 | 18 | MCS2 & Nss = 7; MCS5 & Nss = 5; MCS6 & Nss = 3, 6, 7, 8; MCS7 & Nss = 4, 5, 7; MCS8 & Nss = 6, 7; MCS9 & Nss = 1, 2, 3, 4, 5, 7, 8 |
| 964 | 14 | MCS5 & Nss = 5; MCS6 & Nss = 7, 8; MCS7 & Nss = 4, 5; MCS8 & Nss = 6, 7; MCS9 & Nss = 1, 2, 3, 4, 5, 7, 8 |
| 966 | 11 | MCS2 & Nss = 7; MCS6 & Nss = 3, 6, 7, 8; MCS7 & Nss = 7; MCS8 & Nss = 6, 7; MCS9 & Nss = 4, 7, 8 |
| 968 | 13 | MCS5 & Nss = 5; MCS6 & Nss = 8; MCS7 & Nss = 4, 5; MCS8 & Nss = 6, 7; MCS9 & Nss = 1, 2, 3, 4, 5, 7, 8 |
| 970 | 15 | MCS2 & Nss = 7; MCS5 & Nss = 5; MCS6 & Nss = 3, 6, 7; MCS7 & Nss = 4, 5, 7; MCS9 & Nss = 1, 2, 3, 4, 5, 7, 8 |
| 972 | 4 | MCS6 & Nss = 3, 7, 8; MCS8 & Nss = 6, 7 |
| 974 | 18 | MCS2 & Nss = 7; MCS5 & Nss = 5; MCS6 & Nss = 3, 6, 7, 8; MCS7 & Nss = 4, 5, 7; MCS8 & Nss = 6, 7; MCS9 & Nss = 1, 2, 3, 4, 5, 7, 8 |
| 976 | 13 | MCS5 & Nss = 5; MCS6 & Nss = 8; MCS7 & Nss = 4, 5; MCS8 & Nss = 6, 7; MCS9 & Nss = 1, 2, 3, 4, 5, 7, 8 |
| 978 | 10 | MCS2 & Nss = 7; MCS6 & Nss = 3, 6, 7, 8; MCS7 & Nss = 7; MCS8 & Nss = 6, 7; MCS9 & Nss = 7, 8 |
| 980 | 11 | MCS5 & Nss = 5; MCS6 & Nss = 7; MCS7 & Nss = 4, 5; MCS9 & Nss = 1, 2, 3, 4, 5, 7, 8 |
| 982 | 18 | MCS2 & Nss = 7; MCS5 & Nss = 5; MCS6 & Nss = 3, 6, 7, 8; MCS7 & Nss = 4, 5, 7; MCS8 & Nss = 6, 7; MCS9 & Nss = 1, 2, 3, 4, 5, 7, 8 |
| 984 | 5 | MCS6 & Nss = 8; MCS8 & Nss = 6, 7; MCS9 & Nss = 7, 8 |
| 986 | 18 | MCS2 & Nss = 7; MCS5 & Nss = 5; MCS6 & Nss = 3, 6, 7, 8; MCS7 & Nss = 4, 5, 7; MCS8 & Nss = 6, 7; MCS9 & Nss = 1, 2, 3, 4, 5, 7, 8 |
| 988 | 14 | MCS5 & Nss = 5; MCS6 & Nss = 7, 8; MCS7 & Nss = 4, 5; MCS8 & Nss = 6, 7; MCS9 & Nss = 1, 2, 3, 4, 5, 7, 8 |
| 990 | 5 | MCS2 & Nss = 7; MCS6 & Nss = 3, 6, 7; MCS9 & Nss = 8 |
| 992 | 13 | MCS5 & Nss = 5; MCS6 & Nss = 8; MCS7 & Nss = 4, 5; MCS8 & Nss = 6, 7; MCS9 & Nss = 1, 2, 3, 4, 5, 7, 8 |
| 994 | 17 | MCS2 & Nss = 7; MCS5 & Nss = 5; MCS6 & Nss = 3, 6, 7, 8; MCS7 & Nss = 4, 5; MCS8 & Nss = 6, 7; MCS9 & Nss = 1, 2, 3, 4, 5, 7, 8 |
| 996 | 6 | MCS6 & Nss = 7, 8; MCS8 & Nss = 6, 7; MCS9 & Nss = 7, 8 |
| 998 | 17 | MCS2 & Nss = 7; MCS5 & Nss = 5; MCS6 & Nss = 3, 6, 7, 8; MCS7 & Nss = 4, 5; MCS8 & Nss = 6, 7; MCS9 & Nss = 1, 2, 3, 4, 5, 7, 8 |
| 1200 | 1 | MCS8 & Nss = 8 |
| 1203 | 19 | MCS0 & Nss = 1, 3, 5, 7; MCS2 & Nss = 1, 3, 5, 6, 7; MCS4 & Nss = 3; MCS5 & Nss = 8; MCS6 & Nss = 1, 2, 3, 5, 6, 7; MCS7 & Nss = 5; MCS8 & Nss = 8 |

TABLE 4-continued

| $N_{data}$ | # exclusions | Exclusions |
|---|---|---|
| 1204 | 16 | MCS3 & Nss = 8; MCS5 & Nss = 4, 5, 8; MCS6 & Nss = 5, 7; MCS7 & Nss = 4, 8; MCS9 & Nss = 1, 2, 3, 4, 5, 6, 7, 8 |
| 1206 | 9 | MCS2 & Nss = 5, 7; MCS5 & Nss = 8; MCS6 & Nss = 3, 5, 6, 7; MCS7 & Nss = 5; MCS8 & Nss = 8 |
| 1208 | 16 | MCS3 & Nss = 8; MCS5 & Nss = 4, 5, 8; MCS6 & Nss = 7; MCS7 & Nss = 4, 8; MCS8 & Nss = 8; MCS9 & Nss = 1, 2, 3, 4, 5, 6, 7, 8 |
| 1209 | 19 | MCS0 & Nss = 1, 3, 5, 7; MCS2 & Nss = 1, 3, 5, 6, 7; MCS4 & Nss = 3; MCS5 & Nss = 8; MCS6 & Nss = 1, 2, 3, 5, 6, 7; MCS7 & Nss = 5; MCS8 & Nss = 8 |
| 1210 | 20 | MCS2 & Nss = 5, 7; MCS3 & Nss = 8; MCS5 & Nss = 4, 5; MCS6 & Nss = 3, 5, 6; MCS7 & Nss = 4, 5, 8; MCS8 & Nss = 8; MCS9 & Nss = 1, 2, 3, 4, 5, 6, 7, 8 |
| 1212 | 4 | MCS5 & Nss = 8; MCS6 & Nss = 5, 7; MCS8 & Nss = 8 |
| 1215 | 18 | MCS0 & Nss = 1, 3, 5, 7; MCS2 & Nss = 1, 3, 5, 6, 7; MCS4 & Nss = 3; MCS6 & Nss = 1, 2, 3, 5, 6, 7; MCS7 & Nss = 5; MCS8 & Nss = 8 |
| 1216 | 16 | MCS3 & Nss = 8; MCS5 & Nss = 4, 5, 8; MCS6 & Nss = 7; MCS7 & Nss = 4, 8; MCS8 & Nss = 8; MCS9 & Nss = 1, 2, 3, 4, 5, 6, 7, 8 |
| 1218 | 8 | MCS2 & Nss = 5, 7; MCS5 & Nss = 8; MCS6 & Nss = 3, 5, 6, 7; MCS7 & Nss = 5 |
| 1220 | 15 | MCS3 & Nss = 8; MCS5 & Nss = 4, 5; MCS6 & Nss = 5; MCS7 & Nss = 4, 8; MCS8 & Nss = 8; MCS9 & Nss = 1, 2, 3, 4, 5, 6, 7, 8 |
| 1221 | 19 | MCS0 & Nss = 1, 3, 5, 7; MCS2 & Nss = 1, 3, 5, 6, 7; MCS4 & Nss = 3; MCS5 & Nss = 8; MCS6 & Nss = 1, 2, 3, 5, 6, 7; MCS7 & Nss = 5; MCS8 & Nss = 8 |
| 1224 | 3 | MCS5 & Nss = 8; MCS6 & Nss = 7; MCS8 & Nss = 8 |
| 1227 | 19 | MCS0 & Nss = 1, 3, 5, 7; MCS2 & Nss = 1, 3, 5, 6, 7; MCS4 & Nss = 3; MCS5 & Nss = 8; MCS6 & Nss = 1, 2, 3, 5, 6, 7; MCS7 & Nss = 5; MCS8 & Nss = 8 |
| 1228 | 17 | MCS3 & Nss = 8; MCS5 & Nss = 4, 5, 8; MCS6 & Nss = 5, 7; MCS7 & Nss = 4, 8; MCS8 & Nss = 8; MCS9 & Nss = 1, 2, 3, 4, 5, 6, 7, 8 |
| 1230 | 7 | MCS2 & Nss = 5, 7; MCS6 & Nss = 3, 5, 6; MCS7 & Nss = 5; MCS8 & Nss = 8 |
| 1232 | 15 | MCS3 & Nss = 8; MCS5 & Nss = 4, 5, 8; MCS6 & Nss = 7; MCS7 & Nss = 4, 8; MCS9 & Nss = 1, 2, 3, 4, 5, 6, 7, 8 |
| 1233 | 19 | MCS0 & Nss = 1, 3, 5, 7; MCS2 & Nss = 1, 3, 5, 6, 7; MCS4 & Nss = 3; MCS5 & Nss = 8; MCS6 & Nss = 1, 2, 3, 5, 6, 7; MCS7 & Nss = 5; MCS8 & Nss = 8 |
| 1236 | 5 | MCS5 & Nss = 7, 8; MCS6 & Nss = 5, 7; MCS8 & Nss = 8 |
| 1240 | 16 | MCS3 & Nss = 7, 8; MCS5 & Nss = 4, 5; MCS7 & Nss = 4, 7, 8; MCS8 & Nss = 8; MCS9 & Nss = 1, 2, 3, 4, 5, 6, 7, 8 |
| 1242 | 11 | MCS2 & Nss = 5, 7; MCS4 & Nss = 7; MCS5 & Nss = 7, 8; MCS6 & Nss = 3, 5, 6, 7; MCS7 & Nss = 5; MCS8 & Nss = 8 |
| 1244 | 20 | MCS3 & Nss = 7, 8; MCS5 & Nss = 4, 5, 7, 8; MCS6 & Nss = 5, 7; MCS7 & Nss = 4, 7, 8; MCS8 & Nss = 8; MCS9 & Nss = 1, 2, 3, 4, 5, 6, 7, 8 |
| 1420 | 14 | MCS3 & Nss = 7, 8; MCS5 & Nss = 4, 8; MCS6 & Nss = 5; MCS7 & Nss = 7, 8; MCS9 & Nss = 1, 2, 4, 5, 6, 7, 8 |
| 1422 | 10 | MCS2 & Nss = 5, 7; MCS4 & Nss = 7; MCS5 & Nss = 7; MCS6 & Nss = 5, 6, 7; MCS7 & Nss = 8; MCS9 & Nss = 6, 8 |
| 1424 | 15 | MCS3 & Nss = 7, 8; MCS5 & Nss = 4, 7, 8; MCS6 & Nss = 6; MCS7 & Nss = 7, 8; MCS9 & Nss = 1, 2, 4, 5, 6, 7, 8 |
| 1426 | 20 | MCS2 & Nss = 5, 7; MCS3 & Nss = 7, 8; MCS4 & Nss = 7; MCS5 & Nss = 4, 7, 8; MCS6 & Nss = 5, 6, 7; MCS7 & Nss = 7, 8; MCS9 & Nss = 1, 2, 4, 5, 6, 7, 8 |
| 1428 | 6 | MCS5 & Nss = 7; MCS6 & Nss = 5, 6; MCS9 & Nss = 2, 5, 8 |
| 1430 | 18 | MCS2 & Nss = 5, 7; MCS3 & Nss = 7, 8; MCS4 & Nss = 7; MCS5 & Nss = 4, 8; MCS6 & Nss = 5, 7; MCS7 & Nss = 7, 8; MCS9 & Nss = 1, 2, 4, 5, 6, 7, 8 |
| 1432 | 15 | MCS3 & Nss = 7, 8; MCS5 & Nss = 4, 7, 8; MCS6 & Nss = 6; MCS7 & Nss = 7, 8; MCS9 & Nss = 1, 2, 4, 5, 6, 7, 8 |
| 1434 | 12 | MCS2 & Nss = 5, 7; MCS4 & Nss = 7; MCS5 & Nss = 7; MCS6 & Nss = 5, 6, 7; MCS7 & Nss = 8; MCS9 & Nss = 2, 5, 6, 8 |
| 1436 | 16 | MCS3 & Nss = 7, 8; MCS5 & Nss = 4, 7, 8; MCS6 & Nss = 5, 6; MCS7 & Nss = 7, 8; MCS9 & Nss = 1, 2, 4, 5, 6, 7, 8 |
| 1438 | 20 | MCS2 & Nss = 5, 7; MCS3 & Nss = 7, 8; MCS4 & Nss = 7; MCS5 & Nss = 4, 7, 8; MCS6 & Nss = 5, 6, 7; MCS7 & Nss = 7, 8; MCS9 & Nss = 1, 2, 4, 5, 6, 7, 8 |
| 1440 | 3 | MCS7 & Nss = 8; MCS9 & Nss = 6, 8 |
| 1446 | 18 | MCS2 & Nss = 5, 7; MCS4 & Nss = 7, 8; MCS5 & Nss = 6, 7; MCS6 & Nss = 5, 6, 7, 8; MCS7 & Nss = 8; MCS8 & Nss = 4, 6, 7; MCS9 & Nss = 2, 5, 6, 8 |
| 1452 | 13 | MCS4 & Nss = 8; MCS5 & Nss = 6, 7; MCS6 & Nss = 5, 6, 8; MCS7 & Nss = 8; MCS8 & Nss = 4, 6; MCS9 & Nss = 2, 5, 6, 8 |
| 1456 | 17 | MCS3 & Nss = 7, 8; MCS4 & Nss = 8; MCS5 & Nss = 4, 6, 7, 8; MCS6 & Nss = 6; MCS7 & Nss = 7; MCS8 & Nss = 4, 8; MCS9 & Nss = 1, 2, 4, 5, 7, 8 |
| 1458 | 15 | MCS2 & Nss = 5, 7; MCS4 & Nss = 7, 8; MCS5 & Nss = 6, 7; MCS6 & Nss = 5, 6, 7, 8; MCS7 & Nss = 8; MCS8 & Nss = 4, 6, 7; MCS9 & Nss = 6 |
| 1460 | 17 | MCS3 & Nss = 7, 8; MCS5 & Nss = 4, 8; MCS6 & Nss = 5, 8; MCS7 & Nss = 7, 8; MCS8 & Nss = 6, 8; MCS9 & Nss = 1, 2, 4, 5, 6, 7, 8 |
| 1464 | 11 | MCS4 & Nss = 8; MCS5 & Nss = 6, 7; MCS6 & Nss = 6, 8; MCS7 & Nss = 8; MCS8 & Nss = 4, 6; MCS9 & Nss = 2, 5, 6 |
| 1470 | 8 | MCS2 & Nss = 5, 7; MCS4 & Nss = 7; MCS5 & Nss = 5, 7; MCS8 & Nss = 7; MCS9 & Nss = 2, 5 |
| 1476 | 10 | MCS4 & Nss = 8; MCS5 & Nss = 6, 7; MCS6 & Nss = 5, 6, 8; MCS7 & Nss = 8; MCS8 & Nss = 4, 6; MCS9 & Nss = 6 |
| 1480 | 16 | MCS3 & Nss = 7, 8; MCS5 & Nss = 4, 8; MCS6 & Nss = 8; MCS7 & Nss = 7, 8; MCS8 & Nss = 6, 8; MCS9 & Nss = 1, 2, 4, 5, 6, 7, 8 |
| 1482 | 18 | MCS2 & Nss = 5, 7; MCS4 & Nss = 7, 8; MCS5 & Nss = 6, 7; MCS6 & Nss = 5, 6, 7, 8; MCS7 & Nss = 8; MCS8 & Nss = 4, 6, 7; MCS9 & Nss = 2, 5, 6, 7 |

TABLE 4-continued

| $N_{data}$ | # exclusions | Exclusions |
|---|---|---|
| 1484 | 17 | MCS3 & Nss = 7, 8; MCS4 & Nss = 8; MCS5 & Nss = 4, 6, 7, 8; MCS6 & Nss = 5, 6; MCS8 & Nss = 4, 8; MCS9 & Nss = 1, 2, 4, 5, 7, 8 |
| 1488 | 12 | MCS4 & Nss = 8; MCS5 & Nss = 6, 7; MCS6 & Nss = 6, 8; MCS7 & Nss = 8; MCS8 & Nss = 4, 6; MCS9 & Nss = 2, 5, 6, 7 |
| 1494 | 16 | MCS2 & Nss = 5, 7; MCS4 & Nss = 7, 8; MCS5 & Nss = 6, 7; MCS6 & Nss = 5, 6, 7, 8; MCS7 & Nss = 8; MCS8 & Nss = 4, 6, 7; MCS9 & Nss = 6, 7 |
| 1496 | 20 | MCS3 & Nss = 7, 8; MCS4 & Nss = 8; MCS5 & Nss = 4, 6, 7, 8; MCS6 & Nss = 6, 8; MCS7 & Nss = 8; MCS8 & Nss = 4, 6, 8; MCS9 & Nss = 1, 2, 4, 5, 6, 7, 8 |
| 1660 | 12 | MCS3 & Nss = 7; MCS5 & Nss = 7, 8; MCS6 & Nss = 8; MCS8 & Nss = 6, 7; MCS9 & Nss = 1, 2, 4, 5, 7, 8 |
| 1662 | 14 | MCS2 & Nss = 5; MCS4 & Nss = 7, 8; MCS5 & Nss = 6, 8; MCS6 & Nss = 8; MCS8 & Nss = 4, 6, 8; MCS9 & Nss = 2, 4, 5, 7, 8 |
| 1664 | 17 | MCS3 & Nss = 7; MCS4 & Nss = 7, 8; MCS5 & Nss = 6, 7, 8; MCS6 & Nss = 8; MCS8 & Nss = 4, 6, 7, 8; MCS9 & Nss = 1, 2, 4, 5, 7, 8 |
| 1666 | 15 | MCS2 & Nss = 5; MCS3 & Nss = 7; MCS4 & Nss = 7, 8; MCS5 & Nss = 6, 7; MCS8 & Nss = 4, 7, 8; MCS9 & Nss = 1, 2, 4, 5, 7, 8 |
| 1668 | 12 | MCS4 & Nss = 7, 8; MCS5 & Nss = 6, 8; MCS6 & Nss = 8; MCS8 & Nss = 4, 6, 8; MCS9 & Nss = 2, 4, 5, 8 |
| 1670 | 13 | MCS2 & Nss = 5; MCS3 & Nss = 7; MCS5 & Nss = 7, 8; MCS6 & Nss = 8; MCS8 & Nss = 6, 7; MCS9 & Nss = 1, 2, 4, 5, 7, 8 |
| 1672 | 17 | MCS3 & Nss = 7; MCS4 & Nss = 7, 8; MCS5 & Nss = 6, 7, 8; MCS6 & Nss = 8; MCS8 & Nss = 4, 6, 7, 8; MCS9 & Nss = 1, 2, 4, 5, 7, 8 |
| 1674 | 11 | MCS2 & Nss = 5; MCS4 & Nss = 7, 8; MCS5 & Nss = 6, 8; MCS6 & Nss = 8; MCS8 & Nss = 4, 6, 8; MCS9 & Nss = 5, 8 |
| 1676 | 17 | MCS3 & Nss = 7; MCS4 & Nss = 7, 8; MCS5 & Nss = 6, 7, 8; MCS6 & Nss = 8; MCS8 & Nss = 4, 6, 7, 8; MCS9 & Nss = 1, 2, 4, 5, 7, 8 |
| 1678 | 18 | MCS2 & Nss = 5; MCS3 & Nss = 7; MCS4 & Nss = 7, 8; MCS5 & Nss = 6, 7, 8; MCS6 & Nss = 8; MCS8 & Nss = 4, 6, 7, 8; MCS9 & Nss = 1, 2, 4, 5, 7, 8 |
| 1680 | 3 | MCS9 & Nss = 2, 4, 8 |
| 1682 | 16 | MCS2 & Nss = 5; MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1684 | 15 | MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1686 | 11 | MCS2 & Nss = 5; MCS4 & Nss = 7, 8; MCS5 & Nss = 6, 8; MCS8 & Nss = 4, 8; MCS9 & Nss = 2, 4, 5, 8 |
| 1688 | 15 | MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1690 | 11 | MCS2 & Nss = 5; MCS3 & Nss = 7; MCS5 & Nss = 7, 8; MCS8 & Nss = 7; MCS9 & Nss = 1, 2, 4, 5, 7, 8 |
| 1692 | 8 | MCS4 & Nss = 7, 8; MCS5 & Nss = 6, 8; MCS8 & Nss = 4, 8; MCS9 & Nss = 5, 8 |
| 1694 | 15 | MCS2 & Nss = 5; MCS3 & Nss = 7; MCS4 & Nss = 7, 8; MCS5 & Nss = 6, 7; MCS8 & Nss = 4, 7, 8; MCS9 & Nss = 1, 2, 4, 5, 7, 8 |
| 1696 | 15 | MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1698 | 11 | MCS2 & Nss = 5; MCS4 & Nss = 7, 8; MCS5 & Nss = 6, 8; MCS8 & Nss = 4, 8; MCS9 & Nss = 2, 4, 5, 8 |
| 1700 | 10 | MCS3 & Nss = 7; MCS5 & Nss = 7, 8; MCS8 & Nss = 7; MCS9 & Nss = 1, 2, 4, 5, 7, 8 |
| 1702 | 16 | MCS2 & Nss = 5; MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1704 | 10 | MCS4 & Nss = 7, 8; MCS5 & Nss = 6, 8; MCS8 & Nss = 4, 8; MCS9 & Nss = 2, 4, 5, 8 |
| 1706 | 16 | MCS2 & Nss = 5; MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1708 | 14 | MCS3 & Nss = 7; MCS4 & Nss = 7, 8; MCS5 & Nss = 6, 7; MCS8 & Nss = 4, 7, 8; MCS9 & Nss = 1, 2, 4, 5, 7, 8 |
| 1710 | 4 | MCS2 & Nss = 5; MCS5 & Nss = 8; MCS9 & Nss = 5, 8 |
| 1712 | 15 | MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1714 | 16 | MCS2 & Nss = 5; MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1716 | 9 | MCS4 & Nss = 7, 8; MCS5 & Nss = 6, 8; MCS8 & Nss = 4, 8; MCS9 & Nss = 2, 4, 5 |
| 1718 | 16 | MCS2 & Nss = 5; MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1720 | 10 | MCS3 & Nss = 7; MCS5 & Nss = 7, 8; MCS8 & Nss = 7; MCS9 & Nss = 1, 2, 4, 5, 7, 8 |
| 1722 | 9 | MCS2 & Nss = 5; MCS4 & Nss = 7, 8; MCS5 & Nss = 6; MCS8 & Nss = 4, 8; MCS9 & Nss = 2, 4, 8 |
| 1724 | 15 | MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1726 | 16 | MCS2 & Nss = 5; MCS3 & Nss = 7; MCS4 & Nss = 7, 8; MCS5 & Nss = 6, 7, 8; MCS8 & Nss = 4, 7, 8; MCS9 & Nss = 1, 2, 4, 5, 7, 8 |
| 1728 | 8 | MCS4 & Nss = 7, 8; MCS5 & Nss = 6, 8; MCS8 & Nss = 4, 8; MCS9 & Nss = 5, 8 |
| 1734 | 18 | MCS2 & Nss = 5; MCS4 & Nss = 5, 7, 8; MCS5 & Nss = 6, 8; MCS7 & Nss = 3, 6, 7, 8; MCS8 & Nss = 4, 5, 8; MCS9 & Nss = 2, 4, 5, 6, 8 |
| 1736 | 19 | MCS3 & Nss = 5, 7; MCS4 & Nss = 7, 8; MCS5 & Nss = 6, 7; MCS7 & Nss = 2, 5, 8; MCS8 & Nss = 4, 7, 8; MCS9 & Nss = 1, 2, 4, 5, 6, 7, 8 |
| 1740 | 10 | MCS5 & Nss = 8; MCS7 & Nss = 6, 7, 8; MCS8 & Nss = 5; MCS9 & Nss = 2, 4, 5, 6, 8 |
| 1746 | 14 | MCS2 & Nss = 5; MCS4 & Nss = 5, 7, 8; MCS5 & Nss = 6, 8; MCS7 & Nss = 3, 6, 7; MCS8 & Nss = 4, 5, 8; MCS9 & Nss = 5, 8 |

TABLE 4-continued

| $N_{data}$ | # exclusions | Exclusions |
|---|---|---|
| 1872 | 7 | MCS4 & Nss = 7; MCS5 & Nss = 8; MCS7 & Nss = 6; MCS8 & Nss = 5, 7, 8; MCS9 & Nss = 7 |
| 1876 | 15 | MCS3 & Nss = 5; MCS4 & Nss = 7; MCS7 & Nss = 2, 5, 7, 8; MCS8 & Nss = 7, 8; MCS9 & Nss = 1, 2, 4, 5, 6, 7, 8 |
| 1880 | 15 | MCS3 & Nss = 5; MCS5 & Nss = 8; MCS7 & Nss = 2, 5, 6, 8; MCS8 & Nss = 5, 8; MCS9 & Nss = 1, 2, 4, 5, 6, 7, 8 |
| 1884 | 13 | MCS4 & Nss = 7; MCS5 & Nss = 8; MCS7 & Nss = 6, 7, 8; MCS8 & Nss = 5, 7, 8; MCS9 & Nss = 2, 4, 6, 7, 8 |
| 1888 | 17 | MCS3 & Nss = 5; MCS4 & Nss = 7; MCS5 & Nss = 8; MCS7 & Nss = 2, 5, 6, 8; MCS8 & Nss = 5, 7, 8; MCS9 & Nss = 1, 2, 4, 5, 6, 7, 8 |
| 1892 | 16 | MCS3 & Nss = 5; MCS4 & Nss = 7; MCS7 & Nss = 2, 5, 6, 7, 8; MCS8 & Nss = 5, 7; MCS9 & Nss = 1, 2, 4, 5, 6, 7, 8 |
| 1896 | 11 | MCS4 & Nss = 7; MCS7 & Nss = 6, 8; MCS8 & Nss = 5, 7, 8; MCS9 & Nss = 2, 4, 6, 7, 8 |
| 1900 | 15 | MCS3 & Nss = 5; MCS7 & Nss = 2, 5, 6, 7, 8; MCS8 & Nss = 5, 8; MCS9 & Nss = 1, 2, 4, 5, 6, 7, 8 |
| 1904 | 14 | MCS3 & Nss = 5; MCS4 & Nss = 7; MCS7 & Nss = 2, 5, 8; MCS8 & Nss = 7, 8; MCS9 & Nss = 1, 2, 4, 5, 6, 7, 8 |
| 1908 | 7 | MCS4 & Nss = 7; MCS7 & Nss = 6, 7; MCS8 & Nss = 5, 7, 8; MCS9 & Nss = 7 |
| 1912 | 16 | MCS3 & Nss = 5; MCS4 & Nss = 7; MCS7 & Nss = 2, 5, 6, 8; MCS8 & Nss = 5, 7, 8; MCS9 & Nss = 1, 2, 4, 5, 6, 7, 8 |
| 1916 | 17 | MCS3 & Nss = 5; MCS4 & Nss = 7; MCS7 & Nss = 2, 5, 6, 7, 8; MCS8 & Nss = 5, 7, 8; MCS9 & Nss = 1, 2, 4, 5, 6, 7, 8 |
| 1920 | 9 | MCS7 & Nss = 6, 8; MCS8 & Nss = 5, 8; MCS9 & Nss = 2, 4, 6, 7, 8 |
| 1924 | 23 | MCS3 & Nss = 5; MCS4 & Nss = 6, 7; MCS6 & Nss = 3, 4, 6, 7; MCS7 & Nss = 2, 5, 6, 7, 8; MCS8 & Nss = 3, 5, 7, 8; MCS9 & Nss = 1, 2, 4, 5, 6, 7, 8 |
| 1928 | 21 | MCS3 & Nss = 5; MCS4 & Nss = 6, 7; MCS6 & Nss = 4, 6, 7; MCS7 & Nss = 2, 5, 6, 8; MCS8 & Nss = 3, 5, 7, 8; MCS9 & Nss = 1, 2, 4, 5, 6, 7, 8 |
| 1932 | 15 | MCS4 & Nss = 6, 7; MCS6 & Nss = 3, 4, 7; MCS7 & Nss = 7, 8; MCS8 & Nss = 3, 7, 8; MCS9 & Nss = 2, 4, 6, 7, 8 |
| 1936 | 19 | MCS3 & Nss = 5; MCS4 & Nss = 6, 7; MCS6 & Nss = 4, 6; MCS7 & Nss = 2, 5, 6, 8; MCS8 & Nss = 3, 5, 7; MCS9 & Nss = 1, 2, 4, 5, 6, 7, 8 |
| 1940 | 18 | MCS3 & Nss = 5; MCS6 & Nss = 3, 6, 7; MCS7 & Nss = 2, 5, 6, 7, 8; MCS8 & Nss = 5, 8; MCS9 & Nss = 1, 2, 4, 5, 6, 7, 8 |
| 1944 | 11 | MCS4 & Nss = 6, 7; MCS6 & Nss = 4, 6, 7; MCS7 & Nss = 6; MCS8 & Nss = 3, 5, 7, 8; MCS9 & Nss = 7 |
| 1948 | 21 | MCS3 & Nss = 5; MCS4 & Nss = 6, 7; MCS6 & Nss = 3, 4, 6, 7; MCS7 & Nss = 2, 5, 6, 7; MCS8 & Nss = 3, 5, 7, 8; MCS9 & Nss = 1, 2, 4, 5, 7, 8 |
| 1952 | 18 | MCS3 & Nss = 5; MCS4 & Nss = 6, 7; MCS6 & Nss = 4, 6; MCS7 & Nss = 2, 5, 6; MCS8 & Nss = 3, 5, 7, 8; MCS9 & Nss = 1, 2, 4, 5, 7, 8 |
| 1956 | 15 | MCS4 & Nss = 6, 7; MCS6 & Nss = 3, 4, 6, 7; MCS7 & Nss = 6, 7; MCS8 & Nss = 3, 5, 7, 8; MCS9 & Nss = 4, 7, 8 |
| 1960 | 11 | MCS3 & Nss = 5; MCS6 & Nss = 7; MCS7 & Nss = 2, 5; MCS8 & Nss = 8; MCS9 & Nss = 1, 2, 4, 5, 7, 8 |
| 1964 | 21 | MCS3 & Nss = 5; MCS4 & Nss = 6, 7; MCS6 & Nss = 3, 4, 6, 7; MCS7 & Nss = 2, 5, 6, 7; MCS8 & Nss = 3, 5, 7, 8; MCS9 & Nss = 1, 2, 4, 5, 7, 8 |
| 1968 | 12 | MCS4 & Nss = 6, 7; MCS6 & Nss = 4, 6; MCS7 & Nss = 6; MCS8 & Nss = 3, 5, 7, 8; MCS9 & Nss = 4, 7, 8 |
| 1972 | 21 | MCS3 & Nss = 5; MCS4 & Nss = 6, 7; MCS6 & Nss = 3, 4, 6, 7; MCS7 & Nss = 2, 5, 6, 7; MCS8 & Nss = 3, 5, 7, 8; MCS9 & Nss = 1, 2, 4, 5, 7, 8 |
| 1976 | 20 | MCS3 & Nss = 5; MCS4 & Nss = 6, 7; MCS6 & Nss = 4, 6, 7; MCS7 & Nss = 2, 5, 6, 7; MCS8 & Nss = 3, 5, 7, 8; MCS9 & Nss = 1, 2, 4, 5, 7, 8 |
| 1980 | 7 | MCS6 & Nss = 3, 6, 7; MCS7 & Nss = 6; MCS8 & Nss = 5; MCS9 & Nss = 4, 8 |
| 1984 | 18 | MCS3 & Nss = 5; MCS4 & Nss = 6, 7; MCS6 & Nss = 4, 6; MCS7 & Nss = 2, 5, 6, 7; MCS8 & Nss = 3, 5, 7; MCS9 & Nss = 1, 2, 4, 5, 7, 8 |
| 1988 | 17 | MCS3 & Nss = 5; MCS4 & Nss = 6, 7; MCS6 & Nss = 3, 4, 7; MCS7 & Nss = 2, 5, 7; MCS8 & Nss = 3, 7; MCS9 & Nss = 1, 2, 4, 5, 7, 8 |
| 1992 | 13 | MCS4 & Nss = 6, 7; MCS6 & Nss = 4, 6, 7; MCS7 & Nss = 6, 7; MCS8 & Nss = 3, 5, 7; MCS9 & Nss = 4, 7, 8 |
| 1996 | 20 | MCS3 & Nss = 5; MCS4 & Nss = 6, 7; MCS6 & Nss = 3, 4, 6, 7; MCS7 & Nss = 2, 5, 6, 7; MCS8 & Nss = 3, 5, 7; MCS9 & Nss = 1, 2, 4, 5, 7, 8 |

The chart illustrates invalid MCS scenarios for MCS0-MCS9 for spatial streams up to eight spatial streams. MCS validity is defined in the IEEE 802.11ac specification. Generally, the rule for determining whether an MCS is valid is that the number of coded bits per subcarrier must be an integer multiple of the number of encoding streams. Further, the number of coded bits per encoding stream must be an integer multiple of the denominator in the code rate. Accordingly, certain MCS and spatial stream combinations may be invalid when these conditions are not met. Thus, for each potential Ndata value discussed above, a number of exclusions are provided, along with the listing of the various exclusions. In some aspects, it may be beneficial to select a value of Ndata that has a minimum number of exclusions. It may be observed that MCS exclusions for various 2048FFT configurations (which are two 80 MHz 1024FFT tone plans) vary from those of the 1024FFT tone plans. Accordingly, the MCS exclusions for 2048FFT tone plans are listed above.

Figure 55:
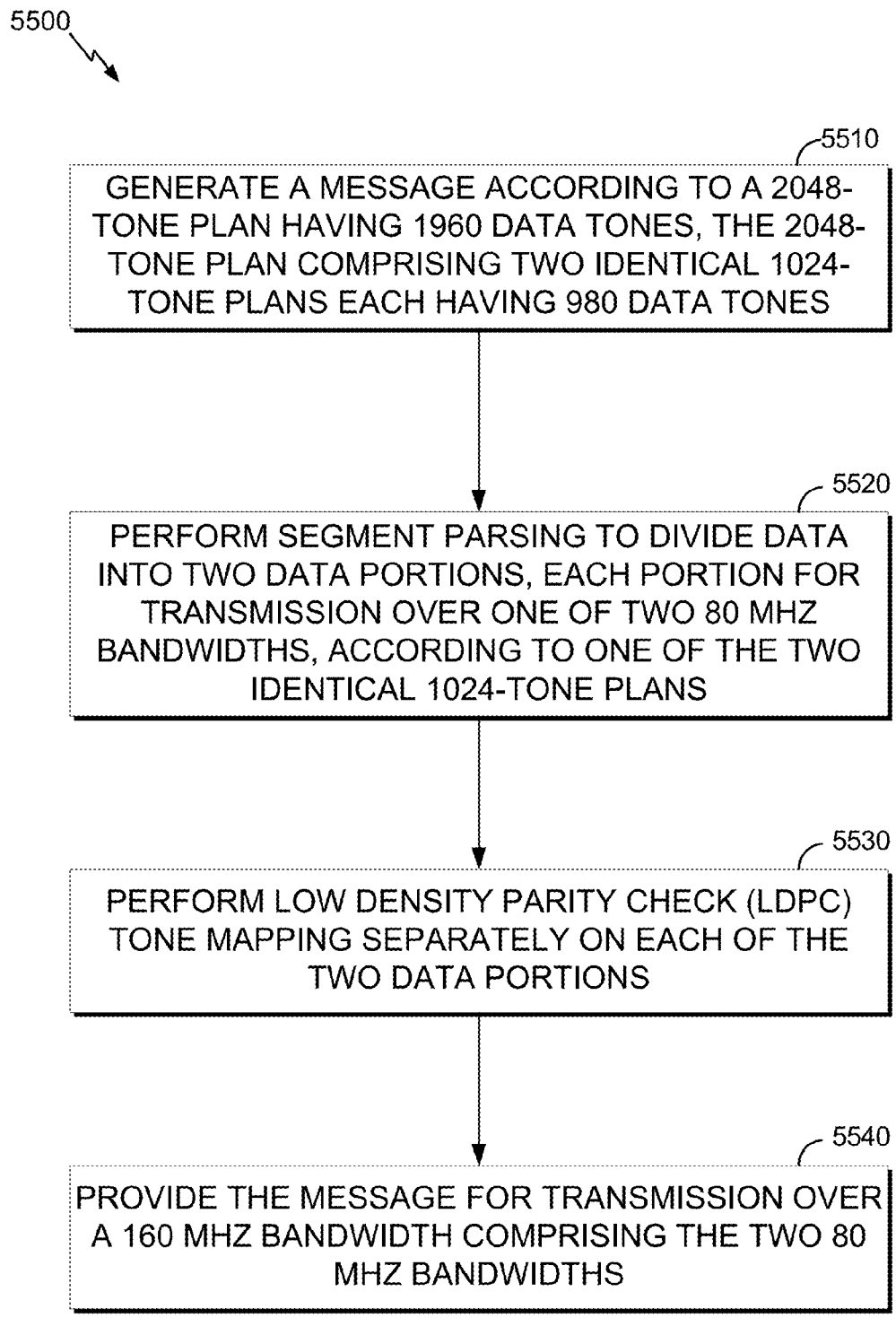
FIG. 55 shows a flowchart for an exemplary method of wireless communication that can be employed within the wireless communication system 100 of FIG. 1.

As discussed with respect to FIGS. 12A, 25A-25B, and 50-51, in some embodiments a 2048-tone plan for 160 MHz may be constructed using two duplicated 1024-tone plans, which each use 80 MHz of bandwidth. This approach may be counterintuitive in that it can reduce the number of data tones as compared to other 2048-tone plans in which interleaving is performed across all tones. On the other hand, it has been discovered that using separate interleavers for each 1024-tone plan can decrease hardware complexity. Nevertheless, various parameters for a combined 2048-tone plan according to this approach can vary from those of the constituent 1024-tone plans such as, for example, the MCS exclusions for such the 2048-tone plan. As shown in FIG. 55, one example method of wireless transmission according to a 2048-tone plan, constructed using two duplicated 1024-tone plans that each use 80 MHz of bandwidth, can provide various unexpected advantages over alternative embodiments.

FIG. 55 shows a flowchart 5500 for an exemplary method of wireless communication that can be employed within the wireless communication system 100 of FIG. 1. The method can be implemented in whole or in part by the devices described herein, such as the AP 104 (FIG. 1), any of the STAs 106A-106D (FIG. 1), the wireless device 202 shown in FIG. 2, and/or the devices 1010, 1020, 1030, or 1040 (FIG. 16). Although the illustrated method is described herein with reference to the wireless communication system 100 discussed above with respect to FIG. 1, the wireless device 202 discussed above with respect to FIG. 2, the system 1000 of FIG. 16, and the tone plan details of FIGS. 3-15, 18-28, and 34-54, a person having ordinary skill in the art will appreciate that the illustrated method can be implemented by another device described herein, or any other suitable device. Although the illustrated method is described herein with reference to a particular order, in various embodiments, blocks herein can be performed in a different order, or omitted, and additional blocks can be added.

First, at block 5510, a wireless device generates a message according to a 2048-tone plan having 1960 data tones. The 2048-tone plan includes two identical 1024-tone plans each having 980 data tones. For example, the AP 104 can generate a message according to two duplicates of the 1024-tone plan, discussed above with respect to FIGS. 12A, 25A-25B, and 50-51.

In various embodiments, generating the message according to the 2048-tone plan can include one or more of: encoding a plurality of data bits, parsing the stream of encoded bits, interleaving the encoded bits, mapping the data bits to a specified number of OFDM data tones, mapping a pilot sequence of bits to a specified number of pilot OFDM tones, and mapping null data bits to a specified number of left guard tones, right guard tones, and DC tones. For example, the encoder 1104 (FIG. 17) can encode the data bits. The stream parser 1106 (FIG. 17) can parse the encoded data bits. The interleavers 1108a-1108c (FIG. 17) interleave the parsed data. For each 1024-tone plan, the modulators 1102a-1108c (FIG. 17) can map the data bits to 980 OFDM data tones, map a pilot sequence of bits to pilot OFDM tones, and map null data bits to leftover tones for use as guard and DC tones.

In various embodiments, each of the two identical 1024-tone plans can include 5 direct current tones corresponding to each of two 80 MHz segments. This embodiment can correspond to an 80+80 MHz configuration. In various embodiments. the 2048-tone plan comprises 23 direct current tones corresponding to the 160 MHz bandwidth and 5 additional null tones corresponding to each of two 80 MHz segments. This embodiment can correspond to a 160 MHz configuration, where interior edge tones of each 80 MHz portion are used as DC tones, and central tones of each 80 MHz portion are used as additional null tones.

In various embodiments, the following combinations of modulation and coding schemes (MCS) and numbers of spatial streams (Nss) are excluded from use in transmission of the message: MCS3 & Nss=5; MCS6 & Nss=7; MCS7 & Nss=2 or 5; MCS8 & Nss=8; and MCS9 & Nss=1, 2, 4, 5, 7, or 8.

Next, at block 5520, the wireless device performs segment parsing to divide data into two data portions, each portion for transmission over one of two 80 MHz bandwidths, according to one of the two identical 1024-tone plans. For example, a segment parser of the interleaving system 1014 (FIG. 16) can perform segment parsing on data for transmission.

Then, at block 5530, the wireless device performs low density parity check (LDPC) tone mapping separately on each of the two data portions. In various embodiments, performing LDPC tone mapping separately on each of the two data portions can include using LDPC tone mapping distance of 20.

In some embodiments, the process of tone mapping can include associating constellation points of encoded data bits with OFDM subcarriers. The OFDM subcarriers to which each tone is mapped can be separated by the indicated number of subcarriers. For example, such mapping can include encoding a plurality of data bits, and mapping those encoded bits to quadrature amplitude modulation (QAM) symbols. Mapping can further include mapping the 1st QAM symbol to the 1st data tone, the 2nd QAM symbol to the (1+DTM)-th data tone, the 3rd QAM symbol to the (1+2*DTM)-th data tone, and so on. Mappings can wrap around such that, for example, the 49th QAM symbol is mapped to the 960-th data tone, and the 50th QAM symbol is mapped to the 2nd data tone, the 51-st QAM symbol is mapped to the (2+D_TM)-th data tone, and so on.

Subsequently, at block 5540, the wireless device provides the message for transmission over a 160 MHz bandwidth including the two 80 MHz bandwidths. In various embodiments, providing the message for transmission can include one or more of: encoding a plurality of data bits, parsing the stream of encoded bits, interleaving the encoded bits, mapping the data bits to a specified number of OFDM data tones, mapping a pilot sequence of bits to a specified number of pilot OFDM tones, and mapping null data bits to a specified number of left guard tones, right guard tones, and DC tones. For example, the processor 204 (FIG. 2) can organize a plurality of data bits according to each of the two 1024-tone plans. The encoder 1104 (FIG. 17) can encode the data bits. The stream parser 1106 (FIG. 17) can parse the encoded data bits. The interleavers 1108a-1108c (FIG. 17) interleave the parsed data. The modulators 1102a-1108c (FIG. 17) can modulate the interleaved data for transmission via the transmitters 1110a-1110c (FIG. 17).

In various embodiments, the method can further include separately interleaving each of the two data portions. The method can further include generating a series of interleaved bits for transmission based on the interleaved data portions using, for each 1024-tone plan in the 2048-tone plan, interleaved rotation indexes of at least one of 108 through 135 and a base subcarrier rotation of [0 4 2 6 1 5 3 7], or [0 5 2 7 3 6 1 4] or another permutation chosen to maximize an average subcarrier distance of adjacent streams for more than four spatial streams. In various embodiments, said interleaving can include using an interleaver depth of at least one of: 2, 4, 5, 7, 10, 14, 20, 28, 35, 49, 70, 98, 140, 196, 245, or 490. In some embodiments, only LDPC tone mapping is used, and BCC interleaving can be omitted.

In various embodiments, the method can be performed on a mobile station such as, for example, a STA 106A-106D of FIG. 1. Providing the message for transmission can include transmitting the message through a transmitter (for example, the transmitter 210 of FIG. 2) and an antenna (for example, the antenna 216 of FIG. 2) of the mobile station to an access point (for example, the AP 104 of FIG. 1) serving the mobile station. In various embodiments, the method can be performed on an access point such as, for example, the AP 104 of FIG. 1. Providing the message for transmission can include transmitting the message through a transmitter (for example, the transmitter 210 of FIG. 2) and an antenna (for example, the antenna 216 of FIG. 2) of the access point to a mobile station (for example, the STA 106A of FIG. 1) served by the access point.

In various embodiments, the method of FIG. 55 can include one or more blocks shown in the method of FIG. 20. For example, the method can include selecting from one of the 64-, 128-, 256-, 512-, and 1024-tone plans as discussed above with respect to block 2010 of FIG. 20. The 256-, 512-, and 1024-tone plans can have any of the characteristics discussed above with respect to FIGS. 3-9 and 12-19.

In an embodiment, the method shown in FIG. 55 can be implemented in a wireless device that can include a generating circuit, segment parsing circuit, a tone mapping circuit, and a providing circuit. Those skilled in the art will appreciate that a wireless device can have more components than the simplified wireless device described herein. The wireless device described herein includes only those components useful for describing some prominent features of implementations within the scope of the claims.

The generating circuit can be configured to generate the message according to the 2048-tone plan. In an embodiment, the generating circuit can be configured to implement block 5510 of the flowchart 5500 (FIG. 55). The generating circuit can include one or more of the DSP 220 (FIG. 2), the processor 204 (FIG. 2), and the memory 206 (FIG. 2). In some implementations, means for generating can include the generating circuit.

The segment parsing circuit can be configured to perform segment parsing. In an embodiment, the segment parsing circuit can be configured to implement block 5520 of the flowchart 5500 (FIG. 55). The segment parsing circuit can include one or more of the interleaving system 1014 (FIG. 16), the stream parser 1106 (FIG. 17), the encoder 1104 (FIG. 17), the DSP 220 (FIG. 2), the processor 204 (FIG. 2), and the memory 206 (FIG. 2). In some implementations, means for performing segment parsing can include the segment parsing circuit.

The tone mapping circuit can be configured to perform tone mapping. In an embodiment, the tone mapping circuit can be configured to implement block 5530 of the flowchart 5500 (FIG. 55). The tone mapping circuit can include one or more of the interleaving system 1014 (FIG. 16), the stream parser 1106 (FIG. 17), the encoder 1104 (FIG. 17), the modulators 1102a-1102c, the DSP 220 (FIG. 2), the processor 204 (FIG. 2), and the memory 206 (FIG. 2). In some implementations, means for performing tone mapping can include the tone mapping circuit.

The providing circuit can be configured to provide the message for transmission. In an embodiment, the providing circuit can be configured to implement block 5540 of the flowchart 5500 (FIG. 55). The providing circuit can include one or more of the transmitter 210 (FIG. 2), the transceiver 214 (FIG. 2), the processor 204 (FIG. 2), the DSP 220 (FIG. 2), the antenna 216 (FIG. 2), and the memory 206 (FIG. 2). In some implementations, means for providing can include the providing circuit.

In various embodiments, the wireless device can further include a mapping circuit. The mapping circuit can be configured to map tones of the message using a low density parity check (LDPC) tone mapping distance (DTM). In various embodiments, the DTM can be one of 3 or 6. The mapping circuit can include one or more of the DSP 220 (FIG. 2), the processor 204 (FIG. 2), the memory 206 (FIG. 2), the interleaving system 1014 (FIG. 16), the interleavers 1108a-1108c (FIG. 17), and the modulators 1102a-1102c (FIG. 17). In some implementations, means for mapping can include the generating circuit.

In various embodiments, the wireless device can further include a transmitting circuit. The transmitting circuit can be configured to transmit the message, for example through a transmitter and an antenna of a mobile station or access point. The transmitting circuit can include one or more of the transmitter 210 (FIG. 2), the transceiver 214 (FIG. 2), the processor 204 (FIG. 2), the DSP 220 (FIG. 2), the antenna 216 (FIG. 2), and the memory 206 (FIG. 2). In some implementations, means for transmitting can include the transmitting circuit.

Implementing Technology

A person/one having ordinary skill in the art would understand that information and signals can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof.

Various modifications to the implementations described in this disclosure can be readily apparent to those skilled in the art, and the generic principles defined herein can be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein to mean "serving as an example, instance, or illustration." Any implementation described herein as "exemplary" is not necessarily to be construed as preferred or advantageous over other implementations.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above can be performed by any suitable means capable of performing the operations, such as various hardware and/or software component(s), circuits, and/or module(s). Generally, any operations illustrated in the Figures can be performed by corresponding functional means capable of performing the operations.

The various illustrative logical blocks, modules and circuits described in connection with the present disclosure can be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor can be a microprocessor, but in the alternative, the processor can be any commercially available processor, controller, microcontroller or state machine. A processor can also be implemented as a combination of computing devices, e.g., a combination of a DSP and a microprocessor, a plurality of microprocessors, one or more microprocessors in conjunction with a DSP core, or any other such configuration.

In one or more aspects, the functions described can be implemented in hardware, software, firmware, or any combination thereof. If implemented in software, the functions can be stored on or transmitted over as one or more instructions or code on a computer-readable medium. Computer-readable media includes both computer storage media and communication media including any medium that facilitates transfer of a computer program from one place to another. A storage media can be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Thus, in some aspects computer readable medium can comprise non-transitory computer readable medium (e.g., tangible media). In addition, in some aspects computer readable medium can comprise transitory computer readable medium (e.g., a signal). Combinations of the above should also be included within the scope of computer-readable media.

The methods disclosed herein comprise one or more steps or actions for achieving the described method. The method steps and/or actions can be interchanged with one another without departing from the scope of the claims. In other words, unless a specific order of steps or actions is specified, the order and/or use of specific steps and/or actions can be modified without departing from the scope of the claims.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device.

Moreover, any other suitable technique for providing the methods and techniques described herein to a device can be utilized.

While the foregoing is directed to aspects of the present disclosure, other and further aspects of the disclosure can be devised without departing from the basic scope thereof, and the scope thereof is determined by the claims that follow.

What is claimed is:

1. An apparatus configured to perform wireless communication, comprising:
    a memory that stores instructions; and
    a processing system coupled with the memory and configured to execute the instructions to:
        generate a message according to a 2048-tone plan having 1960 data tones, the 2048-tone plan comprising two identical 1024-tone plans each having 980 data tones;
        perform segment parsing to divide data into two data portions, each portion for transmission over one of two 80 MHz bandwidths, according to one of the two identical 1024-tone plans;
        perform low density parity check (LDPC) tone mapping separately on each of the two data portions, wherein performing LDPC tone mapping separately on each of the two data portions comprises using LDPC tone mapping distance of 20; and
        provide the message for transmission over a 160 MHz bandwidth comprising the two 80 MHz bandwidths.

2. The apparatus of claim 1, wherein each of the two identical 1024-tone plans comprises 5 direct current tones corresponding to each of the two 80 MHz bandwidths.

3. The apparatus of claim 1, wherein the 2048-tone plan comprises 23 direct current tones corresponding to the 160 MHz bandwidth and 5 additional null tones corresponding to each of two 80 MHz segments.

4. The apparatus of claim 1, further comprising a transmitter configured to transmit the message via four or more spatial streams.

5. The apparatus of claim 1, wherein the apparatus is a mobile station, and wherein the processing system is configured to provide the message for transmission by being configured to transmit the message through a transmitter and an antenna of the mobile station to an access point serving the mobile station.

6. The apparatus of claim 1, wherein the apparatus is an access point, and wherein the processing system is configured to provide the message for transmission by being configured to transmit the message through a transmitter and an antenna of the access point to a mobile station served by the access point.

7. A method of wireless communication, comprising:
    generating a message according to a 2048-tone plan having 1960 data tones, the 2048-tone plan comprising two identical 1024-tone plans each having 980 data tones;
    performing segment parsing to divide data into two data portions, each portion for transmission over one of two 80 MHz bandwidths, according to one of the two identical 1024-tone plans;
    performing low density parity check (LDPC) tone mapping separately on each of the two data portions, wherein performing LDPC tone mapping separately on each of the two data portions comprises using LDPC tone mapping distance of 20; and
    providing the message for transmission over a 160 MHz bandwidth comprising the two 80 MHz bandwidths.

8. The method of claim 7, wherein each of the two identical 1024-tone plans comprises 5 direct current tones corresponding to each of two 80 MHz segments.

9. The method of claim 7, wherein the 2048-tone plan comprises 23 direct current tones corresponding to the 160 MHz bandwidth and 5 additional null tones corresponding to each of two 80 MHz segments.

10. The method of claim 7, further comprising transmitting the message via four or more spatial streams.

11. The method of claim 7, wherein the method is performed by a mobile station, the method further comprising transmitting the message through a transmitter and an antenna of the mobile station to an access point serving the mobile station.

12. The method of claim 7, wherein the method is performed by an access point, the method further comprising transmitting the message through a transmitter and an antenna of the access point to a mobile station served by the access point.

13. An apparatus for wireless communication, comprising:
   means for generating a message according to a 2048-tone plan having 1960 data tones, the 2048-tone plan comprising two identical 1024-tone plans each having 980 data tones;
   means for performing segment parsing to divide data into two data portions, each portion for transmission over one of two 80 MHz bandwidths, according to one of the two identical 1024-tone plans;
   means for performing low density parity check (LDPC) tone mapping separately on each of the two data portions, wherein means for performing LDPC tone mapping separately on each of the two data portions comprises means for using LDPC tone mapping distance of 20; and
   means for providing the message for transmission over a 160 MHz bandwidth comprising the two 80 MHz bandwidths.

14. The apparatus of claim 13, wherein each of the two identical 1024-tone plans comprises 5 direct current tones corresponding to each of two 80 MHz segments.

15. The apparatus of claim 13, wherein the 2048-tone plan comprises 23 direct current tones corresponding to the 160 MHz bandwidth and 5 additional null tones corresponding to each of two 80 MHz segments.

16. The apparatus of claim 13, further comprising means for transmitting the message via four or more spatial streams.

17. The apparatus of claim 13, wherein the apparatus comprises a mobile station, the apparatus further comprising means for transmitting the message through a transmitter and an antenna of the mobile station to an access point serving the mobile station.

18. The apparatus of claim 13, wherein the apparatus comprises an access point, the apparatus further comprising means for transmitting the message through a transmitter and an antenna of the access point to a mobile station served by the access point.

19. A non-transitory computer-readable medium comprising code that, when executed, causes an apparatus to:
   generate a message according to a 2048-tone plan having 1960 data tones, the 2048-tone plan comprising two identical 1024-tone plans each having 980 data tones;
   perform segment parsing to divide data into two data portions, each portion for transmission over one of two 80 MHz bandwidths, according to one of the two identical 1024-tone plans;
   perform low density parity check (LDPC) tone mapping separately on each of the two data portions, wherein performing LDPC tone mapping separately on each of the two data portions comprises using LDPC tone mapping distance of 20; and
   provide the message for transmission over a 160 MHz bandwidth comprising the two 80 MHz bandwidths.

20. The medium of claim 19, wherein the 2048-tone plan comprises 23 direct current tones corresponding to the 160 MHz bandwidth and 5 additional null tones corresponding to each of two 80 MHz segments.

21. The medium of claim 19, wherein each of the two identical 1024-tone plans comprises 5 direct current tones corresponding to each of two 80 MHz segments.

22. The medium of claim 19, further comprising code that, when executed, causes the apparatus to transmit the message via four or more spatial streams.

23. The medium of claim 19, wherein the apparatus comprises a mobile station, the medium further comprising code that, when executed, causes the apparatus to transmit the message through a transmitter and an antenna of the mobile station to an access point serving the mobile station.

24. The medium of claim 19, wherein the apparatus comprises an access point, the medium further comprising code that, when executed, causes the apparatus to transmit the message through a transmitter and an antenna of the access point to a mobile station served by the access point.

* * * * *